(12) United States Patent  
Kono

(10) Patent No.: US 6,741,521 B2
(45) Date of Patent: May 25, 2004

(54) SEMICONDUCTOR MEMORY DEVICE WITH INCREASED DATA READING SPEED

(75) Inventor: Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/253,928

(22) Filed: Sep. 25, 2002

(65) Prior Publication Data

US 2003/0179614 A1 Sep. 25, 2003

(30) Foreign Application Priority Data

Mar. 20, 2002 (JP) ........................................ 2002-078148

(51) Int. Cl.[7] .................................................. G11C 8/00
(52) U.S. Cl. .................... 365/233; 365/189.05; 365/239
(58) Field of Search ........................... 365/233, 189.05, 365/239, 198

(56) References Cited

U.S. PATENT DOCUMENTS 5,867,446 A * 2/1999 Konishi et al. ............. 365/233
6,510,087 B2 * 1/2003 Kudou et al. ........... 365/189.05
6,587,374 B2 * 7/2003 Takagi et al. ........... 365/185.11

FOREIGN PATENT DOCUMENTS

JP    11-265581    9/1999

* cited by examiner

*Primary Examiner*—Huan Hoang
(74) *Attorney, Agent, or Firm*—McDermott, Will & Emery

(57) ABSTRACT

Data of 2-bits prefetched from a memory array and transmitted to an amplifying circuit via a data bus is ordered in accordance with the least significant bit of a column address which is a start address supplied from the outside. The first data is output to read data buses and is directly transmitted to an output data latch. The second data is held once by a second data latch and, after that, transmitted to the output data latch. Since the first data is transmitted from the amplifying circuit directly to the output data latch, the time from a read command is received until data is started to be output can be shortened.

12 Claims, 40 Drawing Sheets

FIG.31

| START ADDRESS | | ORDER OF DATA TO BE OUTPUT |
|---|---|---|
| CA1 | CA0 | |
| 0 | 0 | D00 → D01 → D10 → D11 |
| 0 | 1 | D01 → D10 → D11 → D00 |
| 1 | 0 | D10 → D11 → D00 → D01 |
| 1 | 1 | D11 → D00 → D01 → D10 |

SEMICONDUCTOR MEMORY DEVICE WITH INCREASED DATA READING SPEED

BACKGROUND OF THE INVENTION

1. Field of the Invention

The present invention relates to a semiconductor memory device and, particularly, to a semiconductor memory device capable of operating synchronously with the rising and falling edges of an external clock and reading data at high speed.

2. Description of the Background Art

Among synchronous dynamic random access memories (SDRAMs) operating synchronously with a clock signal supplied from the outside, one which inputs/outputs data synchronously with the rising and falling edges of an external clock signal is called a double data rate synchronous dynamic random access memory (DDR SDRAM). The DDR SDRAM has already been standardized. The DDR SDRAM of the first generation among the standardized DDR SDRAMs is called a DDR-I.

FIG. 36 is an operation waveform chart showing data output timings in the case of reading data from a DDR SDRAM called DDR-I.

The operation waveform chart of FIG. 36 shows a case where CAS latency CL is 2.5 and a burst length BL is 4. The CAS latency denotes the number of cycles (each cycle starts at the rising edge of an external clock signal EXTCLK and ends at the next rising edge) in a period from a DDR SDRAM receives a command READ (command for reading data) from the outside at time t3 until read data is started to be output at time t8. The burst length denotes the number of bits of data successively read in the period from time t8 to t12 in response to command READ.

The DDR SDRAM outputs data DQ as read data and a data strobe signal DQS synchronously with external clock signals EXTCLK and EXTZCLK. External clock signal EXTZCLK is a clock signal complementary to external clock signal EXTCLK. Data strobe signal DQS is a signal used as a timing of latching data DQ on an external controller side for receiving data DQ.

FIG. 37 is a schematic block diagram for explaining a clock transmission path from a DLL circuit 1500 in a conventional DDR SDRAM to a data output circuit 1550.

Referring to FIG. 37, DLL circuit 1500 outputs a clock signal CLK_PF at a timing earlier than the rising edge of external clock signal EXTCLK by predetermined time, and a clock signal CLK_NF at a timing earlier than the rising edge of external clock signal EXTZCLK by predetermined time. The predetermined time is expressed as a backward amount Ta in FIGS. 40 and 42 which will be described later. A repeater 1520 amplifies the signal level of each of clock signals CLK_PF and CLK_NF and outputs clock signals CLK_P and CLK_N.

A plurality of data output circuits 1550 are provided based on a word configuration to which the DDR SDRAM is adapted. FIG. 37 shows a case where 16 data output circuits 1550 for outputting data signals DQ0 to DQ15, respectively, are provided in a semiconductor memory device.

Each of data output circuits 1550 latches data read from a memory cell array to a data bus DB in accordance with an internal signal NZPCNT determined on the basis of the CAS latency and clock signals CLK_P and CLK_N, amplifies the data, and outputs amplified data.

As shown in FIG. 37, generally, a signal path from DLL circuit 1500 to data output circuit 1550 has a tree shape. The circuits and interconnections disposed so that data output timings of plural data output circuits 1550 are not largely different from each other. Generally, one repeater 1520 is disposed per eight data output circuits or four data output circuits.

FIG. 38 is a block diagram showing the configuration of data output circuit 1550 in FIG. 37.

Referring to FIG. 38, data output circuit 1550 includes: an amplifying circuit 1554 for amplifying a data signal transmitted via data bus DB; a parallel/serial converting circuit 1556 for rearranging plural data supplied in a group from amplifying circuit 1554; an output data latch 1558 for latching an output of parallel/serial converting circuit 1556; an output driver 1530 for outputting data signal DQ to a terminal in accordance with an output of output data latch 1558; and a clock generating circuit 1552 for supplying clocks to amplifying circuit 1554, parallel/serial converting circuit 1556, and output data latch 1558.

Clock generating circuit 1552 outputs signals CLKQ, CQP, CQN, CLKO, and ZCLKO in accordance with clock signals CLK_P and CLK_N supplied from DLL circuit 1500 via repeater 1520 in FIG. 37 and internal signal NZPCNT determined on the basis of the CAS latency.

Amplifying circuit 1554 includes an amplifier RA0 for amplifying data signals transmitted via data buses DB0 and ZDB0 and outputting amplified signals to read data buses RD0 and ZRD0 and an amplifier RA1 for amplifying data signals transmitted via data buses DB1 and ZDB1 and outputting amplified signals to read data buses RD1 and ZRD1.

Data bus DB0 in FIG. 38 is one of data buses DB0<0> to DB0<15> in FIG. 37, and data bus DB1 in FIG. 38 is one of data buses DB1<0> to DB1<15> in FIG. 37. "Z" attached to the head of a signal name or data bus name denotes a complementary or inversion signal, and data bus ZDB0 indicates a data bus complementary to data bus DB0. Similarly, data bus ZDB1 denotes a data bus complementary to data bus DB1. By using a pair of complementary data buses, data transmission can be performed by a signal of a small amplitude.

2-bits data read from the memory cell array to the pair of data buses DB0 and ZDB0 and the pair of data buses DB1 and ZDB1 is transmitted as complementary data signals of a small amplitude.

In the case of the DDR-I, data is read from the memory cell array in the external clock cycles on condition that a 2-bits prefetch operation of reading 2-bits data to each data output circuit in a single reading operation is performed. Specifically, data of two bits is read in a group from the memory cell array and output to data output circuit 1550 every cycle of the external clock. In data output circuit 1550, the 2-bits data is ordered and output to the outside every half cycle of the external clock.

Amplifier RA0 operates in the cycles of the external clock synchronously with clock signal CLKQ supplied from clock generating circuit 1552, amplifies the data signals read from the memory cell array to data buses DB0 and ZDB0, and outputs the resultant signals to parallel/serial converting circuit 1556.

In a manner similar to amplifier RA0, amplifier RA1 operates in the cycles of the external clock synchronously with clock signal CLKQ. Amplifier RA1 amplifies the data signals read from the memory cell array to data buses DB1 and ZDB1 at the same timing as that of reading data signals to data buses DB0 and ZDB0, and outputs the amplified data signals to parallel/serial converting circuit 1556.

Parallel/serial converting circuit 1556 orders data of two bits received from amplifiers RA0 and RA1 and outputs the resultant to output data latch 1558.

Output data latch 1558 operates in half cycles of the external clock synchronously with clock signals CLKO and ZCLKO supplied from clock generating circuit 1552, latches the data signals received via read data buses RDD and ZRDD from parallel/serial converting circuit 1556, and outputs signals ZRDH and ZRDL.

Output driver 1530 outputs data signal DQ to drive a terminal in accordance with signals ZRDH and ZRDL which change every half cycle of the external clock.

When data is ordered by parallel/serial converting circuit 1556, the least significant bit (LSB) CA0 of a column address supplied together with command READ to the semiconductor memory device is referred to. In FIG. 38, a signal EZORG obtained by properly shifting address bit CA0 in accordance with the CAS latency is used by parallel/serial converting circuit 1556.

Since 2-bits prefetch operation is performed, one more address is generated internally from the column address supplied from the outside. In the case where address bit CA0 is 0, an "even-number" address corresponding to the column address supplied and an "odd-number" address obtained by incrementing the column address by one are generated on the inside.

On the other hand, in the case where address bit CA0 is 1, an "odd-number" address corresponding to the column address supplied and an "even-number" address obtained by incrementing the column address by one are generated on the inside.

Data corresponding to the "even-number" address is output to the pair of data buses DB0 and ZDB0 and data corresponding to the "odd-number" address is output to the pair of data buses DB1 and ZDB1.

In the case where address bit CA0 is 0, signal EZORG is set to H level. After data is read from the memory array, parallel/serial converting circuit 1556 first outputs data transmitted via read data buses RD0 and ZRD0 to read data buses RDD and ZRDD and, subsequently, outputs data transmitted via read data buses RD1 and ZRD1 to read data buses RDD and ZRDD.

On the other hand, in the case where address bit CA0 is 1, signal EZORG is set to L level. Parallel/serial converting circuit 1556 first outputs data transmitted via read data buses RD1 and ZRD1 to read data buses RDD and ZRDD and, subsequently, outputs data transmitted via read data buses RD0 and ZRD0 to read data buses RDD and ZRDD.

In such a manner, the parallel-to-serial converted data is transmitted to output data latch 1558 and output from a pad to the outside via output driver 1530.

FIG. 39 is a circuit diagram showing the configuration of amplifying circuit 1554 in FIG. 38.

Referring to FIG. 39, amplifying circuit 1554 includes: a signal generating unit 1752 for generating a plurality of timing signals in accordance with control signals OEG, RDETG, and DOE; an inverter 1753 for receiving and inverting a clock signal CK; amplifier RA1 for amplifying data signals transmitted on read data buses RD1 and ZRD1; amplifier RA0 for amplifying data signals transmitted on read data buses RD0 and ZRD0; a connecting circuit 1812 for connecting data buses DB1 and ZDB1 to amplifier RA1 in accordance with signal ZRDAI; and a connecting circuit 1813 for connecting data buses DB0 and ZDB0 to amplifier RA0 in accordance with signal ZRDAI.

Control signal OEG is a signal for instructing a valid data output period. Control signal RDETG is a signal for determining a connection period of the data buses and amplifiers RA0 and RA1. Control signal DOE is a signal for determining an active period of data output circuit 1550.

Signal generating unit 1752 includes: an inverter 1762 for receiving and inverting clock signal CLKQ and outputting a signal ZCK; an inverter 1764 for receiving and inverting signal ZCK and outputting signal CK; a delay circuit 1766 for delaying signal CK by delay time Td; an inverter 1768 for receiving and inverting an output of delay circuit 1766; and an inverter 1770 for receiving and inverting an output of inverter 1768 and outputting signal CKD.

Signal generating unit 1752 further includes: an NAND circuit 1732 for receiving signals RDETG and DOE; an inverter 1734 for receiving and inverting an output of NAND circuit 1732 and outputting signal RDETL; an NAND circuit 1784 for receiving signals RDETL and OE; an NOR circuit 1786 for receiving an output of NAND circuit 1784 and signal CKD and outputting a signal ZRDAI; an NAND circuit 1788 for receiving clock signal CLKQ and signal OE and outputting a signal ZRDAE; and an inverter 1790 for receiving and inverting signal ZRDAE and outputting a signal RDAE.

Signal generating unit 1752 further includes: an inverter 1792 for receiving and inverting signal RDETL; an inverter 1794 for receiving and inverting signal OEG; P-channel MOS transistors 1796, 1798, and 1800 connected in series between a power supply node and a node N100; N-channel MOS transistors 1802 and 1804 connected in series between node N100 and a ground node; an NAND circuit 1804 whose one input is connected to node N100 and whose other input receives signal DOE and which outputs a signal ZOE; and an inverter 1808 for receiving and inverting signal ZOE. An output of inverter 1808 is supplied to node N100 and signal OE is output from node N100.

To the gates of P-channel MOS transistors 1796, 1798, and 1800, an output of inverter 1792, clock signal CK, and an output of inverter 1794 are supplied, respectively. To the gates of N-channel MOS transistors 1802 and 1804, an output of inverter 1794 and signal ZCK are supplied, respectively.

When signal ZRDAI becomes H level, connecting circuit 1812 connects data buses DB1 and ZDB1 to nodes N101 and N102, respectively. When signal ZRDAI becomes H level, connecting circuit 1813 connects data buses DB0 and ZDB0 to nodes N103 and N104, respectively.

Amplifier RA0 includes: a connecting circuit 414 for connecting nodes N103 and N104 to read data buses RD0 and ZRD0 when signal ZRDAE becomes H level; an enable circuit 416 for connecting read data buses RD0 and ZRD0 to the ground node when signal ZOE becomes H level; an initializing circuit 418 for coupling read data buses RD0 and ZRD0 to a ground potential in accordance with signal CKD and an output of inverter 1753; and a sense amplifier 420 which is activated to amplify a potential difference between read data buses RD0 and ZRD0 when signal ZRDAE is at L level and signal RDAE becomes H level.

Amplifier RA1 has a circuit configuration similar to that of amplifier RA0 except that amplifier RA1 is connected to nodes N101 and N102 in place of nodes N103 and N104 and is connected to read data buses RD1 and ZRD1 in place of read data buses RD0 and ZRD0. Consequently, description of the circuit configuration will not be repeated.

FIG. 40 is an operation waveform chart for explaining the operation of amplifying circuit 1554 illustrated in FIG. 39.

Referring to FIGS. 39 and 40, the operation in the case where CAS latency is 2.5 and the burst length is 4 will be described. Signal OEG is a signal for instructing a valid data output period. Signal RDETG is a signal determining a period of connection between the data bus and the amplifying circuit. Signals OEG and RDETG are supplied from a not illustrated control circuit together with signal DOE which determines an active period of the output circuit.

When command READ is given at time t1, outputting of data is started at time t6 after 2.5 clock cycles. Signal DOE is held at H level for a period from command READ is received until the end of a burst period.

In the period from time t4 to t5, signal RDETG becomes H level and signal OEG becomes H level. This indicates a period in which valid data exists on data buses DB0, DB1, ZDB0, and ZDB1. During this period, signal ZRDAI is activated to H level. In response to activation of signal ZRDAI, data buses DB0, DB1, ZDB0, and ZDB1 are connected to read data buses RD0, RD1, ZRD0, and ZRD1, respectively.

In the period from time t5 to t6, when signal CLKQ becomes H level, signal ZRDAE changes to L level, and read data buses RD0, RD1, ZRD0, and ZRD1 are disconnected from data buses DB0, DB1, ZDB0, and ZDB1, respectively. The potential difference between read data buses RD and ZRD at this time point is amplified to the maximum amplitude by sense amplifier 420, which is a cross-coupled amplifier.

FIG. 41 is a circuit diagram showing the configuration of parallel/serial converting circuit 1556 in FIG. 38.

Parallel/serial converting circuit 1556 orders data in accordance with signal EZORG. Signal EZORG is a signal determined by the least significant bit CA0 of the column address given together with command READ. When address bit CA0 is 0, signal EZORG is set to H level. On the contrary, when address bit CA0 is 1, signal EZORG is set to L level. Signal EZORG has a role of ordering data so that prefetched 2-bits data corresponds to address bit CA0.

Referring to FIG. 41, parallel/serial converting circuit 1556 includes: a signal generating unit 1820 for generating a control signal in accordance with signal EZORG; data holding circuits 1821 to 1824 for latching data signals transmitted via read data buses ZRD0, RD0, ZRD1, and RD1, respectively; a switching circuit 1826 for switching outputs of data holding circuits 1821 to 1824 in accordance with an output of signal generating unit 1820 in correspondence with an output order; a holding circuit 1828 for holding a signal corresponding to data which is output first among outputs of switching circuit 1826 and driving read data buses RDD and ZRDD; and a holding circuit 1830 for holding data which is output second among outputs of switching circuit 1826 and driving read data buses RDD and ZRDD.

Signal generating unit 1820 includes: an inverter 1922 for receiving and inverting signal EZORG and outputting a signal TR_O; an inverter 1924 for receiving and inverting signal TR_O and outputting a signal TR_E; an inverter 1926 for receiving and inverting signal NZPCNT and outputting a signal PZN; an inverter 1928 for receiving and inverting signal PZN and outputting a signal NZP; an inverter 1930 for receiving and inverting signal DOE and outputting a signal RES; and an inverter 1932 for receiving and inverting signal RES and outputting a signal ZRES.

Signal generating unit 1820 further includes: an NAND circuit 1934 of three inputs for receiving signals CQN, TR_E, and PZN; an NAND circuit 1936 of three inputs for receiving signals CQP, TR_E, and NZP; and an NAND circuit 1938 for receiving outputs of NAND circuits 1934 and 1936 and outputting a signal TR2_E.

Signal generating unit 1820 further includes: an NAND circuit 1940 of three inputs for receiving signals CQN, TR_O, and PZN; an NAND circuit 1942 of three inputs for receiving signals CQP, TR_O, and NZP; and an NAND circuit 1944 for receiving outputs of NAND circuits 1940 and 1942 and outputting signal TR2_O.

Signal generating unit 1820 further includes: an NOR circuit 1946 of three inputs for receiving signals CQP, CQN, and RES; an inverter 1948 for receiving and inverting an output of NOR circuit 1946 and outputting a signal TR23; an inverter 1950 for receiving and inverting signal ZRES; an NOR circuit 1952 for receiving signal CLKQ and an output of inverter 1950 and outputting a signal ZTRV; an inverter 1954 for receiving and inverting signal ZTRV and outputting signal TRV; an NAND circuit 1956 for receiving signals CQP and PZN; an NAND circuit 1958 for receiving signals CQN and NZP; and an NAND circuit 1960 for receiving outputs of NAND circuits 1956 and 1958 and outputting a signal TR3.

Data holding circuit 1821 includes: a clocked inverter 1832 which is activated when signal TRV becomes H level, to invert a data signal transmitted via data bus ZRD0 and output the resultant to a node N111; an inverter 1834 whose input is connected to node N111; and a clocked inverter 1836 which is activated when signal ZTRV becomes H level, to invert an output of inverter 1834, and output the resultant to node N111.

Data holding circuit 1822 is different from data holding circuit 1821 with respect to the point that read data bus RD0 is connected in place of read data bus ZRD0, and the data holding circuit 1822 is connected to a node N112 in place of node N111. Data holding circuit 1823 is different from data holding circuit 1821 with respect to the point that read data bus ZRD1 is connected in place of read data bus ZRD0, and data holding circuit 1823 is connected to a node N113 in place of node N111. Data holding circuit 1824 is different from data holding circuit 1821 with respect to the point that read data bus RD1 is connected in place of read data bus ZRD0, and the data holding circuit 1824 is connected to a node N114 in place of node N111. However, the internal circuit configuration in each of data holding circuits 1823 and 1824 is similar to that of data holding circuit 1821, so that its description will not be repeated.

Switching circuit 1826 includes: an inverter 1838 for receiving and inverting signal TR2_E; an inverter 1840 for receiving and inverting signal TR2_O; a clocked inverter 1842 for inverting a signal transmitted to node N111 in response to activation of signal TR2_O and outputting the resultant to a node N121; a clocked inverter 1844 for inverting a signal transmitted to node N111 in response to activation of signal TR2_E and outputting the resultant to read data bus ZRDD; a clocked inverter 1846 for inverting a signal transmitted to node N112 in response to activation of signal TR2_O and outputting the resultant to node N122; and a clocked inverter 1848 for inverting a signal transmitted to node N112 in response to activation of signal TR2_E and outputting the resultant to read data bus RDD.

Switching circuit 1826 further includes: a clocked inverter 1850 for inverting a signal transmitted to node N113 in response to activation of signal TR2_E and outputting the resultant to node N121; an inverter 1852 for inverting a signal transmitted to node N113 in response to activation of signal TR2_O and outputting the resultant to read data bus ZRDD; a clocked inverter 1854 for inverting a signal transmitted to node N114 in response to activation of signal TR2_E and outputting the resultant to node N122; and a clocked inverter 1856 for inverting a signal transmitted to node N114 in response to activation of signal TR2_O and outputting the resultant to read data bus RDD.

Holding circuit 1828 includes: an inverter 1862 for receiving and inverting signal TR23; an inverter 1858 whose input is connected to read data bus RDD; a clocked inverter 1860 for receiving and inverting an output of inverter 1858 when an output of inverter 1862 becomes H level and outputting the resultant to read data bus RDD; and an N-channel MOS transistor 1864 which is made conductive in accordance with signal RES to connect read data bus RDD to the ground node.

Holding circuit 1828 further includes: an inverter 1868 whose input is connected to read data bus ZRDD; a clocked inverter 1870 for receiving and inverting an output of inverter 1868 when an output of inverter 1862 becomes H level and outputting the resultant to read data bus ZRDD; and an N-channel MOS transistor 1874 which is made conductive in accordance with signal RES to connect read data bus ZRDD to the ground node.

Holding circuit 1830 includes: an N-channel MOS transistor 1882 for connecting node N122 to the ground node in response to activation of signal RES; and a second data latch 1884 for latching data transmitted to node N122. Second data latch 1884 includes an inverter 1890 whose input is connected to node N122; and an inverter 1892 for receiving and inverting an output of inverter 1890 and supplying the resultant to the input of inverter 1890.

Holding circuit 1830 further includes: an inverter 1886 for receiving and inverting signal TR3; and a clocked inverter 1888 for receiving and inverting an output of inverter 1890 when signal TR3 becomes H level and outputting the resultant to read data bus RDD.

Holding circuit 1830 further includes: an N-channel MOS transistor 1902 for connecting node N121 to the ground node in response to activation of signal RES; and a second data latch 1904 for latching data transmitted to node N121. Second data latch 1904 includes: an inverter 1910 whose input is connected to node N121; and an inverter 1912 for receiving and inverting an output of inverter 1910 and supplying the resultant to the input of inverter 1910.

Holding circuit 1830 further includes: an inverter 1906 for receiving and inverting signal TR3; and a clocked inverter 1908 for receiving and inverting an output of inverter 1910 when signal TR3 becomes H level and outputting the resultant to read data bus ZRDD.

FIG. 42 is an operation waveform chart for explaining operation timings of parallel/serial converting circuit 1556 shown in FIG. 41.

Referring to FIGS. 41 and 42, in the period from time t3 to t4, data is transmitted from read data buses RD0, RD1, ZRD0, and ZRD1 to an output part of switching circuit 1826 via data holding circuits 1821 to 1824.

Read data bus ZRD0 will be described. When signal TRV is at H level, clocked inverter 1832 is activated, and data is transmitted to node N111. When signal TR2_E or TR2_O is activated to H level, a signal transmitted to node N111 is transmitted to read data bus ZRDD or node N121.

Signal TRV becomes H level when signal CLKQ is at H level. One of signals TR2_E and TR2_O is activated to H level in accordance with address bit CA0. The activating timing is valid for a period in which signal CQP is at H level when the CAS latency is 2.5.

For example, in the case where CA0 is 0, data on data bus DB0 is output first, and signal TR_E is set to H level, data Dn0 which is output first from the prefetched 2-bits data passes through clocked inverter 1844 via node N111 and is transmitted to read data bus ZRDD in a period Te in FIG. 42. Data Dn1 which is output later passes from read data bus ZRD1 through clocked inverter 1850 via node N113, arrives at node N121, and is held in second data latch 1904.

When signal TR3 is activated to H level in accordance with signal CQN in the period from time t4 to t5, the data held in second data latch 1904 passes through clocked inverter 1908 and is output to read data bus ZRDD.

Data in read data buses RD0 and RD1 is similarly ordered and output to read data bus RDD.

First, in the example of the configuration shown in FIG. 38, between a position where data on the data bus is amplified by amplifying circuit 1554 and a position where the amplified data is output to the outside of the chip, parallel/serial converting circuit 1556 is provided. In the case of parallel/serial converting circuit 1556 shown in FIG. 41, data to be output first in the prefetched 2-bits data is transmitted to read data buses RD0 and ZRD0 via clocked inverters of two stages in parallel/serial converting circuit 1556. For example, in the case where the signal transmitted from amplifying circuit 1554 in FIG. 38 via read data bus ZRD0 corresponds to data which is output first, the data is output to read data bus ZRDD via clocked inverters 1832 and 1844 of two stages shown in FIG. 41.

On the other hand, in the case where read data is read from the memory array each time like an SDR (Single Data Rate) SDRAM, such a parallel/serial converting circuit is unnecessary. Consequently, as compared with the configuration shown in FIG. 38, a data propagation delay in the data output circuit is shorter.

In other words, in the configuration example shown in FIG. 38, the data propagation delay in the data output circuit is large and, as a result, an actual value Tcac of time of a period from command READ is accepted until first data is output from a terminal is long. The inverse which is the number obtained by dividing Tcac by CAS latency CL, that is, CL/Tcac is the actual operating frequency. Long Tcac denotes that the operating frequency cannot be improved.

When a delay in data output circuit 1550 becomes larger, backward amount Ta shown in FIG. 42 of clock signals CLK_P and CLK_N generated by DLL circuit 1500 becomes large as well. In the case where clock signals EXTCLK and EXTZCLK in the clock cycle immediately preceding to a clock cycle in which data is output are delayed to generate internal clock signals, time of tCK-Ta or longer cannot be allowed until the internal clock signal is generated (tCK denotes a clock cycle time). That is, if circuit operation takes time longer than tCK-Ta even when the delay time is set to 0 by DLL circuit 1500, internal clocks have to be generated by using clock signals EXTCLK and EXTZCLK in the cycle preceding to the immediately preceding clock cycle.

Generally, when clock backward amount Ta is large, it is difficult to design the DLL circuit for the reason that a control circuit for dynamically switching clock signals EXTCLK and EXTZCLK in preceding cycles of the proper number in the DLL circuit in order to realize the operation in a wide frequency range becomes complicated.

In addition, the circuit scale of parallel/serial converting circuit 1556 shown in FIG. 41 is large and the layout area is large. As a result, it becomes difficult to design a layout of an output circuit band, and there are adverse influences such that it is difficult to sufficiently assure a decoupling capacity for stabilizing power supply. When the layout area becomes large, the length of signal interconnection between circuits becomes long, and it is feared that an influence of parasitic capacitance is exerted.

SUMMARY OF THE INVENTION

An object of the present invention is to provide a very reliable semiconductor memory device with an assured operation margin while avoiding increase in delay in data propagation and increase in layout area.

The invention relates to, in short, a semiconductor memory device including a memory array, a first data bus, and a data output circuit.

From the memory array, a plurality of data signals are read in a group in accordance with a clock signal. The first data bus transmits the plurality of data signals. The data output circuit receives the plurality of data signals from the data bus and amplifies the signals. The data output circuit includes: a plurality of selecting units for selecting corresponding one of the plurality of data signals in accordance with an address signal; a plurality of amplifying units provided in correspondence with the plurality of selecting units, respectively, each for amplifying an output of a corresponding selecting unit; and an output driving circuit for sequentially receiving the plurality of data signals amplified from the plurality of amplifying units.

Therefore, a main advantage of the invention is that data can be output at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a diagram showing the relation between the order of data to be output and address bits CA1 and CA0;

DESCRIPTION OF THE PREFERRED EMBODIMENTS

Figure 1:
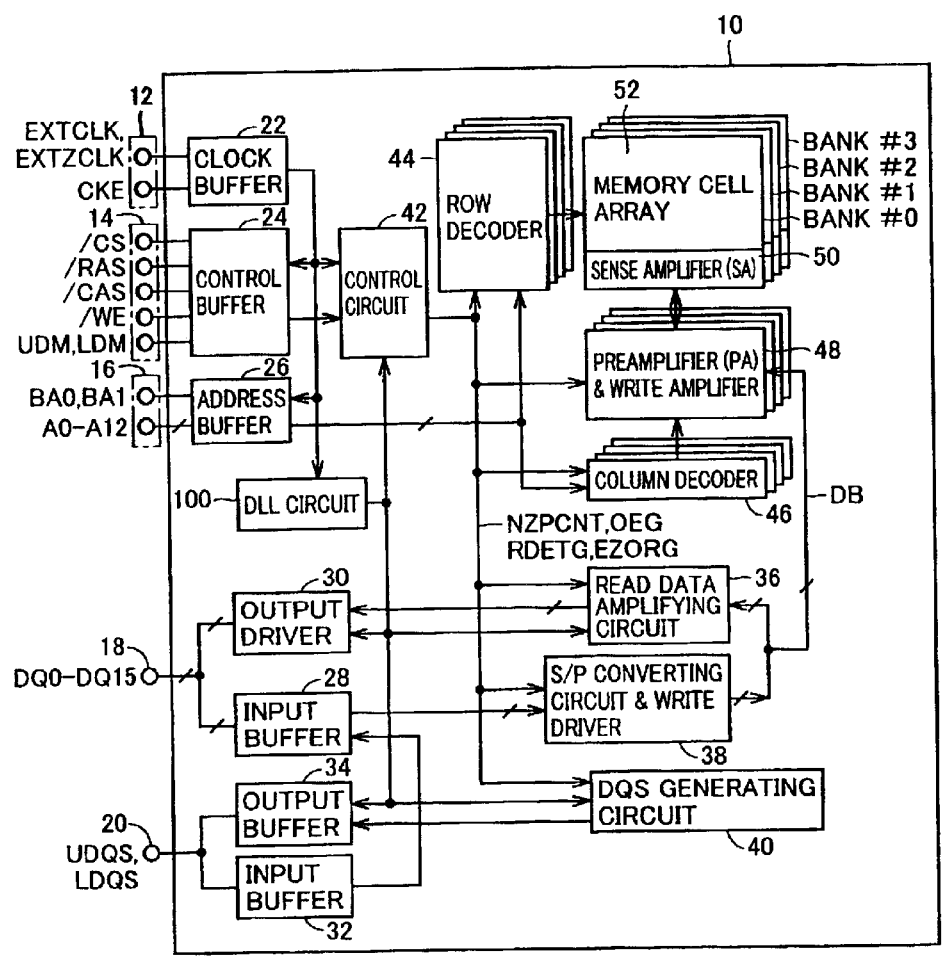
FIG. 1 is a schematic block diagram showing the general configuration of a semiconductor memory device 10 of a first embodiment.

Embodiments of the invention will be described in detail hereinafter with reference to the drawings. The same reference numeral in the drawing denotes the same part or a corresponding part.

(First Embodiment)

FIG. 1 is a schematic block diagram showing a general configuration of a semiconductor memory device 10 of a first embodiment.

Referring to FIG. 1, semiconductor memory device 10 has a clock terminal 12, a control signal terminal 14, an address terminal 16, a data input/output terminal 18, and a data strobe signal input/output terminal 20.

Semiconductor memory device 10 further includes a clock buffer 22, a control signal buffer 24, an address buffer 26, an input buffer 28 and an output buffer 30 related to data DQ0 to DQ15, and an input buffer 32 and an output buffer 34 related to data strobe signals UDQS and LDQS.

Semiconductor memory device 10 further includes a read data amplifying circuit 36, an S/P (serial/parallel) converting circuit & write driver 38, a DQS generating circuit 40, and a DLL circuit 100.

Semiconductor memory device 10 further includes a control circuit 42, a row decoder 44, a column decoder 46, a preamplifier & write amplifier 48, a sense amplifier 50, and a memory cell array 52.

In FIG. 1, only main components regarding data input/output of semiconductor memory device 10 are representatively shown.

Semiconductor memory device 10 has a 2-bits prefetch configuration in which, at the time of reading data in cycles of external clocks from memory cell array 52, data of 2×n bits (n denotes a bit width in a semiconductor memory device and, n=16 in semiconductor memory device 10) is read per single reading operation. Specifically, 2-bits data is read from memory cell array 52 and output to (n) data output circuits every cycle of an external clock, the 2-bits data is ordered in each of the data output circuits, transferred in half cycles, and output to the outside.

At the time of data writing, semiconductor memory device 10 latches data of n bits (n=16) per half cycle of an external clock synchronously with the rising and falling edges of an external clock, and writes data of 2n bits in a group every cycle of the external clock into memory cell array 52.

Clock terminal 12 receives external clock signals EXTCLK and EXTZCLK complementary to each other and a clock enable signal CKE. Control signal terminal 14 receives command control signals of a chip select signal/CS, a row address strobe signal/RAS, a column address strobe signal/CAS, a write enable signal/WE, and input/output DQ mask signals UDM and LDM. Address terminal 16 receives address signals A0 to A12 and bank address signals BA0 and BA1.

Clock buffer 22 receives external clock signals EXTCLK and EXTZCLK and clock enable signal CKE, generates an internal clock signal, and outputs the internal clock signal to control signal buffer 24, address buffer 26, and DLL circuit 100. Control signal buffer 24 latches chip select signal/CS, row address strobe signal/RAS, column address strobe signal/CAS, write enable signal/WE and input/output DQ mask signals UDM and LDM synchronously with the internal clock received from clock buffer 22, and outputs the command control signal to control circuit 42. Address buffer 26 latches address signals A0 to A12 and bank address signals BA0 and BA1 synchronously with the internal clock signal received from clock buffer 22, generates an internal address signal, and outputs the internal address signal to row decoder 44 and column decoder 46.

Data input/output terminal 18 is a terminal through which data to be read/written to/from semiconductor memory device 10 is transmitted/received to/from the outside. Data input/output terminal 18 receives data DQ0 to DQ15 input from the outside at the time of data writing, and outputs data DQ0 to DQ15 to the outside at the time of data reading.

At the time of writing data, data strobe signal input/output terminal 20 receives, from the outside, data strobe signals UDQS and LDQS for reading data DQ0 to DQ15 from the outside. At the time of reading data, data strobe signal input/output terminal 20 outputs data strobe signals UDQS and LDQS for reading data DQ0 to DQ15 to the outside by an external controller.

Input buffer 28 inputs data DQ0 to DQ15 synchronously with data strobe signals UDQS and LDQS received by input buffer 32 from the outside.

Output driver 30 operates synchronously with a DLL clock received from DLL circuit 100 and outputs data DQ0 to DQ15 to data input/output terminal 18.

Output buffer 34 latches data strobe signals UDQS and LDQS generated by DQS generating circuit 40 which operates synchronously with an output of DLL circuit 100. Output buffer 34 operates synchronously with an output of DLL circuit 100 together with output driver 30 for outputting data DQ0 to DQ15, and outputs data strobe signals UDQS and LDQS to data strobe signal input/output terminal 20.

At data reading, read data amplifying circuit 36 amplifies read data received from preamplifier & write amplifier 48 in accordance with control signals NZPCNT, OEG, RDETG, and EZORG supplied from control circuit 42, orders data of two bits which is read at once as data DQi (i: 0 to 15), and outputs the resultant to output driver 30.

At data writing, S/P converting circuit & write driver 38 outputs data DQi received from input buffer 28 bit by bit every half cycle of the external clock to preamplifier & write amplifier 48 so that two bits are in parallel every cycle of the external clock.

Control circuit 42 latches a command control signal synchronously with an output of clock buffer 22, and controls row decoder 44, column decoder 46, and preamplifier & write amplifier 48 on the basis of the latched command control signal. By the operation, data DQ0 to DQ15 is read/written from/to memory cell array 52. Control circuit 42 also controls generation of the data strobe signal in DQS generating circuit 40 on the basis of the latched command control signal.

Memory cell array 52 for storing data is constructed by four banks each capable of independently operating, from/to which data is read/written through sense amplifier 50.

Figure 36:
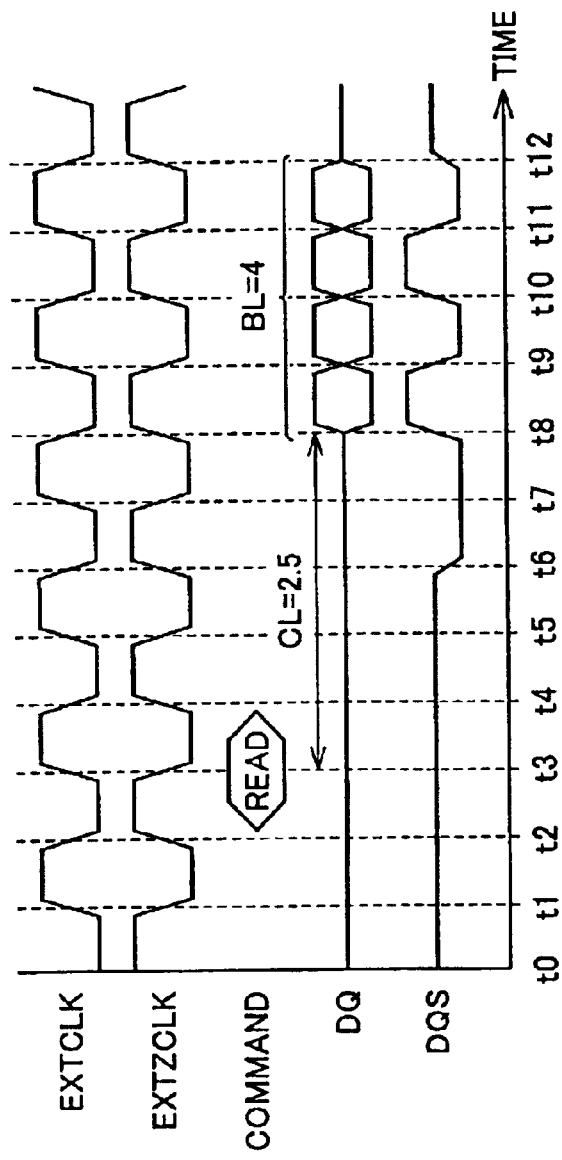
FIG. 36 is an operation waveform chart showing data output timings at the time of reading data from a DDR SDRAM which is a so-called DDR-I.
Figure 37:
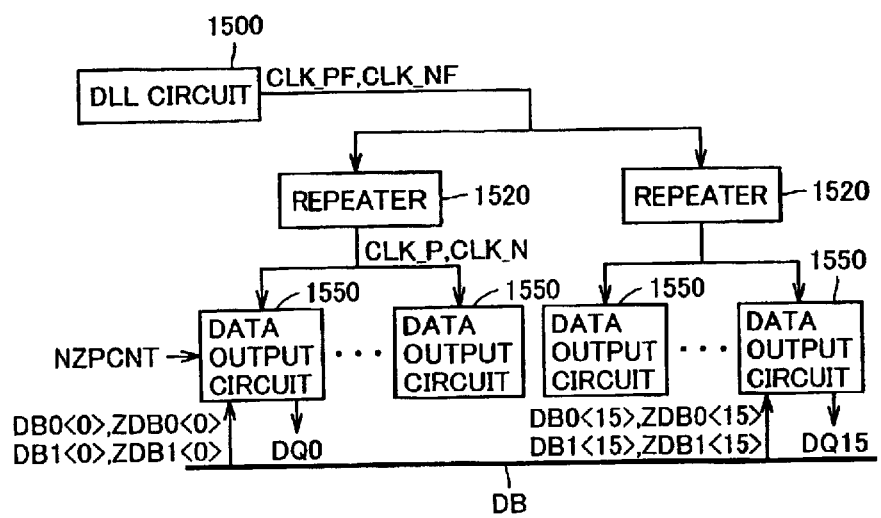
FIG. 37 is a schematic block diagram for explaining a clock transmitting path from DLL circuit 1500 to data output circuit 1550 in a conventional DDR SDRAM.

DLL circuit 100 generates internal clock signals CLK_PF and CLK_NF which will be described hereinafter, obtained by delaying external clock signal EXTCLK. A timing difference tAC between the edges of external clock signals EXTCLK and EXTZCLK and output of data DQ is specified so as to be within a predetermined range. For example, the operation waveform of FIG. 36 shows a case where timing difference tAC is controlled to zero. To maintain the definition of timing difference tAC, internal clock signals CLK_PF and CLK_NF are necessary.

Specifically, to realize data output as shown in FIG. 36, as a trigger of data output, internal clock signals CLK_PF and CLK_NF whose timing is slightly earlier than the timing of edge of external clock signal EXTCLK are necessary for the reason that, depending on the capacity of each internal circuit, a delay occurs in the period from the external clock signal is input to the semiconductor memory device until data is actually output.

Since external clock signal EXTCLK is a constant cycle signal, a clock generating circuit has to be provided. The clock generating circuit can control a delay amount Td so that internal clock signals CLK_P and CLK_N delayed from the edges of external clock EXTCLK only by proper time Ta are generated. The clock generating circuit delays external clock signal EXTCLK only by proper delay amount Td. Then, data DQ output from the data output circuit operating by using internal clock signals CLK_P and CLK_N as triggers and data strobe signal DQS output from the data strobe signal output circuit satisfy timing difference tAC. Such a circuit for generating internal clock signals is called a DLL (Delay Locked Loop) circuit.

Figure 2:
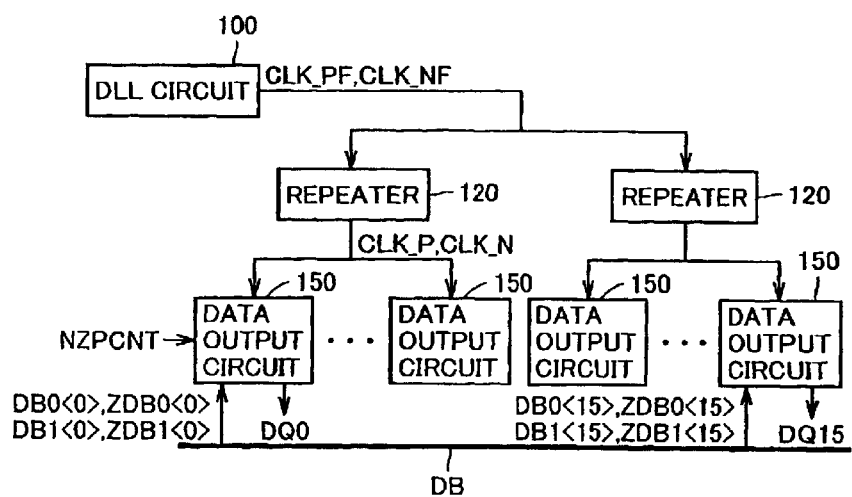
FIG. 2 is a schematic block diagram for explaining a clock transmitting path from a DLL circuit 100 in FIG. 1 to a data output circuit 150.

FIG. 2 is a schematic block diagram for explaining a clock transmission path from DLL circuit 100 to data output circuit 150 in FIG. 1. Data output circuit 150 corresponds to read data amplifying circuit 36 and output driver 30 in FIG. 1.

Referring to FIG. 2, DLL circuit 100 generates internal clock signals CLK_PF and CLK_NF on the basis of external clock signals EXTCLK and EXTZCLK and inputs internal clock signals CLK_PF and CLK_NF to a repeater 120.

Repeater 120 shapes the signal waveform of internal clock signals CLK_PF and CLK_NF and outputs internal clock signals CLK_P and CLK_N whose signal level is maintained to a data output circuit 150.

Sixteen sets of data output circuits 150 are provided in correspondence with the word configuration of semiconductor memory device 10. Each of data output circuits 150 latches read data read from memory cell array 52 shown in FIG. 1 from data bus DB synchronously with internal clock signals CLK_P and CLK_N and outputs the read data to data input/output terminal 18 shown in FIG. 1.

Data bus DB includes data buses DB0<15:0> and DB1<15:0> and data buses ZDB0<15:0> and ZDB1<15:0>. To a data output circuit 150E, corresponding 2-bits data is simultaneously transmitted. For example, to data output circuit 150 which outputs signal DQ0, among the data buses, data buses DB0<0>, DB1<0>, ZDB0<0>, and ZDB1<0> are connected. To data output circuit 150 which outputs signal DQ15, data buses DB0<15>, DB1<15>, ZDB0<15>, and ZDB1<15> are connected.

As shown in FIG. 2, the signal path extending from DLL circuit 100 to data output circuit 150 has a tree shape and, repeaters 120 are disposed by considering that data output timings are not largely different from each other among plural data output circuits 150. Generally, one repeater 120 is disposed for eight data output circuits 150 or four data output circuits 150. In FIG. 2, one repeater 120 is disposed for eight data output circuits.

Figure 3:
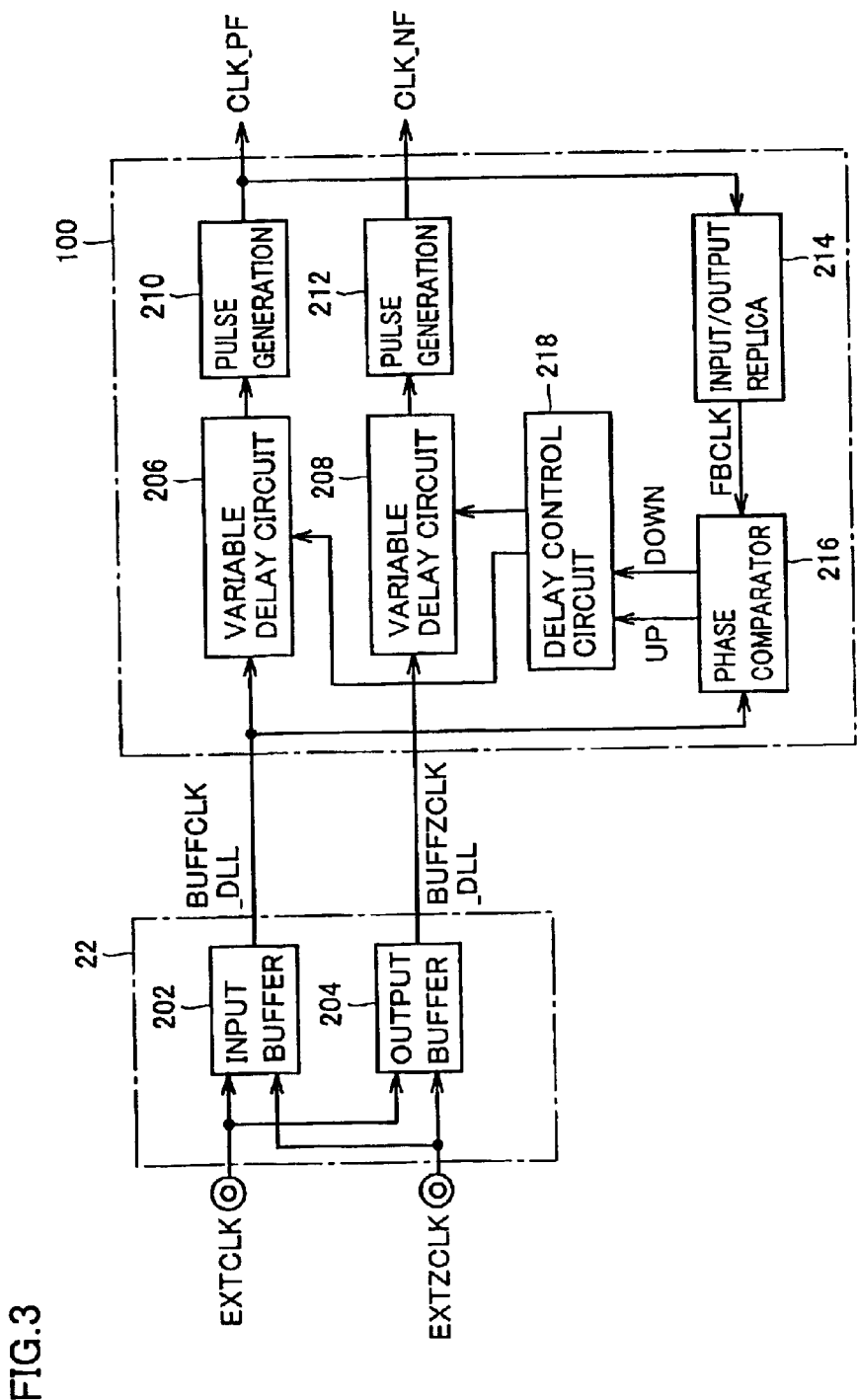
FIG. 3 is a block diagram showing the configuration of DLL circuit 100 in FIGS. 1 and 2.

FIG. 3 is a block diagram showing the configuration of DLL circuit 100 in FIGS. 1 and 2.

Referring to FIG. 3, DLL circuit 100 includes variable delay circuits 206 and 208, pulse generating circuits 210 and 212, an input/output replica circuit 214, a phase comparator 216, and a delay control circuit 218.

An input buffer 202 for receiving external clock signals EXTCLK and EXTZCLK supplied from the outside and outputting an internal clock signal BUFFCLK_DLL to DLL circuit 100 detects an intersecting point of a potential level at which external clock signal EXTCLK rises and a potential level at which external clock signal EXTZCLK as an inversion signal of external clock signal EXTCLK falls, and generates internal clock signal BUFFCLK_DLL.

On the other hand, an input buffer 204 detects an intersecting point of a potential level at which external clock signal EXTCLK falls and a potential level at which external clock signal EXTZCLK rises, and generates an internal clock signal BUFFZCLK_DLL.

Input buffers 202 and 204 are included in clock buffer 22 in FIG. 1.

Variable delaying circuit 206 delays internal clock signal BUFFCLK_DLL received from input buffer 202 and outputs the resultant to pulse generating circuit 210. The delay amount of variable delay circuit 206 is adjusted in accordance with an output of delay control circuit 218.

Pulse generating circuit 210 generates internal clock signal CLK_PF, which is a pulse signal synchronized with the rising edge of a signal output from variable delay circuit 206.

Variable delay circuit 208 delays internal clock signal BUFFZCLK_DLL received from input buffer 204 and outputs the resultant to pulse generating circuit 212. The delay amount of variable delay circuit 208 is also adjusted in accordance with an output of delay control circuit 218.

Pulse generating circuit 212 generates internal clock signal CLK_NF, which is a pulse signal synchronized with the rising edge of a signal output from variable delay circuit 208.

The characteristic of input/output replica circuit 214 reflects the characteristic of input buffer 202 and a time period from internal clock signals CLK_PF and CLK_NF are output from DLL circuit 100 until data DQ is output to the data input/output terminal. Input/output replica circuit 214 gives a corresponding delay amount to internal clock signal CLK_PF.

Phase comparator 216 compares an internal clock signal FBCLK output from input/output replica circuit 214 with internal clock signal BUFFCLK_DLL after one or more cycles of the external clock, and generates control signals UP and DOWN for increasing/decreasing the delay amounts of variable delay circuits 206 and 208 on the basis of the phase difference.

Delay control circuit 218 generates a delay control signal on the basis of control signal UP or DOWN and outputs the delay control signal to variable delay circuits 206 and 208 to adjust the delay amount in variable delay circuits 206 and 208. When the phase of internal clock signal BUFFCLK_DLL and that of internal clock signal FBCLK coincide with each other, both control signals UP and DOWN are not output from phase comparator 216, a delay control signal has a fixed value, and the delay amounts in variable delay circuits 206 and 208 are fixed.

By the operation, internal clock signals CLK_PF and CLK_NF become signals whose phases advance more than external clock signal EXTCLK only by the delay amount in the data output circuit.

Therefore, when the delay amount given by input/output replica circuit 214 coincides with the delay amount in input buffer 202, repeater 120, and data output circuit 150, the timing difference tAC between the edges of external/clock signals EXTCLK and EXTZCLK and an output of data DQ becomes zero.

On the other hand, when the phase of internal clock signal BUFFCLK_DLL and that of internal clock signal FBCLK do not coincide with each other, control signal UP or DOWN is output from phase comparator 216 in accordance with the phase difference, the delay unit is connected or disconnected in variable delay circuits 206 and 208, and the delay amount is adjusted.

Figure 4:
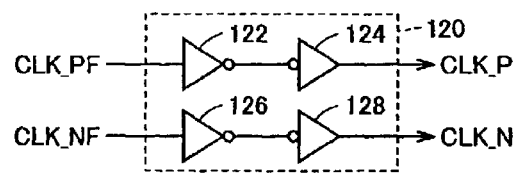
FIG. 4 is a circuit diagram showing an example of the configuration of a repeater 120 in FIG. 2.

FIG. 4 is a circuit diagram showing an example of the configuration of repeater 120 in FIG. 2.

Referring to FIG. 4, repeater 120 includes an inverter 122 for receiving and inverting clock signal CLK_PF and an inverter 124 for receiving and inverting an output of inverter 122 and outputting a clock signal CLK_P.

Repeater 120 further includes an inverter 126 for receiving and inverting clock signal CLK_NF and an inverter 128 for receiving and inverting an output of inverter 126 and outputting a clock signal CLK_N.

The attenuated amplitudes of clock signals CLK_PF and CLK_NF are amplified by repeater 120 and the resultants are transmitted as clock signals CLK_P and CLK_N to data output circuit 150.

Figure 5:
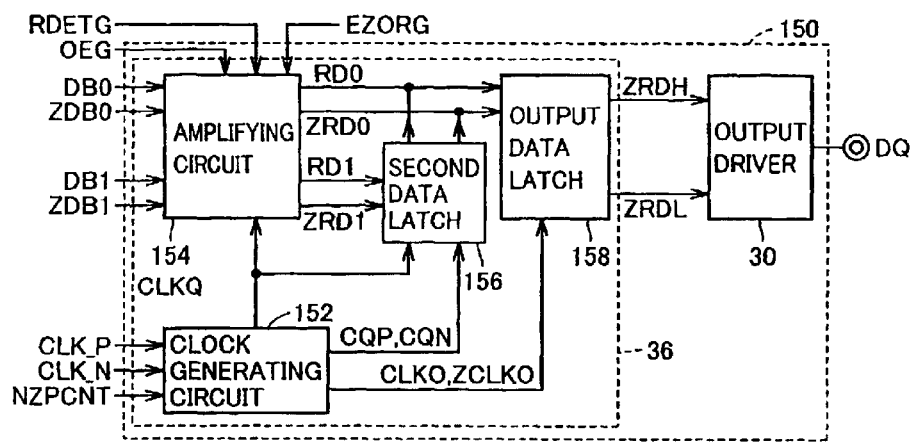
FIG. 5 is a block diagram showing the configuration of data output circuit 150 in FIG. 3.

FIG. 5 is a block diagram showing the configuration of data output circuit 150 in FIG. 3.

Referring to FIG. 5, data output circuit 150 includes read data amplifying circuit 36 for amplifying read data read from memory cell array 52, and output driver 30 for driving a terminal in accordance with the output of read data amplifying circuit 36 and outputting data signal DQ.

Read data amplifying circuit 36 includes: a clock generating circuit 152 for receiving internal signals CLK_P and CLK_N output from repeater 120 in accordance with control signal NZPCNT supplied from control circuit 42 in FIG. 1 and outputting clock signals CLKQ, CQP, CQN, CLKO, and ZCLKO; and an amplifying circuit 154 for amplifying read data signals transmitted via data buses DB0, ZDB0, DB1 and ZDB1 in accordance with control signals RDETG, EZORG, and OEG supplied from control circuit 42 and clock signal CLKQ, ordering the amplified data, outputting data to be output first to read data buses RD0 and ZRD0, and outputting data to be output second to read data buses RD1 and ZRD1.

Each of data buses DB0, ZDB0, DB1 and ZDB1 corresponds to one bit of corresponding one of data buses DB0<15:0>, ZDB0<15:0>, DB1<15:0>, and ZDB1<15:0>. For example, in the case of data output circuit 150 for outputting DQ0, data buses DB0, ZDB0, DB1, and ZDB1 correspond to data buses DB0<0>, ZDB0<0>, DB1<0>, and ZDB1<0>, respectively.

Read data amplifying circuit 36 further includes: a second data latch 156 for once holding the read data to be output to read data buses RD1 and ZRD1 synchronously with clock signals CLKQ, CQP, and CQN and outputting the read data to read data buses RD0 and ZRD0; and an output data latch 158 for converting read data signals sequentially output to read data buses RD0 and ZRD0 synchronously with clock signals CLKO and ZCLKO into signals ZRDH and ZRDL for controlling output driver 30, and outputting signals ZRDH and ZRDL.

Figure 38:
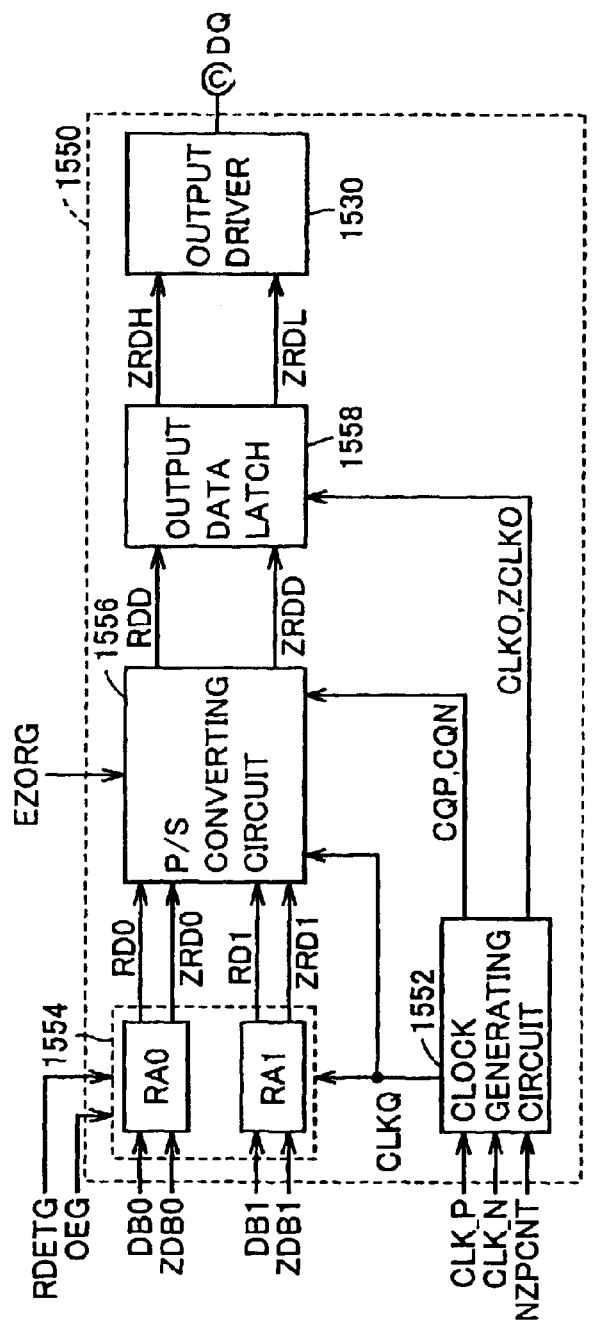
FIG. 38 is a block diagram showing the configuration of data output circuit 1550 in FIG. 37.

The configuration of conventional data output circuit 1550 shown in FIG. 38 and that of data output circuit 150 of the first embodiment shown in FIG. 5 are compared with each other. In data output circuit 150 of FIG. 5, control signal EZORG for ordering prefetched 2-bits data is input to amplifying circuit 154.

That is, in the configuration of FIG. 5, by the time data is output from amplifying circuit 154, ordering of data is completed. Among the ordered data signals, the data to be output first is directly output to read data buses RD0 and ZRD0 and transmitted to output data latch 158. Output data latch 158 latches the transmitted data signal synchronously with clock signals CLKO and ZCLKO.

On the other hand, the data signal to be output second is once saved and held in second data latch 156 via read data buses RD1 and ZRD1. The data to be output first is latched by output data latch 158 synchronously with clock signals CLKO and ZCLKO, after that, output to read data buses RD0 and ZRD0, and transmitted toward output data latch 158.

Figure 6:
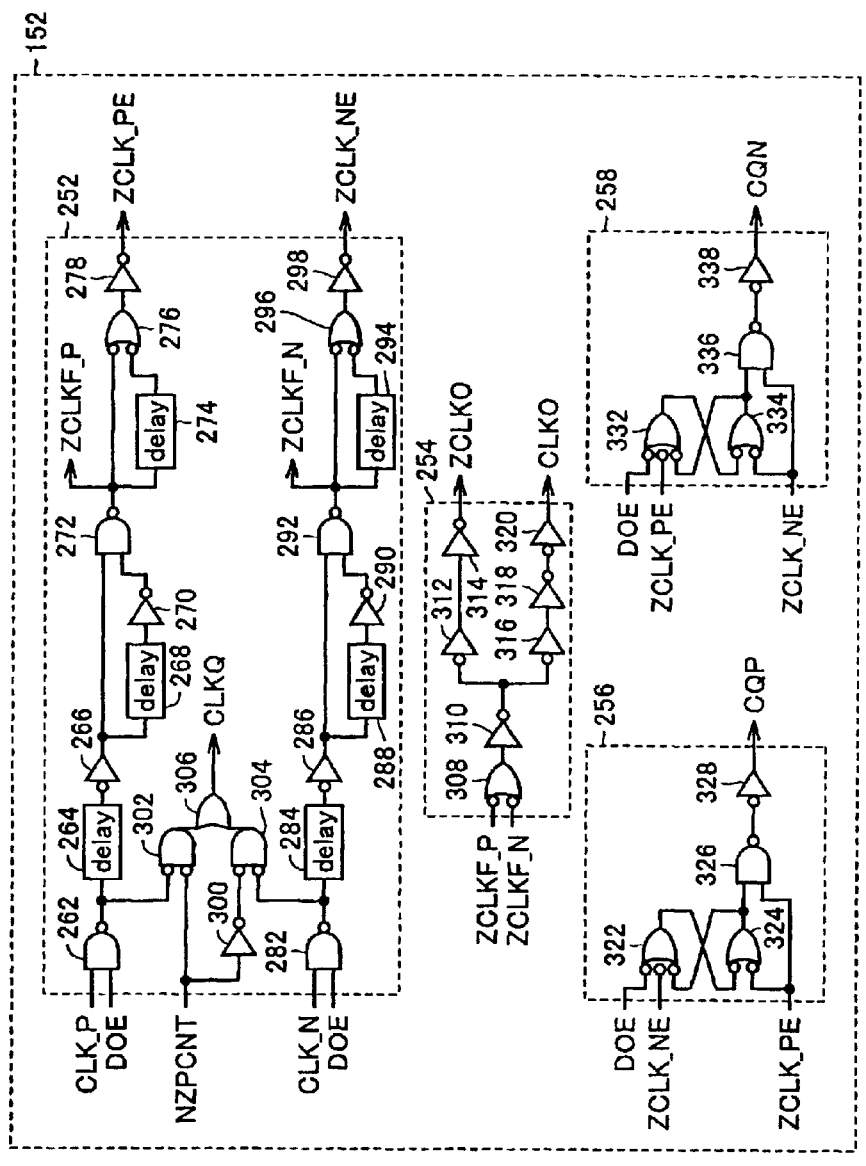
FIG. 6 is a circuit diagram showing the configuration of a clock generating circuit 152 in FIG. 5.

FIG. 6 is a circuit diagram showing the configuration of clock generating circuit 152 in FIG. 5.

Referring to FIG. 6, clock generating circuit 152 includes: a signal generating unit 252 for receiving control signals NZPCNT and DOE from control circuit 42 in FIG. 1, receiving clock signals CLK_P and CLK_N from repeater 120 in FIG. 2, and outputting clock signals CLKQ, ZCLK_PE, ZCLK_NE, ZCLKF_P, and ZCLKF_N; a signal generating unit 254 for outputting clock signals CLKO and ZCLKO in accordance with clock signals ZCLKF_P and ZCLKF_N output from signal generating unit 252; a signal generating unit 256 for outputting clock signal CQP in accordance with control signal DOE and clock signals ZCLK_NE and ZCLK_PE; and a signal generating unit 258 for outputting clock signal CQN in accordance with control signal DOE and clock signals ZCLK_PE and ZCLK_NE.

Signal generating unit 252 includes: an NAND circuit 262 for receiving clock signal CLK_P and control signal DOE; a delay circuit 264 for delaying an output of NAND circuit 262; an inverter 266 for receiving and inverting an output of delay circuit 264; a delay circuit 268 for receiving and delaying an output of inverter 266; an inverter 270 for receiving and inverting an output of delay circuit 268; and an NAND circuit 272 for receiving outputs of inverters 266 and 270 and outputting clock signal ZCLKF_P.

Signal generating unit 252 further includes: a delay circuit 274 for receiving and delaying clock signal ZCLKF_P; an NAND circuit 276 for receiving an output of delay circuit 274 and clock signal ZCLKF_P; and an inverter 278 for receiving and inverting an output of NAND circuit 276 and outputting clock signal ZCLK_PE.

Signal generating unit 252 further includes: an NAND circuit 282 for receiving clock signal CLK_N and control signal DOE; a delay circuit 284 for receiving and delaying an output of NAND circuit 282; an inverter 286 for receiving and inverting an output of delay circuit 284; a delay circuit 288 for receiving and delaying an output of inverter 286; an inverter 290 for receiving and inverting an output of delay circuit 288; and an NAND circuit 292 for receiving outputs of inverters 286 and 290 and outputting clock signal ZCLKF_N.

Signal generating unit 252 further includes: a delay circuit 294 for receiving and delaying clock signal ZCLKF_N; an NAND circuit 296 for receiving an output of delay circuit 294 and clock signal ZCLKF_N; and an inverter 298 for receiving and inverting an output of NAND circuit 296 and outputting clock signal ZCLK_NE.

Signal generating unit 252 further includes: an inverter 300 for receiving and inverting control signal NZPCNT; an NOR circuit 302 for receiving control signal NZPCNT and an output of NAND circuit 262; an NOR circuit 304 for receiving an output of inverter 300 and an output of NAND circuit 282; and an OR circuit 306 for receiving outputs of NOR circuits 302 and 304 and outputting clock signal CLKQ.

Signal generating unit 254 includes: an NAND circuit 308 for receiving clock signals ZCLKF_P and ZCLKF_N; an inverter 310 for receiving and inverting an output of NAND circuit 308; inverters 312 and 314 of two stages connected in series for receiving an output of inverter 310 and outputting clock signal ZCLKO; and inverters 316, 318, and 320 of three stages connected in series for receiving an output of inverter 310 and outputting clock signal CLKO.

Signal generating unit 256 includes an NAND circuit 324 for receiving clock signal ZCLK_PE by one of its inputs, and an NAND circuit 322 of three inputs for receiving an output of NAND circuit 324, control signal DOE, and clock signal ZCLK_NE. An output of NAND circuit 322 is supplied to the other input of NAND circuit 324.

Signal generating unit 256 further includes an NAND circuit 326 for receiving an output of NAND circuit 324 and clock signal ZCLK_PE, and an inverter 328 for receiving and inverting an output of NAND circuit 326 and outputting clock signal CQP.

Signal generating unit 258 includes an NAND circuit 334 for receiving clock signal ZCLK_NE by one of its inputs and an NAND circuit 332 of three inputs for receiving an output of NAND circuit 334, control signal DOE, and clock signal ZCLK_PE. An output of NAND circuit 332 is supplied to the other input of NAND circuit 334.

Signal generating unit 258 further includes an NAND circuit 336 for receiving an output of NAND circuit 334 and clock signal ZCLK_NE, and an inverter 338 for receiving and inverting an output of NAND circuit 336 and outputting clock signal CQN.

Figure 7:
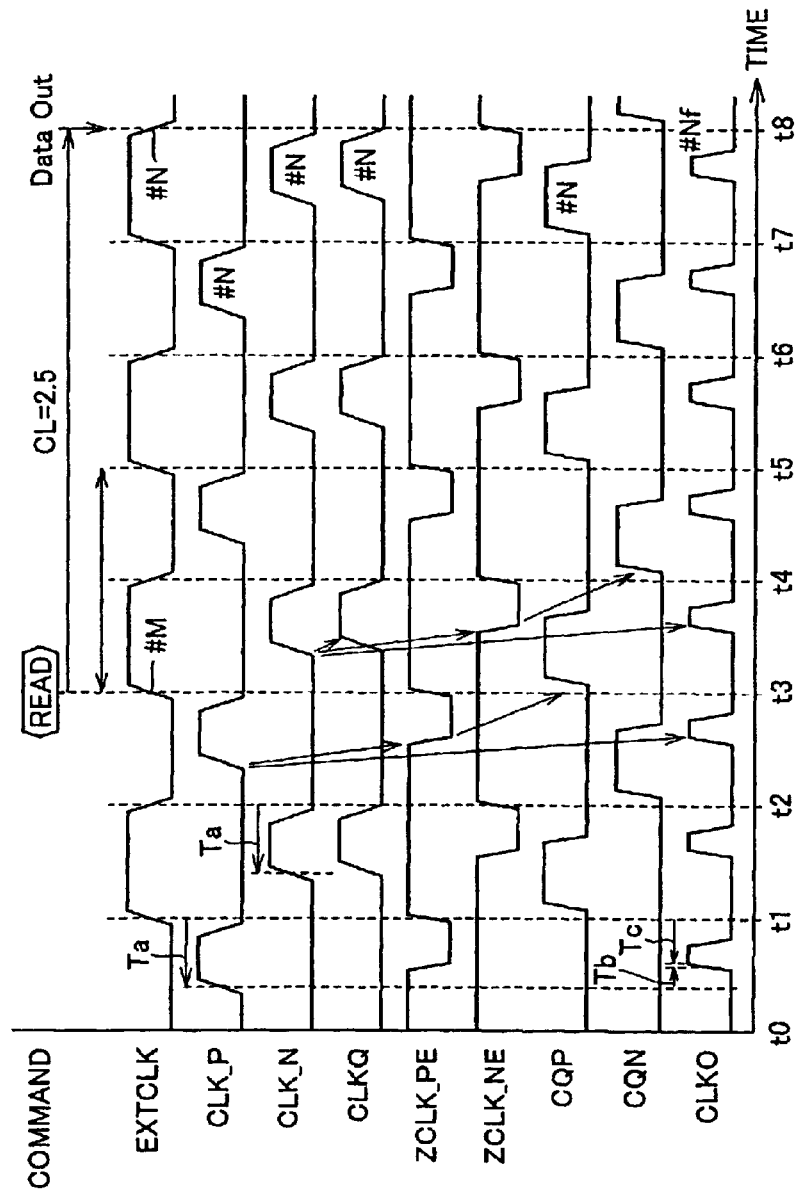
FIG. 7 is an operation waveform chart for explaining clock signals generated by clock generating circuit 152 shown in FIG. 6.

FIG. 7 is an operation waveform chart for explaining clock signals generated by clock generating circuit 152 shown in FIG. 6.

Referring to FIGS. 6 and 7, clock signals CLK_P and CLK_N generated by the DLL circuit and supplied via the repeater are variously processed by clock generating circuit 152, and the resultant signals are supplied to the circuits. In the case where the CAS latency is 2.5, the semiconductor memory device receives command READ at the rising edge #M of external clock signal EXTCLK at time t3, and starts outputting data at the falling edge #N of external clock signal EXTCLK at time t8.

Clock signal CLKQ is used for a control on activation of amplifying circuit 154 in FIG. 5 and a control to transfer data amplified by amplifying circuit 154 to second data latch 156. It is considered that the operation of activating amplifying circuit 154 and the data transferring operation are performed by using, as a start point, the internal clock according to the output timing of the first data of the prefetched 2-bits data. Therefore, to generate clock signal CLKQ, it is necessary to select a clock in consideration of the CAS latency.

In the case where the CAS latency is 2.5, activation of amplifying circuit 154 and data transfer to second data latch 156 are performed by using clock signal CLK_N as a start point. On the other hand, in the case where the CAS latency supported by the DDR-I is 2.0, clock signal CLK_P is used to generate clock signal CLKQ. To generate clock signal CLKQ, control signal NZPCNT for determining whether the CAS latency is an integer or a half-integer is used. If the CAS latency is an integer, NZPCNT is set to "L". If the CAS latency is a half-integer, NZPCNT is set to "H".

FIG. 7 shows a case where the CAS latency is 2.5 and a state where clock signal CLKQ is generated when control signal NZPCNT is set to H level.

Clock signals CQP and CQN are signals for determining timings of transmitting data signals transmitted from amplifying circuit 154 via read data buses RD0 and ZRD0 to output data latch 158 in second data latch 156 in FIG. 5. In the case of FIG. 7, data to be output first is transmitted from amplifying circuit 154 to output data latch 158 via read data buses RD0 and ZRD0 in accordance with a pulse #N of clock signal CQP prior to an output trigger pulse #Nf in the period from time t7 to t8 of clock signal CLKO.

During the period, the data to be output later in the 2-bits data is once transferred to second data latch 156, and transmitted from second data latch 156 to output data latch 158 via read data buses RD0 and ZRD0 in response to activation of clock signal CQN after time t8.

Clock signals CLKO and ZCLKO determine timings of latching data transmitted via read data buses RD0 and ZRD0 by output data latch 158. To realize 0 ns of access time tAC from the clock edge, it is sufficient to set the timing delayed from the edge of external clock signal EXTCLK only by delay amount Tc at the stage preceding to the output final stage and at the output final stage. Since clock signal CLKQ has to be given prior to the clock only by time Tb necessary for amplifying circuit 154 to amplify data and output the amplified data to data buses RD0 and ZRD0, clock signal CLK_P for determining the timing of generating clock signal CLKQ is, after all, a clock obtained by advancing external clock signal EXTCLK only by backward amount Ta, which is a total of time Tb and Tc. In FIG. 5, since 2-bits data is output to data buses RD0 and ZRD0 every half cycle of the external clock, clock signals CLKO and ZCLKO operate at a frequency which is twice as high as that of external clock signal EXTCLK.

Figure 8:
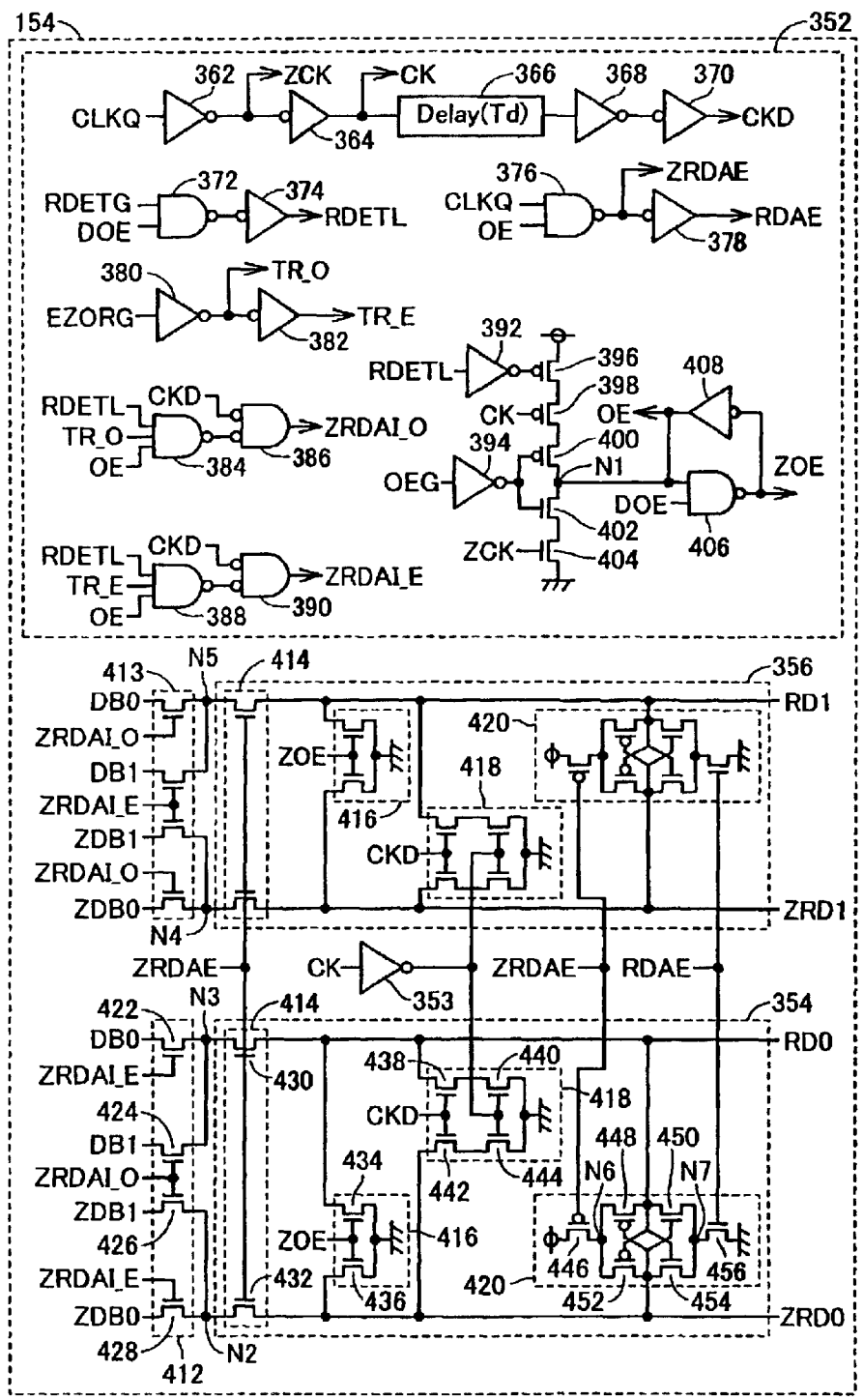
FIG. 8 is a circuit diagram showing the configuration of an amplifying circuit 154 in FIG. 5.

FIG. 8 is a circuit diagram showing the configuration of amplifying circuit 154 in FIG. 5.

Figure 39:
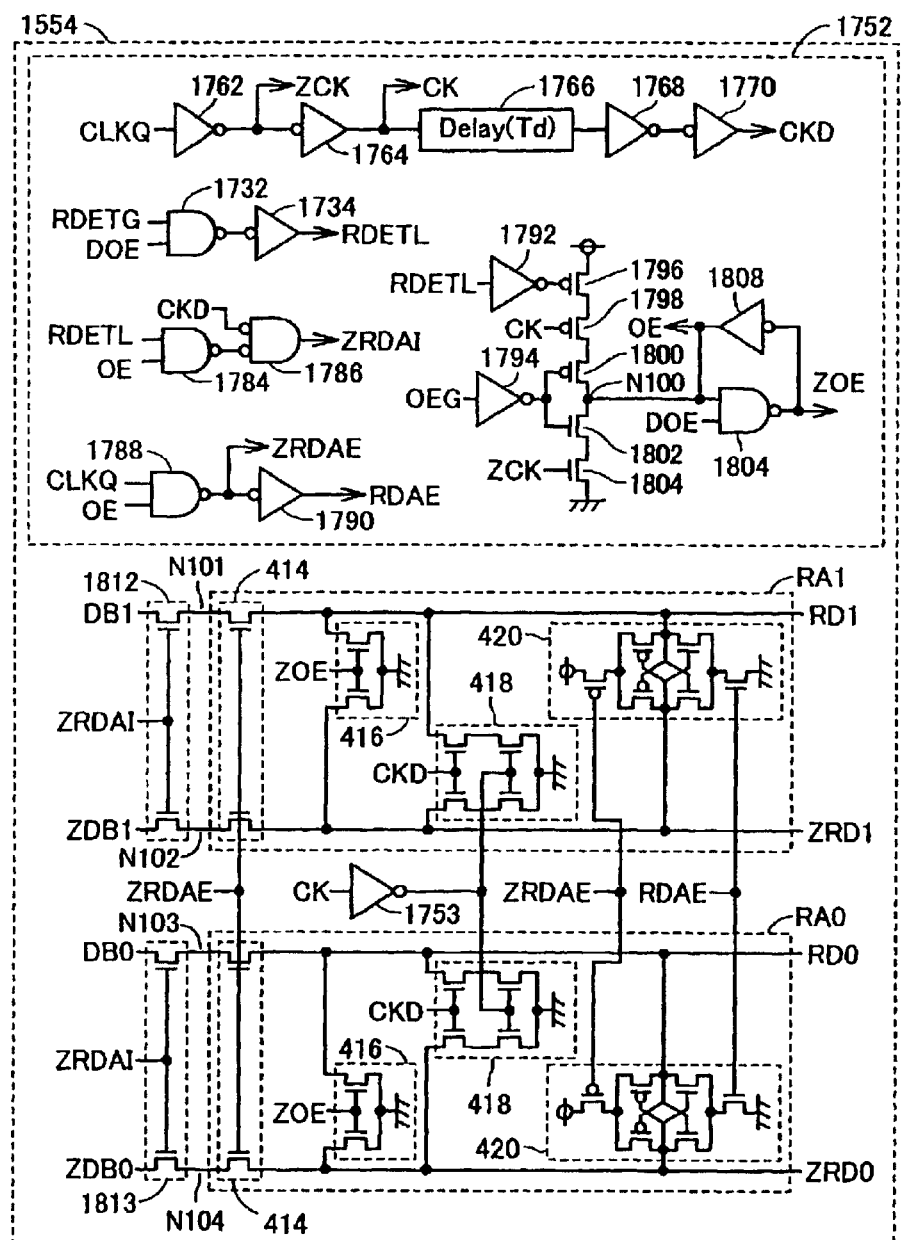
FIG. 39 is a circuit diagram showing the configuration of amplifying circuit 1554 in FIG. 38.
Figure 40:
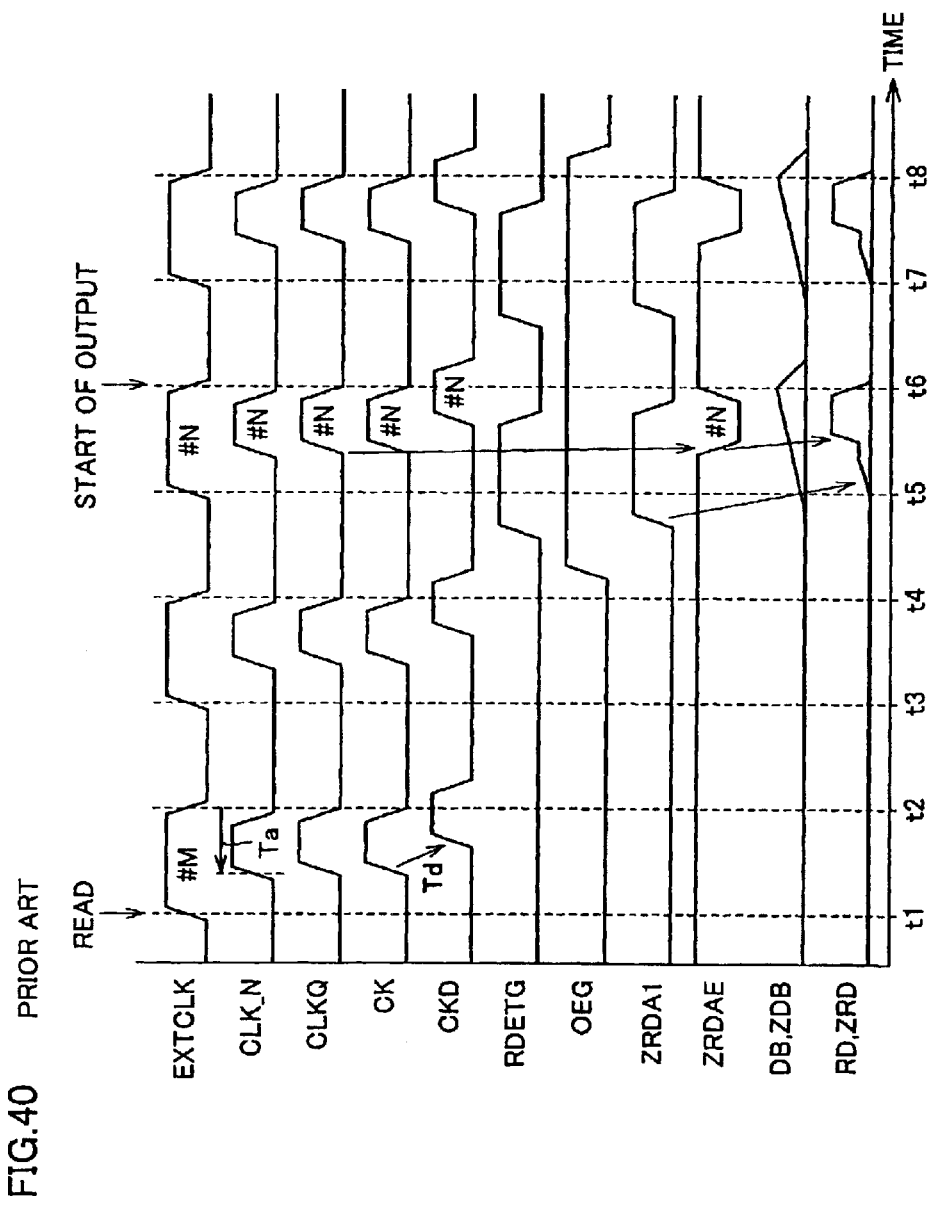
FIG. 40 is an operation waveform chart for explaining the operation of amplifying circuit 1554 shown in FIG. 39.

The configuration of amplifying circuit 154 in FIG. 8 is largely different from that of conventional amplifying circuit 1554 shown in FIG. 39 with respect to the point that selection circuits 412 and 413 each for selecting one of data transmitted via two pairs of data buses are provided at the input portions of amplifying units 356 and 354, respectively.

Referring to FIG. 8, amplifying circuit 154 includes: a signal generating unit 352 for generating a timing signal; selection circuits 412 and 413 for selecting the first and second data; amplifying units 354 and 356 for receiving and amplifying outputs of selection circuits 412 and 413, respectively; and an inverter 353 for receiving and inverting clock signal CK.

Signal generating unit 352 includes: an inverter 362 for receiving and inverting clock signal CLKQ and outputting clock signal ZCK; an inverter 364 for receiving and inverting clock signal ZCK and outputting clock signal CK; a delay circuit 366 for delaying clock signal CK by a delay amount Td; and two inverters 368 and 370 connected in series for receiving and inverting an output of delay circuit 366 and outputting clock signal CKD.

Signal generating unit 352 further includes: an NAND circuit 372 for receiving control signals RDETG and DOE; an inverter 374 for receiving and inverting an output of NAND circuit 372 and outputting signal RDETL; an NAND circuit 376 for receiving clock signal CLKQ and signal OE and outputting signal ZRDAE; and an inverter 378 for receiving and inverting signal ZRDAE and outputting signal RDAE.

Signal generating unit 352 further includes: an inverter 380 for receiving and inverting control signal EZORG and outputting a signal TR_O; an inverter 382 for receiving and inverting signal TR_O and outputting signal TR_E; an NAND circuit 384 of three inputs for receiving signals RDETL, TR_O, and OE; and an NOR circuit 386 for receiving an output of NAND circuit 384 and clock signal CKD and outputting a signal ZRDAI_O.

Signal generating unit 352 further includes: an NAND circuit 388 of three inputs for receiving signals RDETL, TR_E, and OE; and an NOR circuit 390 for receiving an output of NAND circuit 388 and clock signal CKD and outputting a signal ZRDAI_E.

Signal generating unit 352 further includes: an inverter 392 for receiving and inverting signal RDETL; an inverter 394 for receiving and inverting signal OEG; P-channel MOS transistors 396, 398, and 400 connected in series between the power supply node and node N1; and N-channel MOS transistors 402 and 404 connected in series between node N1 and the ground node. P-channel MOS transistors 396, 398, and 400 receive an input of inverter 392, clock signal CK, and an output of inverter 394 by their gates, respectively. N-channel MOS transistors 402 and 404 receive an output of inverter 394 and clock signal ZCK by their gates, respectively.

Signal generating unit 352 further includes: an NAND circuit 406 having an input connected to node N1 and the other input for receiving signal DOE, which outputs signal ZOE; and an inverter 408 for receiving and inverting signal ZOE and outputting signal OE. Signal OE is supplied to node N1.

Selection circuit 412 includes: an N-channel MOS transistor 422, connected between data bus DB0 and node N3, which receives signal ZRDAI_E by its gate; an N-channel MOS transistor 424, connected between data bus DB1 and node N3, which receives signal ZRDAI_O by its gate; an N-channel MOS transistor 426, connected between data bus ZDB1 and node N2, which receives signal ZRDAI_O by its gate; and an N-channel MOS transistor 428, connected between data bus ZDB0 and node N2, which receives signal ZRDAI_E by its gate.

Although selection circuit 413 is different from selection circuit 412 with respect to the point that signals ZRDAI_E and ZRDAI_O are input in an interchanged manner, and an output is connected to nodes N5 and N4 in place of nodes N3 and N2, the internal configuration of selection circuit 413 is similar to that of selection circuit 412, so that its description will not be repeated.

Amplifying unit 354 includes: connection circuit 414 for connecting nodes N2 and N3 to read data buses ZRD0 and RD0, respectively, in accordance with signal ZRDAE; an enable circuit 416 for connecting read data buses RD0 and ZRD0 to the ground node in accordance with signal ZOE; initializing circuit 418 for connecting read data buses RD0 and ZRD0 to the ground node in accordance with clock signal CKD and an output of inverter 353; and sense amplifier 420 for amplifying a potential difference which occurs between read data buses RD0 and ZRD0 in accordance with signals ZRDAE and RDAE.

Connection circuit 414 includes: an N-channel MOS transistor 432, connected between node N2 and read data bus ZRD0, which receives signal ZRDAE; and N-channel MOS transistor 430, connected between node N3 and read data bus RD0, which receives signal ZRDAE by its gate.

Enable circuit 416 includes: an N-channel MOS transistor 434, connected between read data bus RD0 and the ground node, which receives signal ZOE by its gate; and an N-channel MOS transistor 436, connected between read data bus ZRD0 and the ground node, which receives signal ZOE by its gate.

Initializing circuit 418 includes: N-channel MOS transistors 438 and 440, connected in series between read data bus RD0 and the ground node, which receive clock signal CKD and an output of inverter 353 by their gates, respectively; and N-channel MOS transistors 442 and 444, connected in series between read data bus ZRD0 and the ground node, which receive clock signal CKD and an output of inverter 353 by their gates, respectively.

Sense amplifier 420 includes: a P-channel MOS transistor 446, connected between the power supply node and a node N6, which receives signal ZRDAE by its gate; a P-channel MOS transistor 448 connected between node N6 and read data bus RD0 and whose gate is connected to read data bus ZRD0; a P-channel MOS transistor 452 connected between node N6 and read data bus ZRD0 and whose gate is connected to read data bus RD0; an N-channel MOS transistor 450 connected between read data bus RD0 and a node N7 and whose gate is connected to read data bus ZRD0; an N-channel MOS transistor 454 connected between read data bus RD0 and node N7 and whose gate is connected to read data bus RD0; and an N-channel MOS transistor 456 connected between node N7 and the ground node and whose gate receives signal RDAE.

Amplifying unit 356 is different from amplifying unit 354 with respect to the point that amplifying unit 356 is connected to nodes N4 and N5 in place of nodes N2 and N3 and is connected to read data buses ZRD1 and RD1 in place of read data buses ZRD0 and RD0. However, the internal circuit configuration of amplifying unit 356 is similar to that of amplifying unit 354, so that its description will not be repeated.

In the amplifying circuit shown in FIG. 8, signals ZRDAI_O and ZRDAI_E in which control signal EZORG is reflected are used as signals for controlling selection circuits 412 and 413 which connect data bus DB and nodes N2 to N5.

In the case where address bit CA0 is 0, that is, signal EZORG="H", signal ZRDAI_E becomes H level at a proper timing. Accordingly, data buses DB0 and ZDB0 are connected to nodes N3 and N2, respectively, and data buses DB1 and ZDB1 are connected to nodes N5 and N4, respectively. At this time, signal ZRDAI_O is always at L level.

With the configuration shown in FIG. 5, data which is transmitted via data buses DB0 and ZDB0, amplified, output to read data buses RD0 and ZRD0, and transmitted via data buses DB1 and ZDB1 is transmitted to second data latch 156 via read data buses RD1 and ZRD1. After that, second data latch 156 outputs the latched data to read data buses RD0 and ZRD0. Therefore, in the case where address bit CA0 is 0, the data transmitted via data buses DB0 and ZDB0 is output first and, subsequently, the data transmitted via data buses DB1 and ZDB1 is output.

On the other hand, when address bit CA0 is 1, that is, control signal EZORG="L", signal ZRDAI_O changes to H level at a proper timing. Accordingly, data buses DB1 and ZDB1 are connected to nodes N3 and N2, respectively, and data buses DB0 and ZDB0 are connected to nodes N5 and N4, respectively. At this time, signal ZRDAI_E is always set to L level. In this case, the data transmitted via data buses DB1 and ZDB1 is output first and, subsequently, the data transmitted via data buses DB0 and ZDB0 is output.

As described above, with the configuration of amplifying circuit 154 shown in FIG. 8, the operation of amplifying data on the data buses and the parallel-to-serial converting operation are performed at once. Since data to be output first is directly sent from amplifying units 354 and 356 to output data latch 158 in FIG. 5, unlike the conventional technique, there is no delay of two stages of clocked inverters in parallel/serial converting circuit 1556 shown in FIG. 41.

Therefore, data can arrive at the final stage faster than the conventional technique.

As compared with the configuration of the conventional amplifying circuit of FIG. 39, in the configuration shown in FIG. 8, the number of data buses connected to each of amplifying units 354 and 356 is larger, so that parasitic capacitance of nodes N2 to N5 increases. To suppress it as much as possible, it is effective to share an impurity region on the node N2 side of N-channel MOS transistors 428 and 426. It is also effective to set the threshold voltage of N-channel MOS transistors 422 to 428 to be lower than that of an N-channel MOS transistor generally used for a peripheral circuit, so that a signal having a small amplitude from a data bus is easily transmitted.

Figure 9:
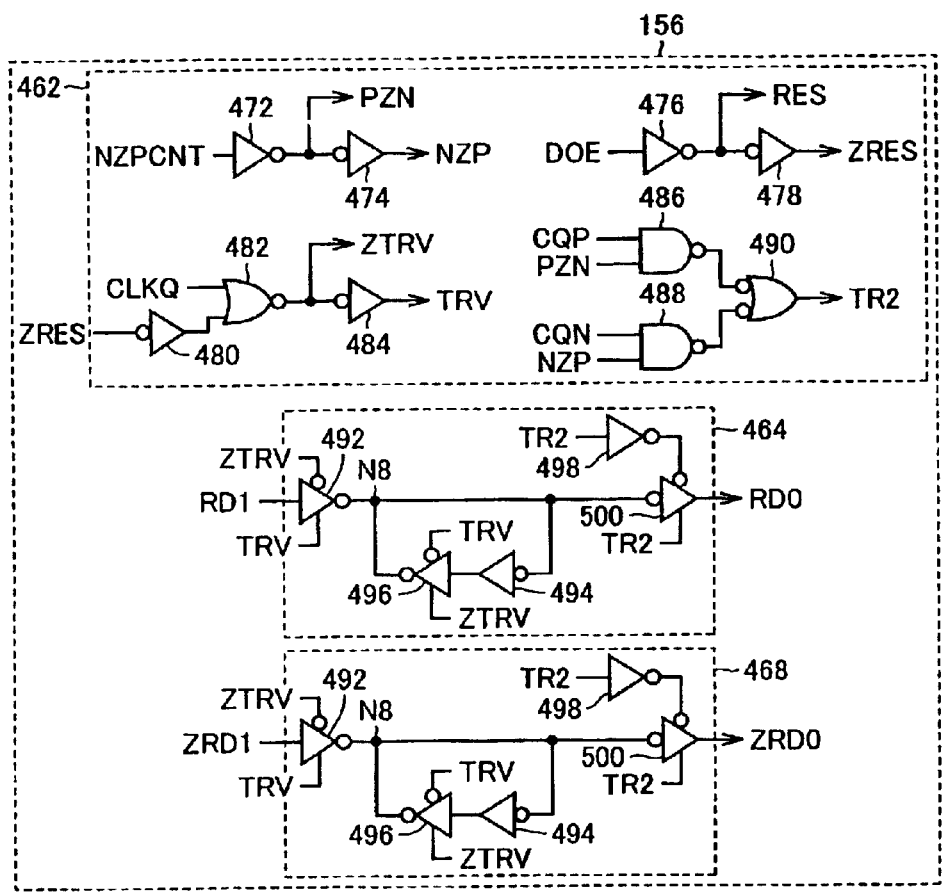
FIG. 9 is a circuit diagram showing the configuration of a second data latch 156 in FIG. 5.

FIG. 9 is a circuit diagram showing the configuration of second data latch 156 in FIG. 5.

Referring to FIG. 9, second data latch 156 includes: a signal generating unit 462 for generating a timing signal for latching data; a data holding circuit 464 for once latching data transmitted via read data bus RD1 and, after that, outputting the data to read data bus RD0; and a data holding circuit 468 for once holding data transmitted via data bus ZRD1 and, after that, outputting the data to read data bus ZRD0.

Signal generating unit 462 includes: an inverter 472 for receiving and inverting control signal NZPCNT and outputting signal PZN; an inverter 474 for receiving and inverting signal PZN and outputting signal NZP; an inverter 476 for receiving and inverting control signal DOE and outputting signal RES; and an inverter 478 for receiving and inverting signal RES and outputting signal ZRES.

Signal generating unit 462 further includes: an inverter 480 for receiving and inverting signal ZRES; an NOR circuit 482 for receiving an output of inverter 480 and clock signal CLKQ and outputting signal ZTRV; and an inverter 484 for receiving and inverting signal ZTRV and outputting signal TRV.

Signal generating unit 462 further includes: an NAND circuit 486 for receiving signals CQP and PZN; an NAND circuit 488 for receiving signals CQN and NZP; and an NAND circuit 490 for receiving outputs of NAND circuits 486 and 488 and outputting signal TR2.

Data holding circuit 464 includes: a clocked inverter 492 which is activated when signal TRV is at H level to receive and invert data transmitted via read data bus RD1 and outputting the resultant to a node N8; an inverter 494 whose input is connected to node N8; and a clocked inverter 496 which is activated when signal ZTRV is at H level to invert an output of inverter 494 and output the resultant to node N6.

Data holding circuit 464 further includes: an inverter 498 for receiving and inverting signal TR2; and a clocked inverter 500 which is activated when signal TR2 is at H level to invert a signal transmitted to node N8 and output the resultant to read data bus RD0.

Data holding circuit 468 is different from data holding circuit 464 with respect to the point that it is connected to read data buses ZRD1 and ZRD0 in place of read data buses RD1 and RD0, but is similar to data holding circuit 464 with respect to the internal circuit configuration. Description of the internal circuit configuration will not be therefore repeated.

Figure 41:
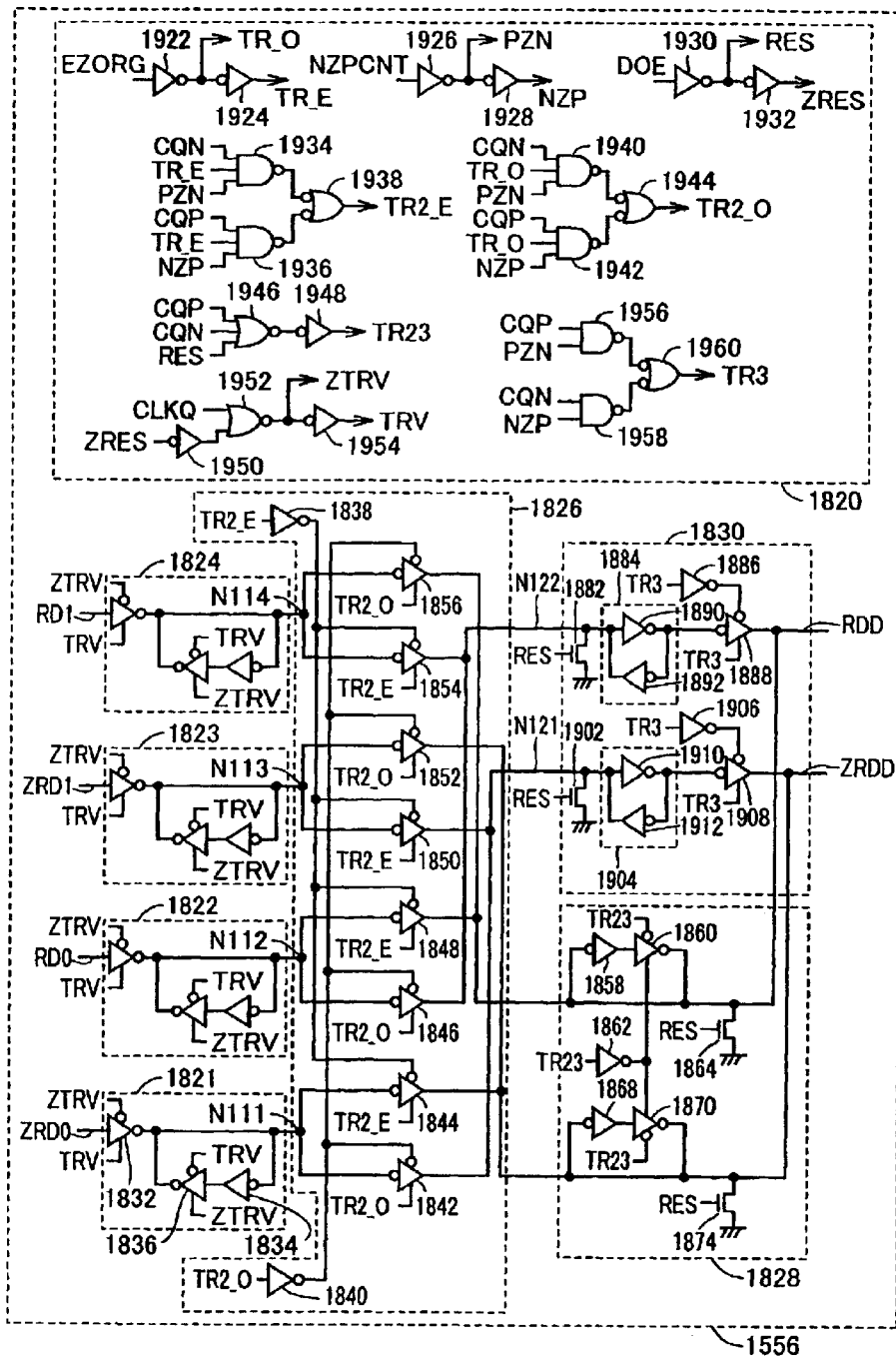
FIG. 41 is a circuit diagram showing the configuration of a parallel/serial converting circuit 1556 in FIG. 38.
Figure 42:
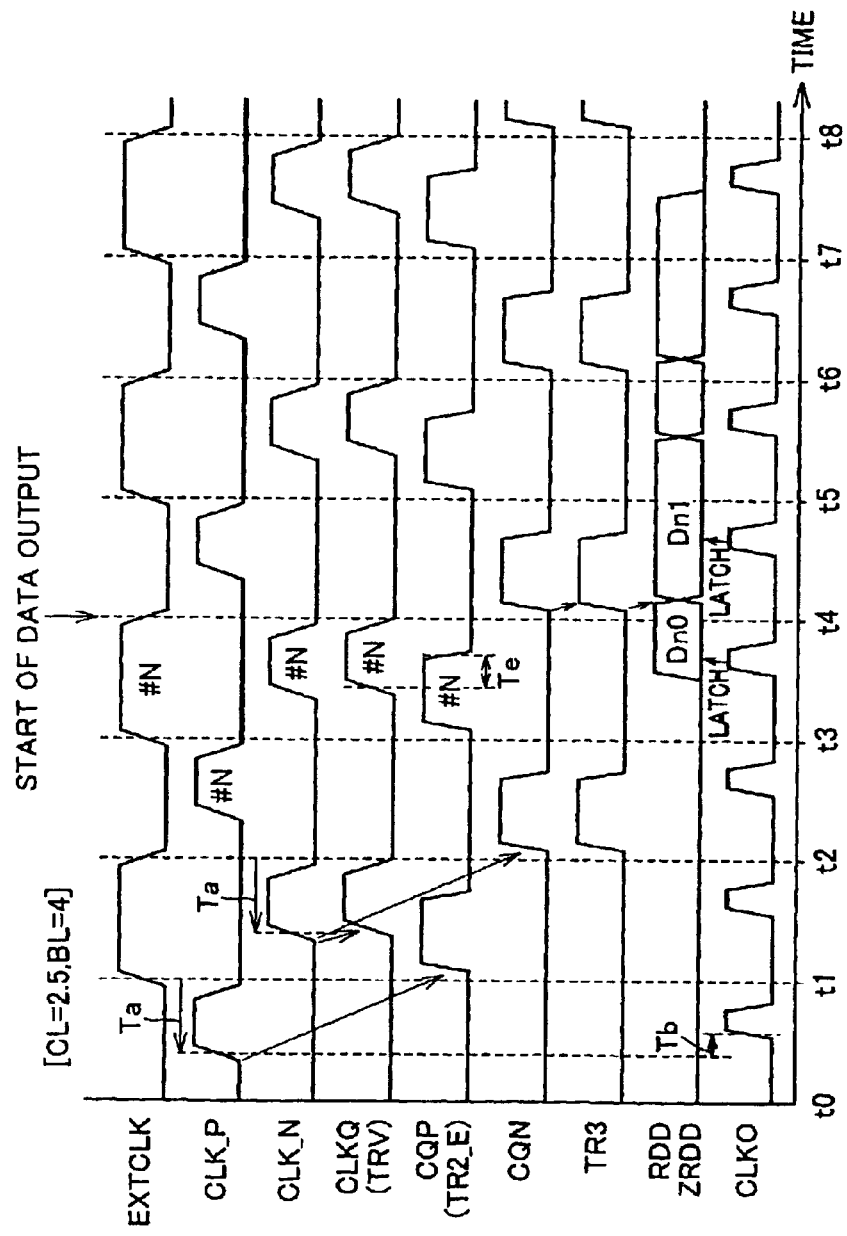
FIG. 42 is an operation waveform chart for explaining operation timings of parallel/serial converting circuit 1556 shown in FIG. 41.

FIG. 41 of the conventional technique includes switching circuit 1826 for executing parallel/serial conversion, data holding circuits 1821 to 1824, and holding circuits 1828 and 1830, so that the circuit scale is very large. In contrast, the circuit shown in FIG. 9 is constructed by the portion for latching and holding data in accordance with signal TRV, and clocked inverter 500 for outputting data toward output data latch 158 via read data buses RD0 and ZRD0 in accordance with signals CQP and CQN, so that the circuit scale is small.

Figure 10:
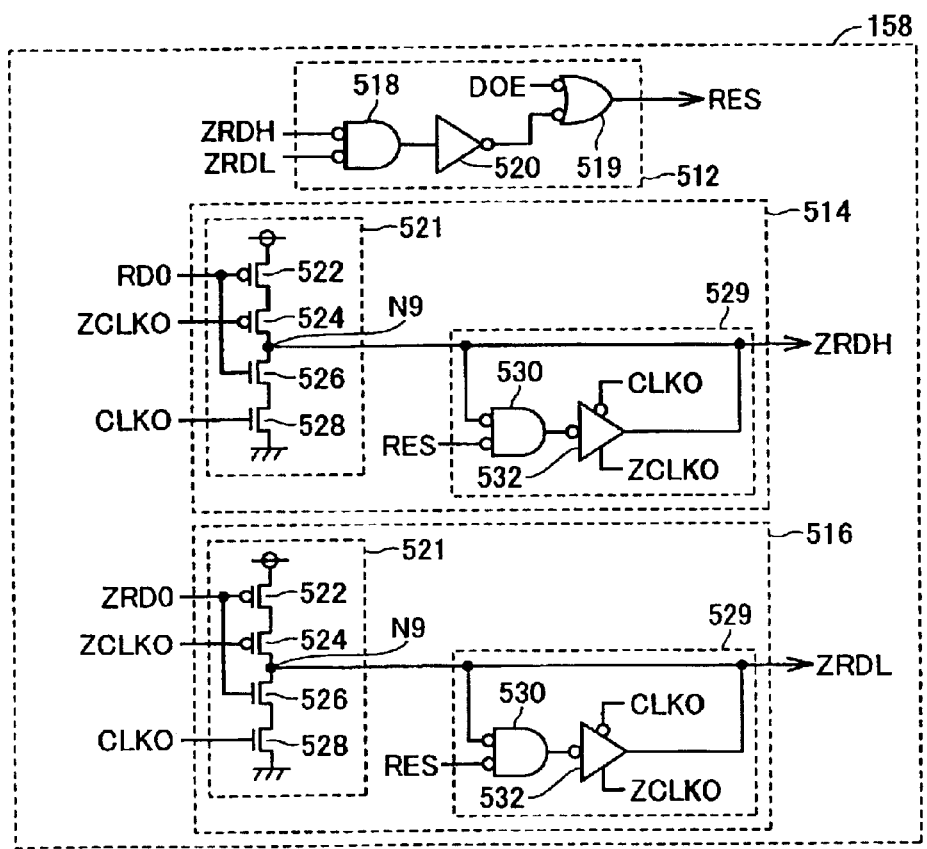
FIG. 10 is a circuit diagram showing the configuration of an output data latch 158 in FIG. 5.

FIG. 10 is a circuit diagram showing the configuration of output data latch 158 in FIG. 5.

Referring to FIG. 10, output data latch 158 includes: a data latch 514 for latching data transmitted via read data bus RD0 synchronously with clock signals CLKO and ZCLKO and outputting signal ZRDH; a data latch 516 for latching data transmitted via read data bus ZRD0 in accordance with clock signals CLKO and ZCLKO and outputting signal ZRDL; and a signal generating unit 512 for outputting signal RES in accordance with signals ZRDH and ZRDL and control signal DOE.

Signal generating unit 512 includes: an NOR circuit 518 for receiving signals ZRDH and ZRDL; an inverter 520 for receiving and inverting an output of NOR circuit 518; and an NAND circuit 519 for receiving an output of inverter 520 and control signal DOE and outputting signal RES.

Data latch 514 includes a clocked inverter 521 and a holding unit 529. Clocked inverter 521 includes: a P-channel MOS transistor 522 having a source connected to a power supply node and a gate connected to read data bus RD0; a P-channel MOS transistor 524, connected between the drain of P-channel MOS transistor 522 and a node N9, which receives clock signal ZCLKO by its gate; an N-channel MOS transistor 528 whose source is connected to the ground node and whose gate receives clock signal CLKO; and an N-channel MOS transistor 526 connected between node N9 and the drain of N-channel MOS transistor 528, and whose gate is connected to read data bus RD0.

Holding unit 529 includes: an NOR circuit 530 having an input connected to node N9 and the other input receiving signal RES; and a clocked inverter 532 which is activated when clock signal ZCLKO is at H level to receive and invert an output of NOR circuit 530 and output the resultant to node N9. From node N9, signal ZRDH is output.

Data latch 516 is different from data latch 514 with respect to the point that read data bus ZRD0 is connected in place of read data bus RD0, and signal ZRDL is output instead of signal ZRDH. Since the internal configuration of data latch 516 is similar to that of data latch 514, its description will not be repeated.

Figure 11:
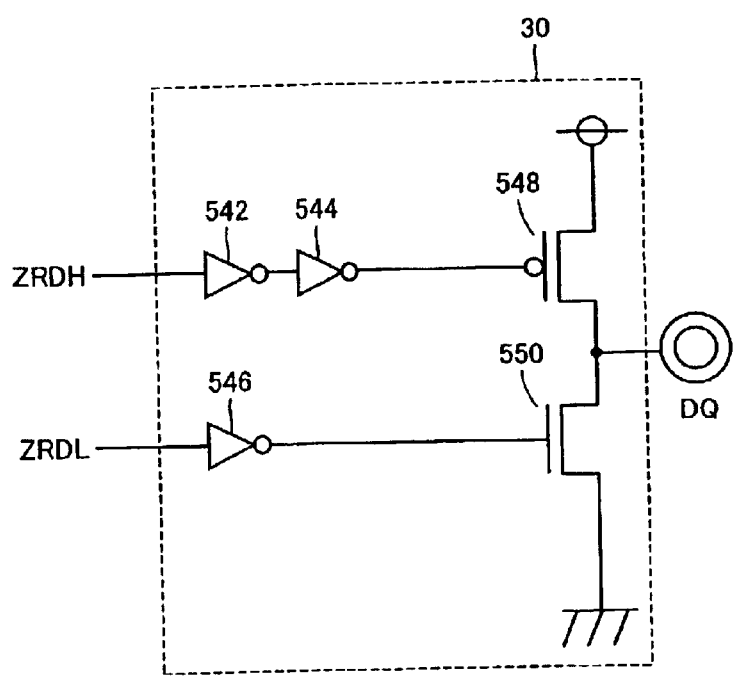
FIG. 11 is a circuit diagram showing the configuration of an output driver 30 in FIG. 5.

FIG. 11 is a circuit diagram showing the configuration of output driver 30 in FIG. 5.

Referring to FIG. 11, output driver 30 includes: an inverter 542 for receiving and inverting signal ZRDH; an inverter 544 for receiving and inverting an output of inverter 542; and a P-channel MOS transistor 548 connected between the power supply node and a terminal for outputting signal DQ and having a gate receiving an output of inverter 544.

Output driver 30 further includes: an inverter 546 for receiving and inverting signal ZRDL; and an N-channel MOS transistor 550 connected between a terminal for outputting signal DQ and the ground node and having a gate receiving an output of inverter 546.

Figure 12:
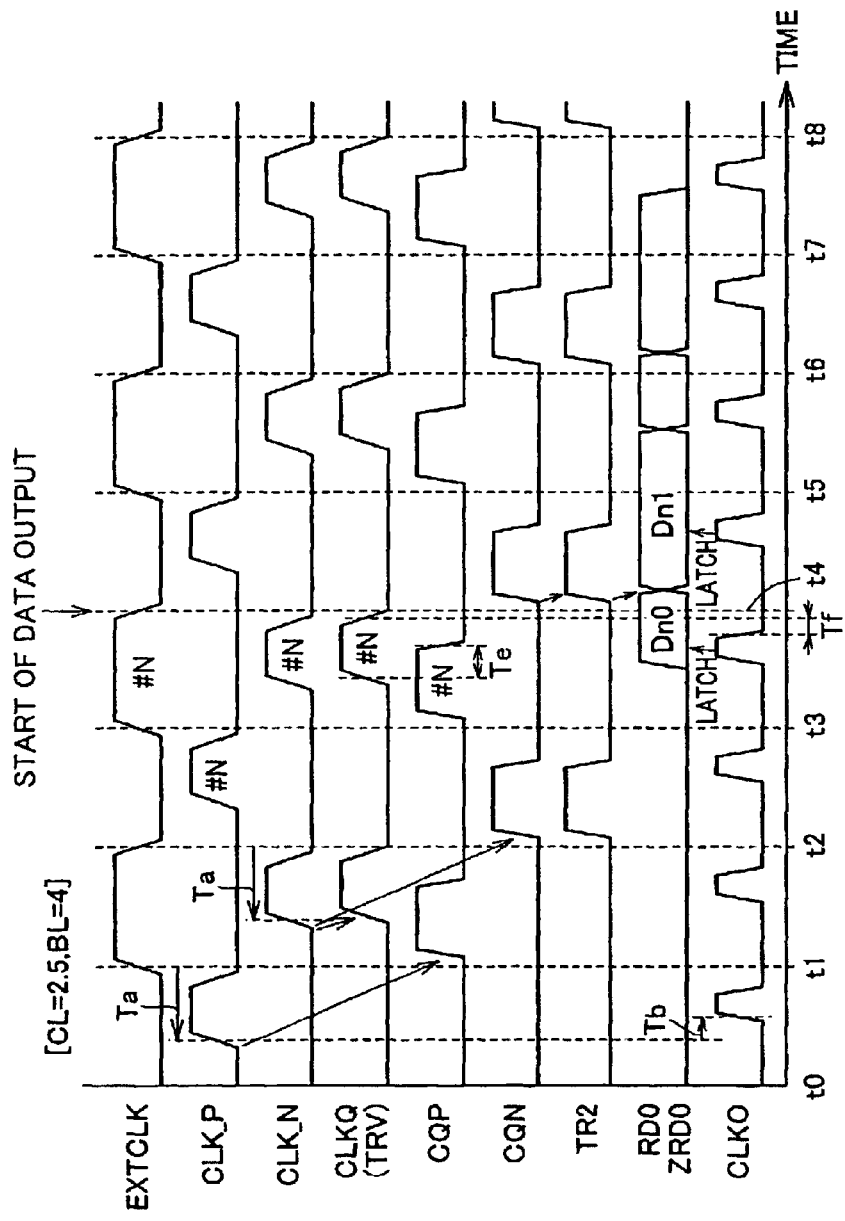
FIG. 12 is an operation waveform chart for explaining general operation of data output circuit 150 shown in FIG. 5.

FIG. 12 is an operation waveform chart for explaining general operation of data output circuit 150 illustrated in FIG. 5.

FIGS. 5 and 12 show the operation in the case where CAS latency is 2.5 and burst length BL is 4. Clock signals CLK_P and CLK_N are generated by DLL circuit 100 by being advanced from the edges of external clock signal EXTCLK by backward amount Ta.

After time Tb from the rising edge of clock signal CLK_P and after time Tb from the rising edge of clock signal CLK_N, clock signal CLKO is activated. The frequency of clock signal CLKO is a frequency twice as high as that of external clock signal EXTCLK.

Clock signal CLKQ is generated on the basis of either clock signal CLK_P or CLK_N. In the case where CAS latency CL is 2.5, clock signal CLKQ is generated on the basis of clock signal CLK_N.

Clock signals CLK_P and CLK_N are delayed by clock generating circuit 152, thereby generating clock signals CQP and CQN, respectively.

When clock signal CLKQ is activated in the period from time t3 to t4, amplifying circuit 154 amplifies data of read data buses RD0 and ZRD0 by sense amplifier 420 shown in FIG. 8, and data Dn0 is output onto read data buses RD0 and ZRD0. The data is latched by output data latch 158 while clock signal CLKO is active.

What is important here is the relation between data sent first to output data latch 158 and clock signal CLKO. In the case of the first embodiment, the data to be output first is directly sent from amplifying circuit 154 to output data latch 158, so that output data latch 158 has to finish latching the data during the active period of amplifying circuit 154 indicated by the "H" period of clock signal CLKQ. Consequently, the falling edge of clock signal CLKQ has to be after the falling edge of clock signal CLKO, which is a timing of completion of latching data. Therefore, the timing is adjusted by clock generating circuit 152 in FIG. 6 so as to guarantee period Tf>0 in FIG. 12.

Subsequently, in the period from time t4 to t5, data Dn1 held in second data latch 156 is output to read data buses RD0 and ZRD0 and latched by output data latch 158 in response to activation of clock signal CLKO.

In such a manner, data is output from output driver 30 at a data rate twice as high as the frequency of internal clock signal EXTCLK.

As described above, the parallel-to-serial conversion of 2-bits prefetched output data is executed while reflecting information of address bit CA0 of a column address when a data bus is connected to an amplifying unit in the data output circuit. With such a configuration, the number of clocked inverter stages in the data transmission path in the data output circuit can be reduced, and reduction in actual value Tcac of time of the period from command READ is received until the first data is output from the terminal can be realized. Since the circuit scale related to parallel/serial conversion can be largely reduced, the layout area of the output circuit band can be reduced.

(Second Embodiment)

In the first embodiment, the prefetched 2-bits data is finally transmitted to output data latch 158 via read data buses RD0 and ZRD0. For example, data which is once latched by second data latch 156 in FIG. 5 and is output second is output to read data buses RD0 and ZRD0 by using clock signal CQN as a trigger as shown in FIG. 12. In this case, the rising edge of clock signal CQN has to be behind the falling edge of clock signal CLKO for latching the first data. The timing is fixed irrespective of the operation frequency, and clock generating circuit 152 shown in FIG. 6 guarantees such timings.

However, when the operation frequency increases, the period in which clock signals CQN and CQP are activated to H level becomes shorter to maintain the regulation of the timing. There is consequently the possibility that read data buses RD0 and ZRD0 cannot be driven to a sufficient amplitude in accordance with data held in second data latch 156.

Output data latch 158 shown in FIG. 10 sequentially latches 2-bits data per cycle of external clock signal EXT-CLK at the time of outputting data. Consequently, clock signal CLKO for latching data is generated once every half cycle of the external clock signal. Therefore, clock generating circuit 152 operates at a frequency twice as high as that of internal clock signal EXTCLK and is one of parts which operate at the highest speed in the chip.

In such a high-speed operating part, there is the possibility that increase in the threshold voltage of a transistor or decrease in driving current occurs due to an influence of hot carriers generated in a transition period of switching. It is feared that the influences of them cause deterioration in circuit operation. To assure the operation margin is the most difficult part and can be disturbance of high-frequency operation.

In the second embodiment, the configuration capable of solving such problems will be described.

Figure 13:
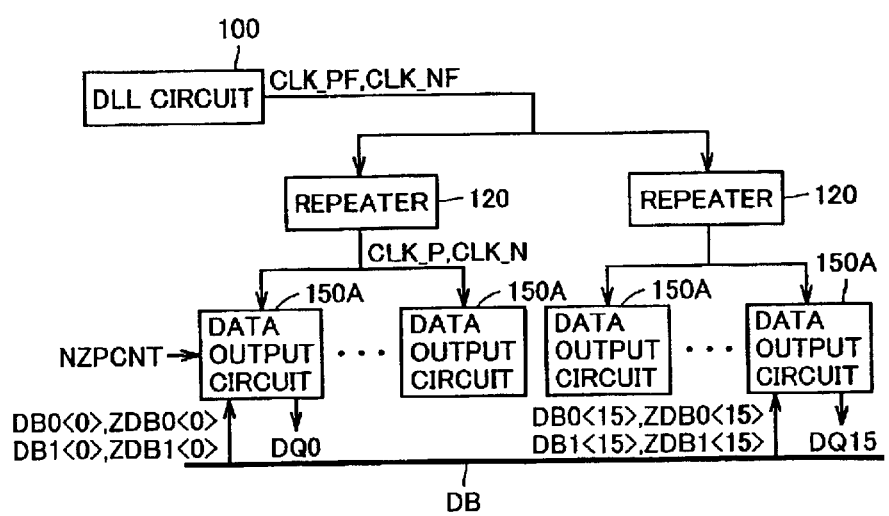
FIG. 13 is a diagram for explaining the configuration regarding data output of a semiconductor memory device of a second embodiment.

FIG. 13 is a diagram for explaining the configuration related to data output of a semiconductor memory device of the second embodiment.

Referring to FIG. 13, the semiconductor memory device of the second embodiment includes, in place of data output circuit 150 in the configuration described by referring to FIG. 2, data output circuit 150A. DLL circuit 100 and repeater 120 have configurations similar to those described in the first embodiment, so that their description will not be repeated.

Figure 14:
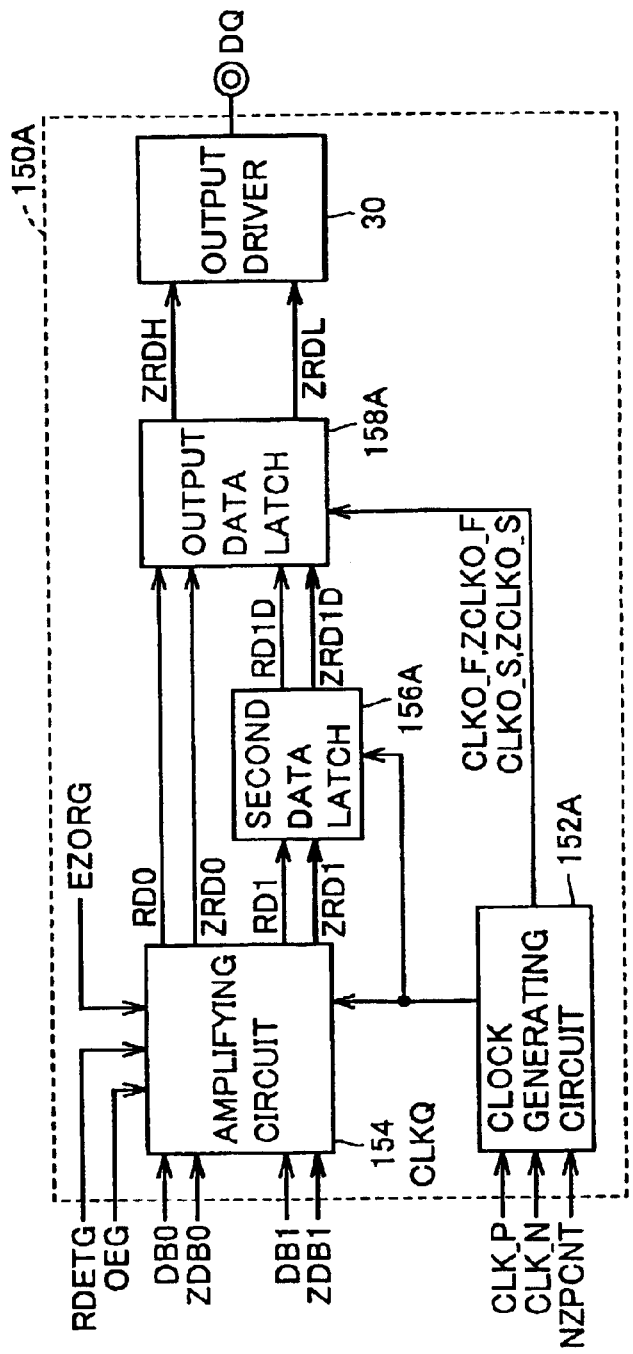
FIG. 14 is a block diagram showing the configuration of a data output circuit 150A in FIG. 13.

FIG. 14 is a block diagram showing the configuration of data output circuit 150A in FIG. 13.

Referring to FIG. 14, data output circuit 150A includes, in the configuration of data output circuit 150 described by referring to FIG. 5, a clock generating circuit 152A in place of clock generating circuit 152, a second data latch 156A in place of second data latch 156, and an output data latch 158A in place of output data latch 158. Amplifying circuit 154 and output driver 30 are similar to those in the first embodiment and their description will not be repeated.

In the configuration shown in FIG. 14, prefetched 2-bits data is independently sent to output data latch 158A. Specifically, data to be output first is transmitted to output data latch 158A via read data buses RD0 and ZRD0. Data to be output second is transmitted to second data latch 156A via read data buses RD1 and ZRD1 and, after that, transmitted to output data latch 158A via read data buses RD1D and ZRD1D.

As will be described later, output data latch 158A has therein a plurality of clocked inverters as pass gates for latching data from a corresponding read data bus. Clock generating circuit 152A generates two kinds of clock signals CLKO_F and CLKO_S for use in the clocked inverters of output data latch 158A.

Figure 15:
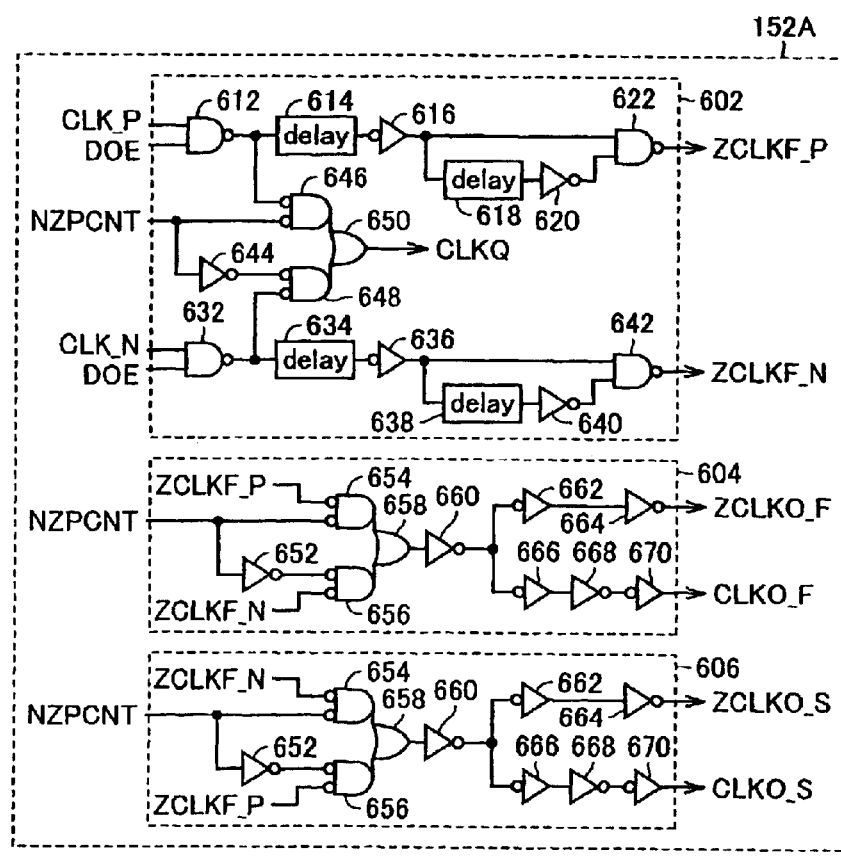
FIG. 15 is a circuit diagram showing the configuration of a clock generating circuit 152A in FIG. 14.

FIG. 15 is a circuit diagram showing the configuration of clock generating circuit 152A in FIG. 14.

Referring to FIG. 15, clock generating circuit 152A includes: a signal generating unit 602 for outputting clock signals CLKQ, ZCLKF_P, and ZCLKF_N in accordance with clock signals CLK_P and CLK_N and control signals DOE and NZPCNT; a signal generating unit 604 for receiving clock signals ZCLKF_P and ZCLKF_N from signal generating unit 602 and generating clock signals ZCLKO_F and CLKO_F in accordance with control signal NZPCNT; and a signal generating unit 606 for receiving clock signals ZCLKF_N and ZCLKF_P and generating clock signals ZCLKO_S and CLKO_S in accordance with control signal NZPCNT.

Signal generating unit 602 includes: an NAND circuit 612 for receiving clock signal CLK_P and control signal DOE; a delay circuit 614 for delaying an output of NAND circuit 612; an inverter 616 for receiving and inverting an output of delay circuit 614; a delay circuit 618 for delaying an output of inverter 616; an inverter 620 for receiving and inverting an output of delay circuit 618; and an NAND circuit 622 for receiving outputs of inverters 616 and 620 and outputting clock signal ZCLKF_P.

Signal generating unit 602 further includes: an NAND circuit 632 for receiving clock signal CLK_N and control signal DOE; a delay circuit 634 for delaying an output of NAND circuit 632; an inverter 636 for receiving and inverting an output of delay circuit 634; a delay circuit 638 for delaying an output of inverter 636; an inverter 640 for receiving and inverting an output of delay circuit 638; and an NAND circuit 642 for receiving outputs of inverters 636 and 640 and outputting clock signal ZCLKF_N.

Signal generating unit 602 further includes: an inverter 644 for receiving and inverting control signal NZPCNT; an NOR circuit 646 for receiving an output of NAND circuit 612 and control signal NZPCNT; an NOR circuit 648 for receiving an output of inverter 644 and an output of NAND circuit 632; and an OR circuit 650 for receiving outputs of NOR circuits 646 and 648 and outputting clock signal CLKQ.

Signal generating unit 604 includes: an inverter 652 for receiving and inverting control signal NZPCNT; an NOR circuit 654 for receiving clock signal ZCLKF_P and control signal NZPCNT; an NOR circuit 656 for receiving an output of inverter 652 and clock signal ZCLKF_N; an OR circuit 658 for receiving outputs of NOR circuits 654 and 656; and an inverter 660 for receiving and inverting an output of OR circuit 658.

Signal generating unit 604 further includes: inverters 662 and 664 of two stages connected in series for receiving an output of inverter 660 and outputting clock signal ZCLKO_F; and inverters 666, 668, and 670 of three stages connected in series for receiving an output of inverter 660 and outputting clock signal CLKO_F.

Signal generating unit 606 is different from signal generating unit 604 with respect to the point that clock signals ZCLKF_P and ZCLKF_N are input in an interchanged manner, and clock signals ZCLKO_S and CLKO_S are output in place of clock signals ZCLKO_F and CLKO_F. The internal circuit configuration of signal generating unit 606 is similar to that of signal generating unit 604, so that its description will not be repeated.

Clock signals CLKO_F and ZCLKO_F determine timings of data to be output as signals ZRDH and ZRDL latched first by output data latch 158A in FIG. 14 in prefetched 2-bits data in clock signals output from clock generating circuit 152A. Clock signals CLKO_S and ZCLKO_S determine timings of data to be latched second by output data latch 158A and output as signals ZRDH and ZRDL.

Figure 16:
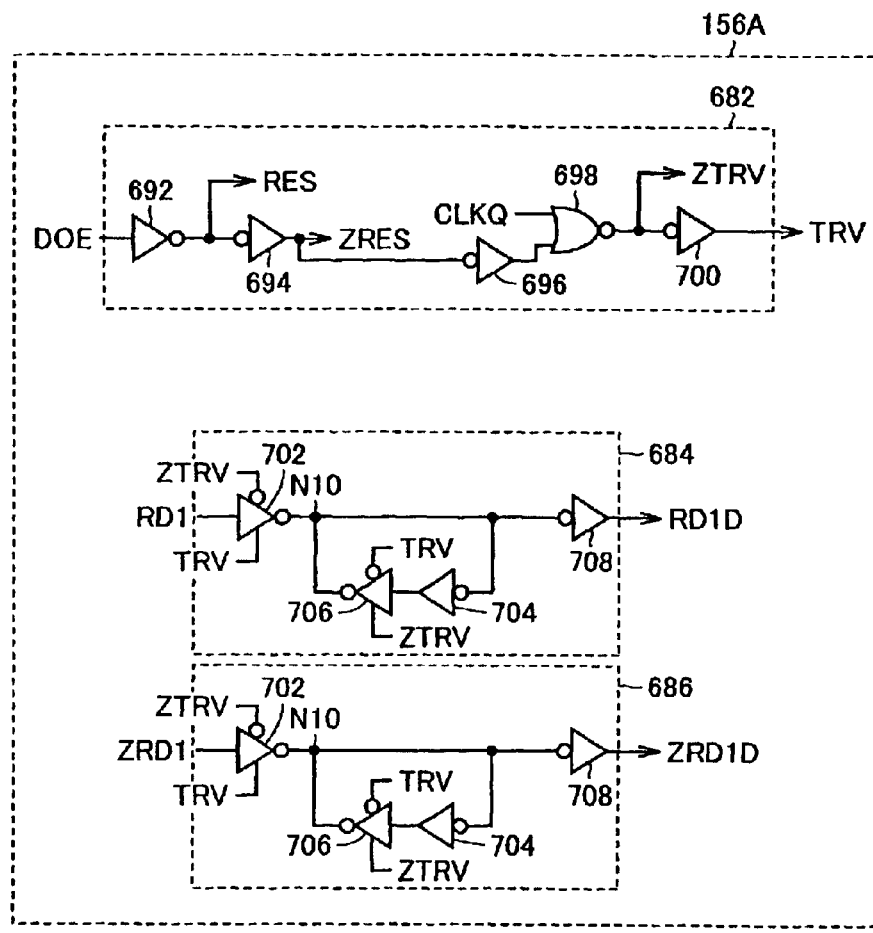
FIG. 16 is a circuit diagram showing the configuration of a second data latch 156A in FIG. 14.

FIG. 16 is a circuit diagram showing the configuration of second data latch 156A in FIG. 14.

Referring to FIG. 16, second data latch 156A includes: a signal generating unit 682 for outputting signals TRV and ZTRV for latching data in accordance with clock signal CLKQ and control signal DOE; a data holding circuit 684 for latching a data signal transmitted via read data bus RD1 in accordance with an output of signal generating unit 682; and a data holding circuit 686 for latching a data signal transmitted via read data bus ZRD1 in accordance with an output of signal generating unit 682.

Signal generating unit 682 includes: an inverter 692 for receiving and inverting control signal DOE and outputting signal RES; an inverter 694 for receiving and inverting signal RES and outputting signal ZRES; an inverter 696 for receiving and inverting signal ZRES; an NOR circuit 698 for receiving an output of inverter 696 and clock signal CLKQ and outputting signal ZTRV; and an inverter 700 for receiving and inverting signal ZTRV and outputting signal TRV.

Data holding circuit 684 includes: a clocked inverter 702 whose input is connected to read data bus RD1, whose output is connected to a node N10 and which is activated when signal TRV is at H level; an inverter 704 whose input is connected to node N10; a clocked inverter 706 which is activated when signal ZTRV is at H level to receive and invert an output of inverter 704 and output the resultant to node N10; and an inverter 708 whose input is connected to node N10 and whose output is connected to a read data bus RD1D.

Data holding circuit 686 is different from data holding circuit 684 with respect to the point that, in the configuration of data holding circuit 684, read data bus ZRD1 is connected in place of read data bus RD1 and a read data bus ZRD1D is connected in place of read data bus RD1D. However, data holding circuit 686 has an internal circuit configuration similar to that of data holding circuit 684, so that its description will not be repeated.

Different from the case of the first embodiment, the prefetched data is independently sent to output data latch 158A in FIG. 14. Consequently, second data latch 156A can have a circuit simpler than that of second data latch 156 in the first embodiment described by referring to FIG. 9, since it is sufficient for second data latch 156A to simply receive and hold data which is output second.

Figure 17:
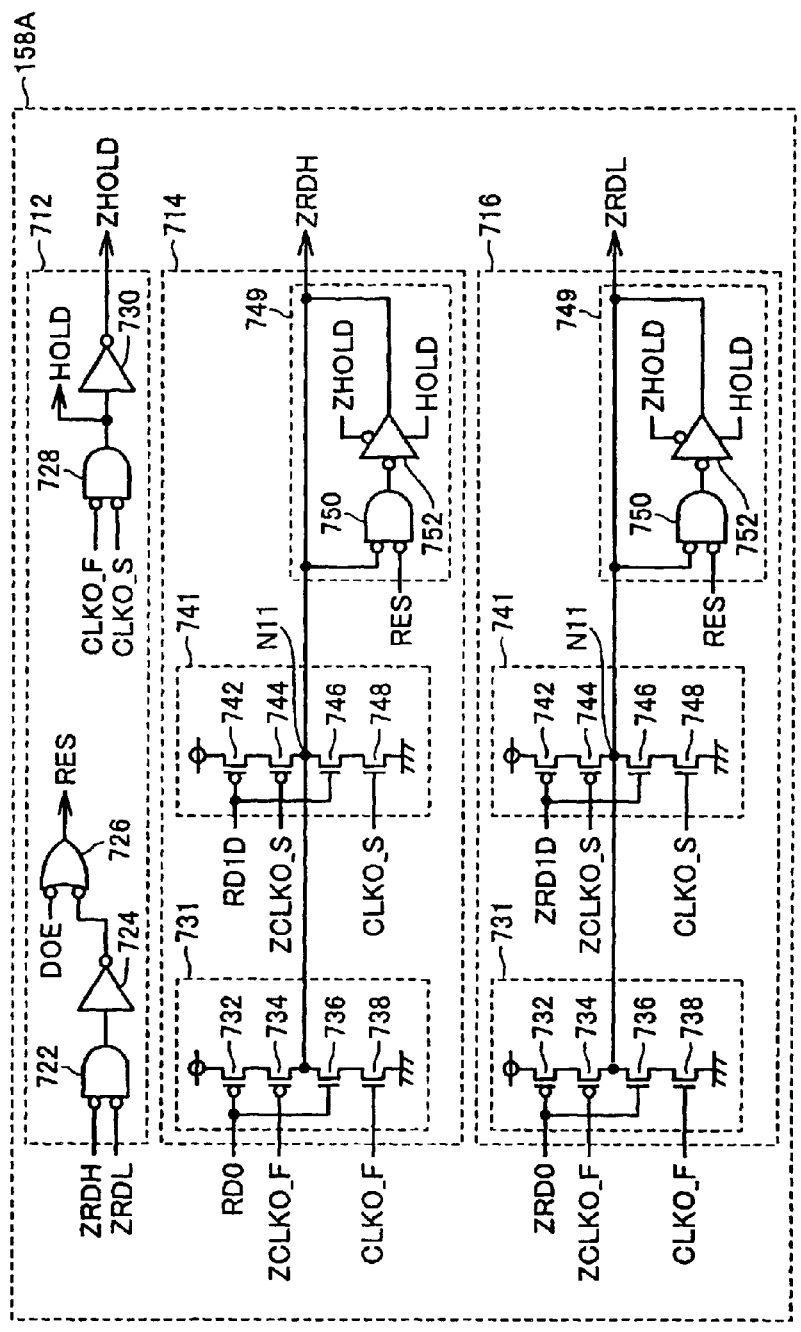
FIG. 17 is a circuit diagram showing the configuration of an output data latch 158A in FIG. 14.

FIG. 17 is a circuit diagram showing the configuration of output data latch 158A in FIG. 14.

Referring to FIG. 17, output data latch 158A includes: a signal generating unit 712 for generating signals HOLD and ZHOLD; a data holding circuit 714 for latching data transmitted via read data buses RD0 and RD1D and outputting signal ZRDH; and a data holding circuit 716 for latching data transmitted via read data buses ZRD0 and ZRD1D and outputting signal ZRDL.

Signal generating unit 712 includes: an NOR circuit 722 for receiving signals ZRDH and ZRDL; an inverter 724 for receiving and inverting an output of NOR circuit 722; and an NAND circuit 726 for receiving control signal DOE and an output of inverter 724 and outputting signal RES.

Signal generating unit 712 further includes: an NOR circuit 728 for receiving clock signals CLKO_F and CLKO_S and outputting signal HOLD; and an inverter 730 for receiving and inverting signal HOLD and outputting signal ZHOLD.

Data holding circuit 714 includes: clocked inverters 731 and 741 working as a pass gate circuit for latching data from a corresponding read data bus; and a data holding unit 749 for holding the latched data.

Clocked inverter 731 includes: a P-channel MOS transistor 732 whose source is connected to the power supply node and whose gate is connected to read data bus RD0; a P-channel MOS transistor 734, connected between the drain of P-channel MOS transistor 732 and a node N11, which receives clock signal ZCLKO_F by its gate; an N-channel MOS transistor 738 whose source is connected to the ground node and whose gate receives clock signal CLKO_F; and an N-channel MOS transistor 736 connected between node N11 and the drain of N-channel MOS transistor 738 and whose gate is connected to read data bus RD0.

Clocked inverter 741 includes: a P-channel MOS transistor 742 whose source is connected to the power supply node and whose gate is connected to read data bus RD1D; a P-channel MOS transistor 744 connected between the drain of P-channel MOS transistor 742 and node N11 and whose gate receives clock signal ZCLKO_S; an N-channel MOS transistor 748 whose source is connected to the ground node and whose gate receives clock signal CLKO_S; and an N-channel MOS transistor 746 connected between node N11 and the drain of N-channel MOS transistor 748 and whose gate is connected to read data bus RD1D.

Data holding unit 749 includes: an NOR circuit 750 whose input is connected to node N11 and whose other input receives signal RES; and a clocked inverter 752 which is activated when signal HOLD is at H level to receive and invert an output of NOR circuit 750 and output the resultant to node N11. Signal ZRDH is output from node N11.

Data holding circuit 716 is different from data holding circuit 714 with respect to the point that read data buses ZRD0 and ZRD1D are connected in place of read data buses RD0 and RD1D and signal ZRDL is output in place of signal ZRDH. However, data holding circuit 716 has an internal circuit configuration similar to that of data holding circuit 714, so that description of the internal circuit configuration will not be repeated.

Specifically, different from the first embodiment, prefetched data is independently sent to output data latch 158A, so that clocked inverters 731 and 741 for separately receiving 2-bits data independently sent are disposed. Clocked inverter 731 latches data synchronously with clock signals CLKO_F and ZCLKO_F. Clocked inverter 741 latches data synchronously with clock signals CLKO_S and ZCLKO_S.

Figure 18:
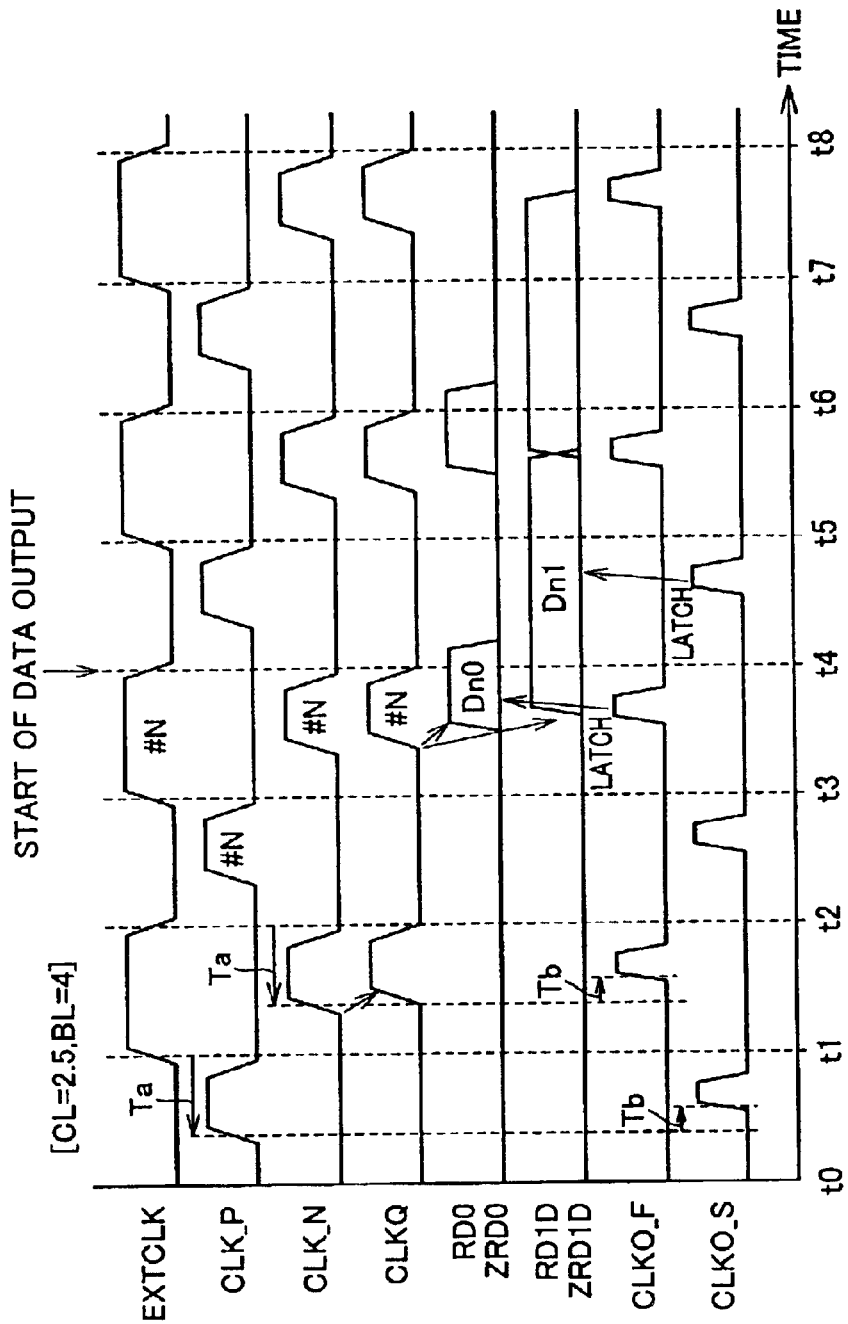
FIG. 18 is an operation waveform chart for explaining the operation of the semiconductor memory device in the second embodiment.

FIG. 18 is an operation waveform chart for explaining the operation of the semiconductor memory device according to the second embodiment.

Referring to FIGS. 14 and 18, description will be given on assumption of the case where CAS latency CL=2.5 and burst length BL=4.

As shown in the period from time t0 to t1, when CAS latency is 2.5, clock signal CLKO_S corresponding to the rising edge of external clock signal EXTCLK is generated. As shown in the period from time t1 to time t2, clock signal CLKO_F corresponding to the falling edge of external clock signal EXTCLK is generated.

As shown in the period from time t3 to t4, data amplified by amplifying circuit 154 of FIG. 14 is ordered, and data Dn0 to be output first is directly output to data buses RD0 and ZRD0 and sent to output data latch 158A.

Synchronously with clock signals CLKO_F and ZCLKO_F, data is latched by output data latch 158A and sent to output driver 30. At this time, in a manner similar to the first embodiment, output data latch 158A has to latch data within the active period of amplifying circuit 154. Therefore, the falling edge of clock signal CLKO_F has to come earlier than the falling edge of clock signal CLKQ.

On the other hand, data Dn1 which is output second is latched by second data latch 156A in the period from time t3 to t4, and transmitted to output data latch 158A via read data buses RD1D and ZRD1D. Different from the first embodiment, data Dn1 arrives at output data latch 158A after delay time corresponding to a proper stage number of gates from the rising edge of clock signal CLKQ. According to the activation of clock signal CLKO_S in the period from time t4 to t5, data is latched by output data latch 158A, and transmitted to output driver 30.

As described above, in the second embodiment, parallel/serial conversion of prefetched 2-bits output data is executed while reflecting information of address bit CA0 at the time of transmitting data from the data bus to the amplifying unit of the data output circuit, and the ordered and amplified data is independently sent to output data latch 158A. Therefore, advantages similar to those in the first embodiment can be enjoyed, an operation margin at high frequencies can be increased, and a circuit for determining data output timings operates at the operation frequency of external clock signal EXTCLK or lower, so that the reliability regarding hot carriers can be further increased.

(Third Embodiment)

In the configuration of output data latch 158A shown in FIG. 17 used in the second embodiment, N-channel MOS transistors 746 and 748 are connected in series. Read data bus RD1D is connected to the gate of transistor 746, and clock signal CLKO_S is received by the gate of transistor 748. When the reliability regarding hot carriers of the N-channel MOS transistor is considered, connection such that transistor 746 is made conductive first and transistor 748 is made conductive next is preferable. The configuration is a so-called NOEMI (Normally-On Enhancement MOSFET Insertion) configuration.

In the configuration shown in FIG. 17, however, when clock signal CLKO_F rises from L level to H level and data transmitted via read data bus RD0 is transmitted to node N11, depending of the level (L or H) of read data bus RD1D, parasitic capacitance of node N11 varies. The capacity of transistor 748 such as the capacity between the gate and drain becomes a part of parasitic capacitance of node N11 in some cases. When the ratio of the capacity of transistor 748 to all the parasitic capacitance of node N11 is high, there is the possibility that an influence is clearly exerted on data propagation time.

A timing deviation which occurs due to variations of propagation delay time of clocks, interconnection capacity, or the like in a synchronous designing is called a clock skew. When the parasitic capacitance of node N11 has dependency on data, a skew such that timings of outputting data to the outside vary among output terminals occurs. The skew is a very big problem particularly at the time of high-frequency operation.

In the third embodiment, to solve such a problem, a second data latch obtained by devising second data latch 156A in the second embodiment is used.

Figure 19:
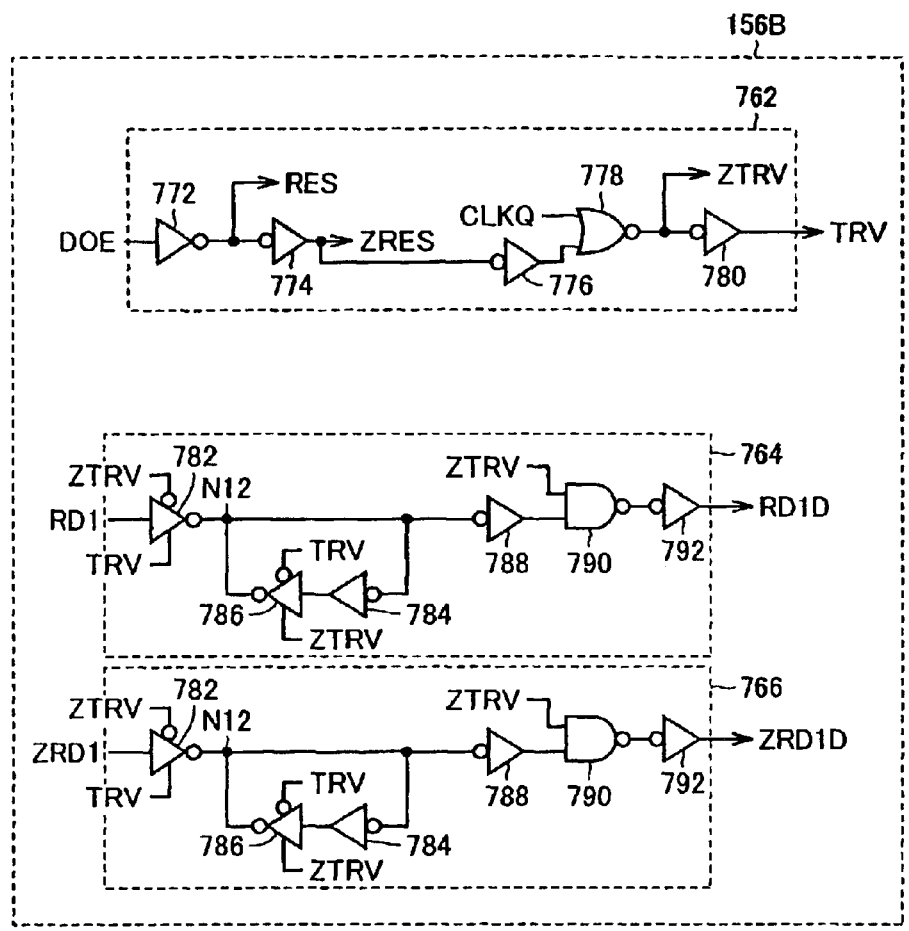
FIG. 19 is a circuit diagram showing the configuration of a second data latch 156B used in a third embodiment.

FIG. 19 is a circuit diagram showing the configuration of second data latch 156B used in the third embodiment.

Referring to FIG. 19, second data latch 156B includes a signal generating unit 762 and data holding circuits 764 and 766.

Signal generating unit 762 includes: an inverter 772 for receiving and outputting control signal DOE and outputting signal RES; an inverter 774 for receiving and inverting signal RES and outputting signal ZRES; an inverter 776 for receiving and inverting signal ZRES; an NOR circuit 778 for receiving an output of inverter 776 and clock signal CLKQ and outputting signal ZTRV; and an inverter 780 for receiving and inverting signal ZTRV and outputting signal TRV.

Data holding circuit 764 includes: a clocked inverter 782 whose input is connected to read data bus RD 1, whose output is connected to a node N12, and which is activated when signal TRV is at H level; inverters 784 and 788 whose inputs are connected to node N12; a clocked inverter 786 which is activated when signal ZTRV is at H level to receive and invert an output of inverter 784 and output the resultant to node N12; an NAND circuit 790 for receiving signal ZTRV and an output of inverter 788; and an inverter 792 for receiving and inverting an output of NAND circuit 790 and outputting signal to read data bus RD1D.

Data holding circuit 766 is different from data holding circuit 764 with respect to the point that read data bus ZRD1 is connected in place of read data bus RD1 and data is output to read data bus ZRD1D in place of read data bus RD1D. However, the internal circuit configuration of data holding circuit 766 is similar to that of data holding circuit 764, so that its description will not be repeated.

Figure 20:
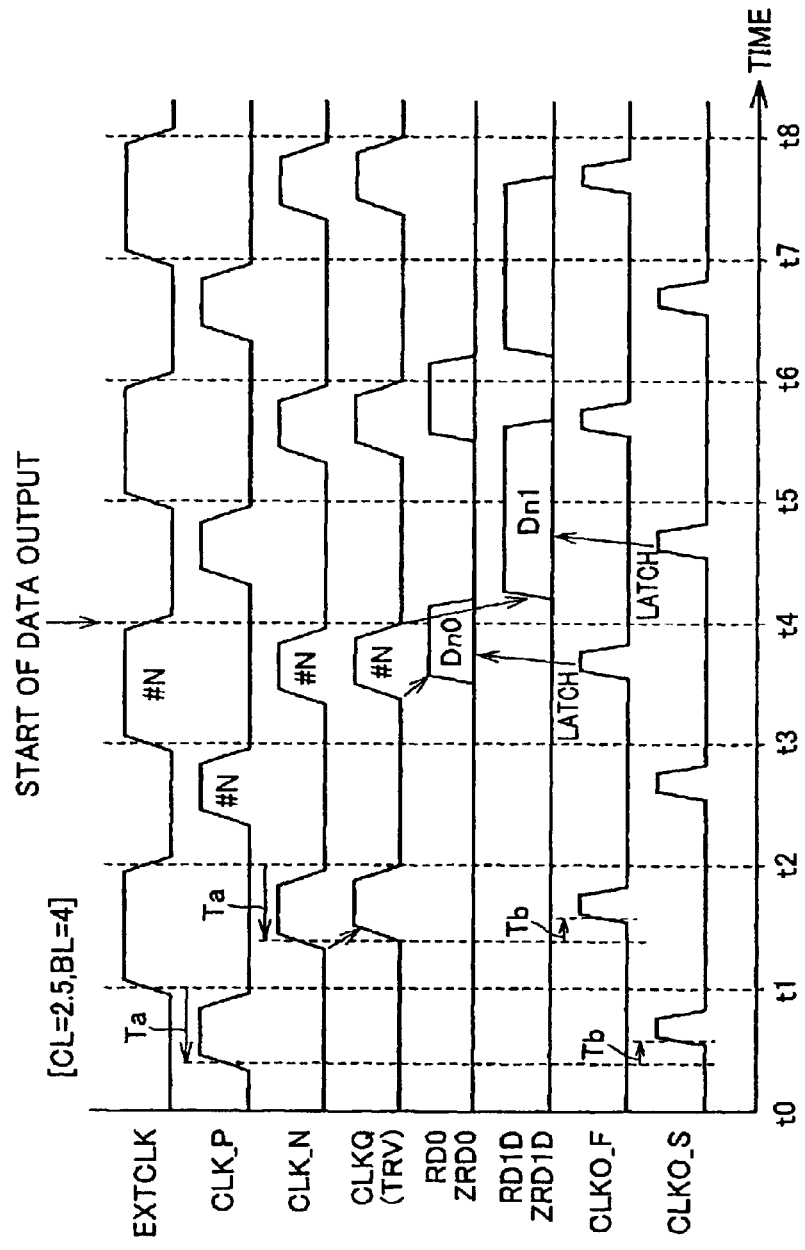
FIG. 20 is an operation waveform chart for explaining data output timings of second data latch 156B shown in FIG. 19.

FIG. 20 is an operation waveform chart for explaining data output timings of second data latch 156B shown in FIG. 19.

Referring to FIGS. 19 and 20, different from the second embodiment, data is output from second data latch 156B to read data buses RD1D and ZRD1D later than the falling edge of clock signal CLKQ at time t4.

Specifically, in the period where clock signal CLKQ is at H level, read data bus RD1D is forcedly set to L level by NAND circuit 790. When clock signal CLKQ is at H level, signal TRV is also at H level. The period corresponds to the period in which amplifying circuit 154 in FIG. 14 is activated. Data which is output first is latched by output data latch 158A synchronously with clock signals CLKO_F and ZCLKO_F.

By forcedly setting read data buses RD1D and ZRD1D to L level in this period, transistor 746 in FIG. 17 is made nonconductive and transistor 748 is disconnected from node N11. Therefore, the capacity of transistor 748 does not become a part of parasitic capacitance of node N11.

By delaying the timing of sending data from second data latch 156B to read data buses RD1D and ZRD1D in such a manner, a skew which occurs in signals ZRDH and ZRDL becomes smaller.

As described above, in the semiconductor memory device of the third embodiment, by forcedly fixing an output of second data latch circuit 156B during the period where data first output is valid, the dependency on the data pattern of the parasitic capacitance of node N11 can be eliminated, so that a skew of data output to the outside can be reduced.

(Fourth Embodiment)

In amplifying circuit 154 shown in FIG. 8 used in the first to third embodiments, read data buses RD0, ZRD0, RD1, and ZRD1 are initialized by initializing circuit 418 in a period in which clock signal CK is at L level and clock signal CKD is at H level. The period corresponds to delay time of delay circuit 366. During this period, read data buses RD0, ZRD0, RD1, and ZRD1 are equalized to the ground potential.

As long as control signal OEG is at H level, during the period from clock signal CKD becomes L level until signal ZRDAI_E or ZRDAI_O is activated to H level next, read data buses RD0, ZRD0, and the like are in a floating state.

In the case where polarities of prefetched 2-bits data are opposite to each other, when data to be output later is output as signals ZRDH and ZRDL, coupling noise which occurs in a clocked inverter in the output data latch exerts an influence on read data buses RD0, ZRD0, and the like.

Referring again to FIG. 17, description will be given more concretely.

It is now assumed that read data bus RD0 is at L level and read data bus RD1D is at H level in data holding circuit 714 for outputting signal ZRDH.

First, when clock signal CLKO_F is activated to H level, data on read data bus RD0 is latched at node N11 and signal ZRDH changes to H level.

Subsequently, when clock signal CLKO_S is activated to H level, data transmitted via read data bus RD1 is output to read data bus RD1D and captured, and signal ZRDH changes to L level. If clock signal CKD is at L level, read data bus RD0 is in a floating state and is at L level. When signal ZRDH changes, a change from H level to L level of signal ZRDH is transmitted as noise via parasitic capacitance Cgd between the gate and drain of N-channel MOS transistor 736 to read data bus RD0.

The noise level is determined by the amplitude of signal ZRDH and the ratio between the parasitic capacitance of read data bus RD0 and parasitic capacitance Cgd of transistor 736. The noise level corresponds to an insufficient equalize amount between read data buses RD0 and ZRD0. For example, in amplifying circuit 154 of FIG. 8, the level of read data bus RD0 becomes lower than the ground potential. In the case where the next data of read data bus RD0 is at H level, that is, in the case where the level of read data bus RD0 is higher than that of read data bus ZRD0, a read margin at the time of capturing data of a small amplitude on a data bus is reduced.

Similarly, when attention is paid to the signal ZRDL side, in the case where read data bus RD0 is at H level and read data bus RD1 is at L level, insufficiency of equalizing such that the level of read data bus ZRD0 becomes lower than the ground potential can occur.

To solve such a problem, in the fourth embodiment, the output data latch circuit is devised a little.

Figure 21:
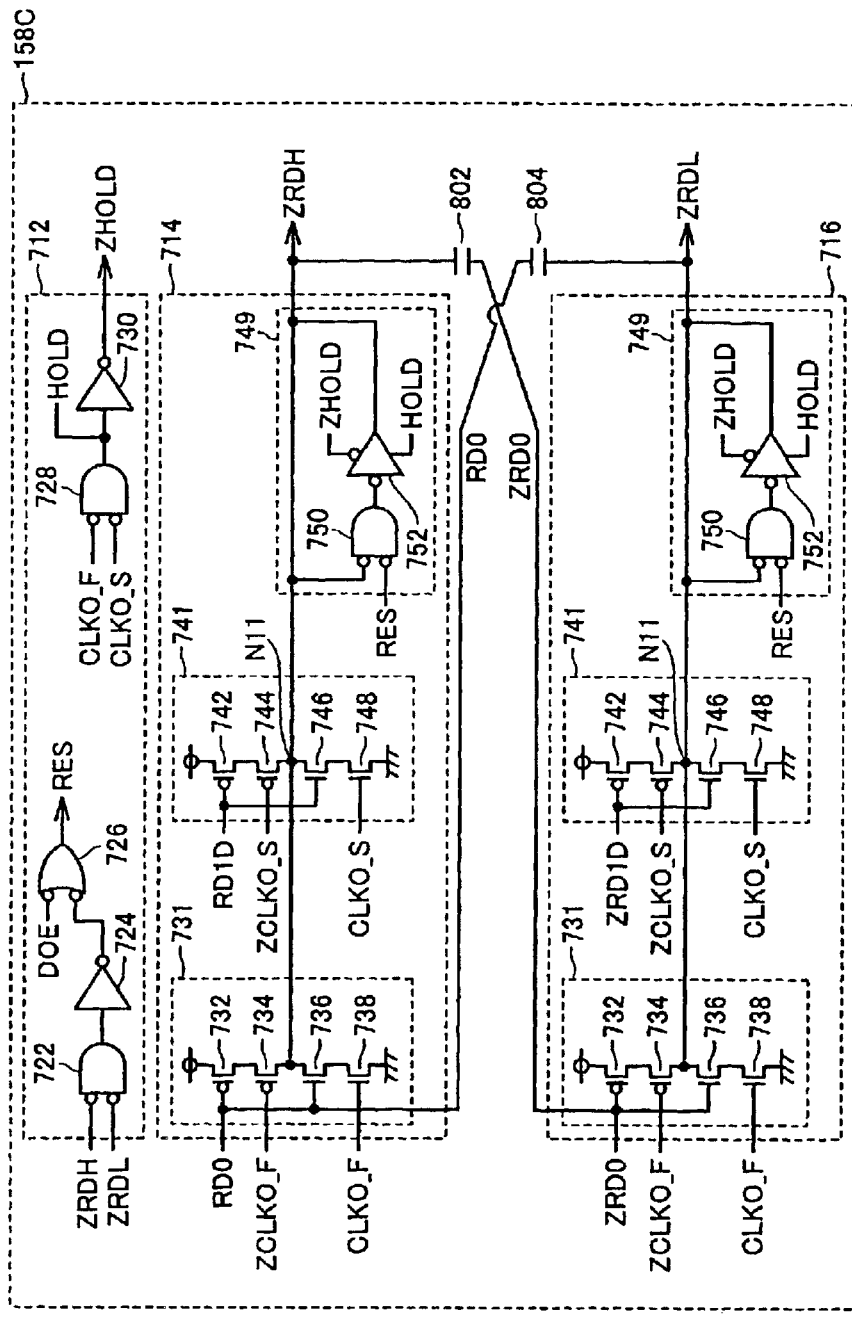
FIG. 21 is a circuit diagram showing the configuration of an output data latch 158C of a fourth embodiment.

FIG. 21 is a circuit diagram showing the configuration of an output data latch 158C of the fourth embodiment.

Referring to FIG. 21, output data latch 158C includes, in addition to the configuration of output data latch 158 described by referring to FIG. 17, a capacitor 802 connected between a node for outputting signal ZRDH and read data bus ZRD0, and a capacitor 804 connected between a node for outputting signal ZRDL and read data bus RD0. Since the other configuration of output data latch 158C is similar to that of output data latch 158A shown in FIG. 17, its description will not be repeated.

The actions of added capacitors 802 and 804 will be described. Attention is paid to the data holding circuit 714 side in FIG. 21, and it is assumed that read data bus RD0 is at L level and read data bus RD1D is at H level.

As described above, noise multiplexed on read data bus RD0 occurs when signal ZRDH changes from H level to L level when clock signal CLKO_S is at H level. At this time, signal ZRDL changes from L level to H level in the direction opposite to signal ZRDH. Therefore, when a capacitor of a proper capacitance value is provided between the node for outputting signal ZRDL and read data bus RD0, noise can be canceled.

Similarly, capacitor 802 connected between node for outputting signal ZRDH and read data bus ZRD0 acts as a noise canceler.

As described above, by disposing the capacitor as a noise canceler in the output data latch circuit portion in addition to the configuration described in the first to third embodiments, insufficient equalizing of read data buses RD0 and ZRD0 and insufficient equalizing of read data buses RD1 and ZRD1 which may occur when the second data is output can be avoided. The data output circuit can operate without deteriorating the margin of reading the following data of a small amplitude.

(Fifth Embodiment)

In the first to fourth embodiments, clock signals CLK_P and CLK_N from the DLL circuit are transmitted, for example, via the tree-shaped interconnection as shown in FIG. 2. With the configuration, timings that clock signals CLK_P and CLK_N arrive at output circuits can be easily adjusted, and a skew between data output to the outside can be suppressed.

Figure 22:
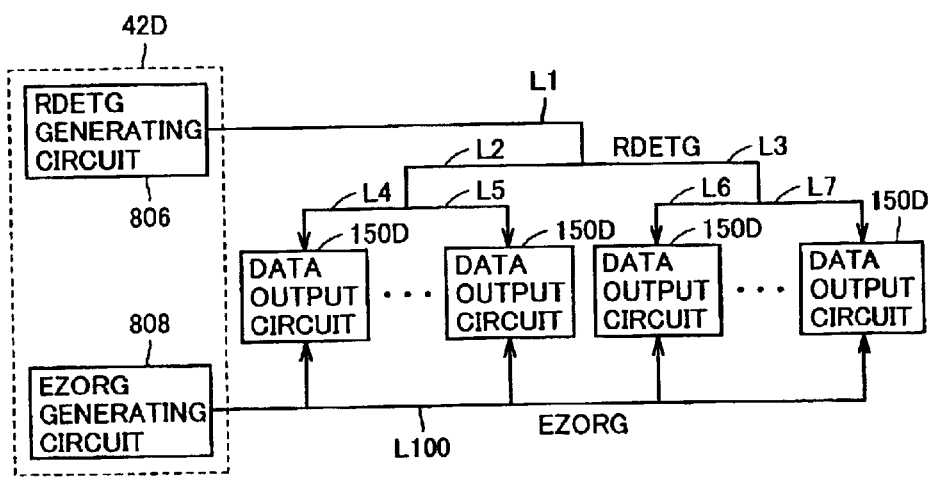
FIG. 22 is a diagram showing a first example of interconnections for transmitting control signals RDETG and EZORG.

FIG. 22 is a diagram showing a first example of interconnections for transmitting control signal RDETG and EZORG.

As shown in FIG. 22, signal RDETG for determining the timing of connecting the data bus and amplifying units 354 and 356 in FIG. 8 is usually transmitted via tree-shaped interconnection.

Although control signal EZORG including address information necessary for parallel/serial conversion is also an important signal, in the case where the parallel/serial conversion is executed after amplifying operation as in the conventional technique, control signal EZORG may arrive by the time clock signal CLKQ is activated at the latest, so that constraints on timing are not rigid. Therefore, as shown by interconnection L100 in FIG. 22, interconnection can be formed so that control signal EZORG may pass from an EZORG generating circuit 808 in one direction through an output circuit band.

However, in the case where the parallel/serial conversion is performed before the portion of amplifying data transmitted via a data bus as in the first to fourth embodiments, the timing at which control signal EZORG is determined in each of the data output circuits is desirably earlier than signal RDETG.

Therefore, in transmission via the interconnection as shown in FIG. 22, the timing of determining signal EZORG easily varies according to placement of data output circuit 150D. Particularly, at high frequencies, it becomes difficult to adjust the timing of signal RDETG and that of signal EZORG.

Figure 23:
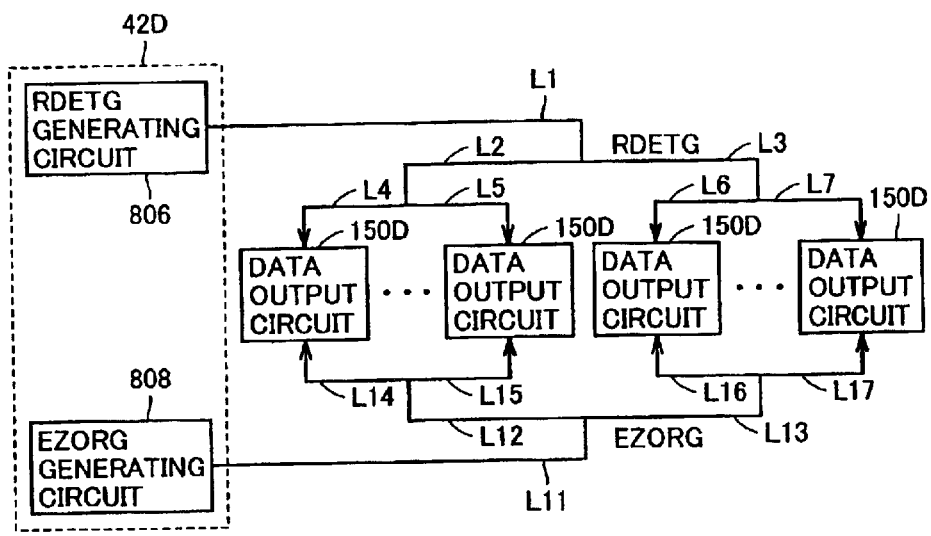
FIG. 23 is a diagram for explaining interconnections for transmitting a control signal of a semiconductor memory device in a fifth embodiment.

FIG. 23 is a diagram for explaining the interconnections for transmitting a control signal of the semiconductor memory device in the fifth embodiment.

As shown in FIG. 23, in the fifth embodiment, each of a signal line for transmitting control signal RDETG and a signal line for transmitting control signal EZORG is routed by tree-shaped interconnection. Preferably, an RDETG generating circuit 806 and EZORG generating circuit 808 are disposed so as to be close to each other in a single region 42D and interconnection for transmitting signal RDETG and that for transmitting signal EZORG have the same tree structure.

Concretely, signal RDETG transmitted first from RDETG generating circuit 806 via interconnection L1 is transmitted to two data output circuit groups via interconnections L2 and L3 having equal length. Signal RDETG transmitted to the tip portion of interconnection L2 is transmitted to corresponding data output circuits 150D via interconnections L4 and L5 having equal length.

Similarly, signal RDETG transmitted to the tip portion of interconnection L3 is transmitted to corresponding data output circuits 150D via interconnections L6 and L7 having equal length.

In correspondence with the tree structure, signal EZORG is also transmitted from EZORG generating circuit 808 to data output circuits 150D. Concretely, a signal transmitted via interconnection L11 is further transmitted via interconnections L12 and L13 having equal length. From the tip portion of interconnection L12, signal EZORG is transmitted to corresponding data output circuits 150D via interconnections L14 and L15 having equal length.

Similarly, signal EZORG is transmitted from the tip portion of interconnection L13 to corresponding data output circuits 150D via interconnections L16 and L17 having equal length.

Although not shown, a repeater similar to repeater 120 shown in FIG. 2 may be inserted at a branch point of the tree interconnection.

Particularly, by disposing RDETG generating circuit 806 and EZORG generating circuit 808 almost in the same position and setting interconnections L1 to L7 to length substantially equal to interconnections L11 to L17, respectively, while maintaining the phase relation of control signals RDETG and EZORG, signals can be transmitted to data output circuit 150D.

As described above, by connecting the signal lines for transmitting signal EZORG in a tree shape in the configurations of the first to fourth embodiments, a margin of the parallel/serial converting operation performed at the time of connecting the data bus and the portion of amplifying data can be assured more easily.

(Sixth Embodiment)

The foregoing first to fourth embodiments aim at mainly suppressing a delay in the data output circuit in a 2-bits prefetch configuration such as DDR-I. The ideas can be applied as they are to a configuration of prefetching data larger than two bits from a memory array, for example, a 4-bits prefetch configuration.

Figure 24:
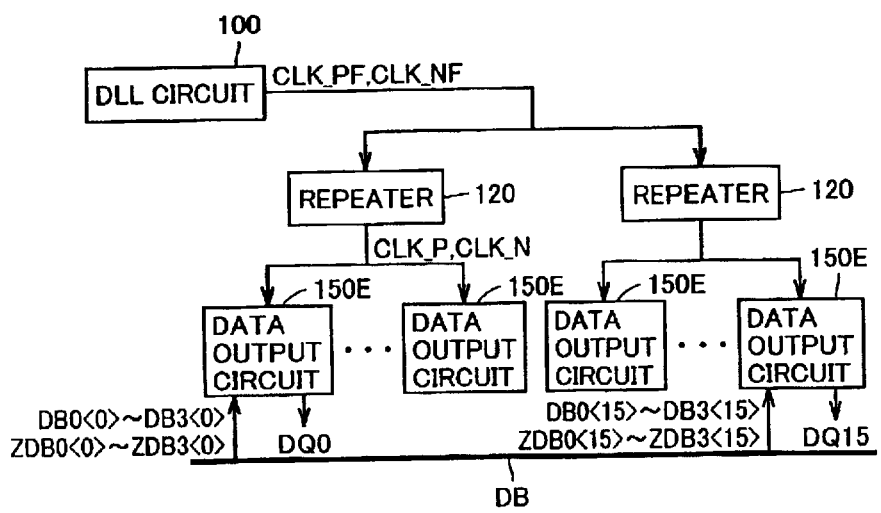
FIG. 24 is a block diagram for explaining the configuration regarding data output of a semiconductor memory device of a sixth embodiment.

FIG. 24 is a block diagram for explaining a configuration regarding data output of a semiconductor memory device of a sixth embodiment.

Referring to FIG. 24, clock signals CLK_PF and CLK_NF are generated by DLL circuit 100 and input to repeaters 120. From repeater 120, clock signals CLK_P and CLK_N are supplied to data output circuits 150E via interconnection of the tree structure in a manner similar to the case described by referring to FIG. 2.

In the sixth embodiment, data bus DB includes data buses DB0<15:0> to DB3<15:0> and data buses ZDB0<15:0> to ZDB3<15:0>. To data output circuit 150E, corresponding 4-bits data is simultaneously transmitted. For example, to data output circuit 150E for outputting signal DQ0, data buses DB0<0> to DB3<0> and ZDB0<0> to ZDB3<0> out of the data buses are connected. To data output circuit 150E for outputting signal DQ15, data buses DB0<15> to DB3<15> and ZDB0<15> to ZDB3<15> are connected.

Figure 25:
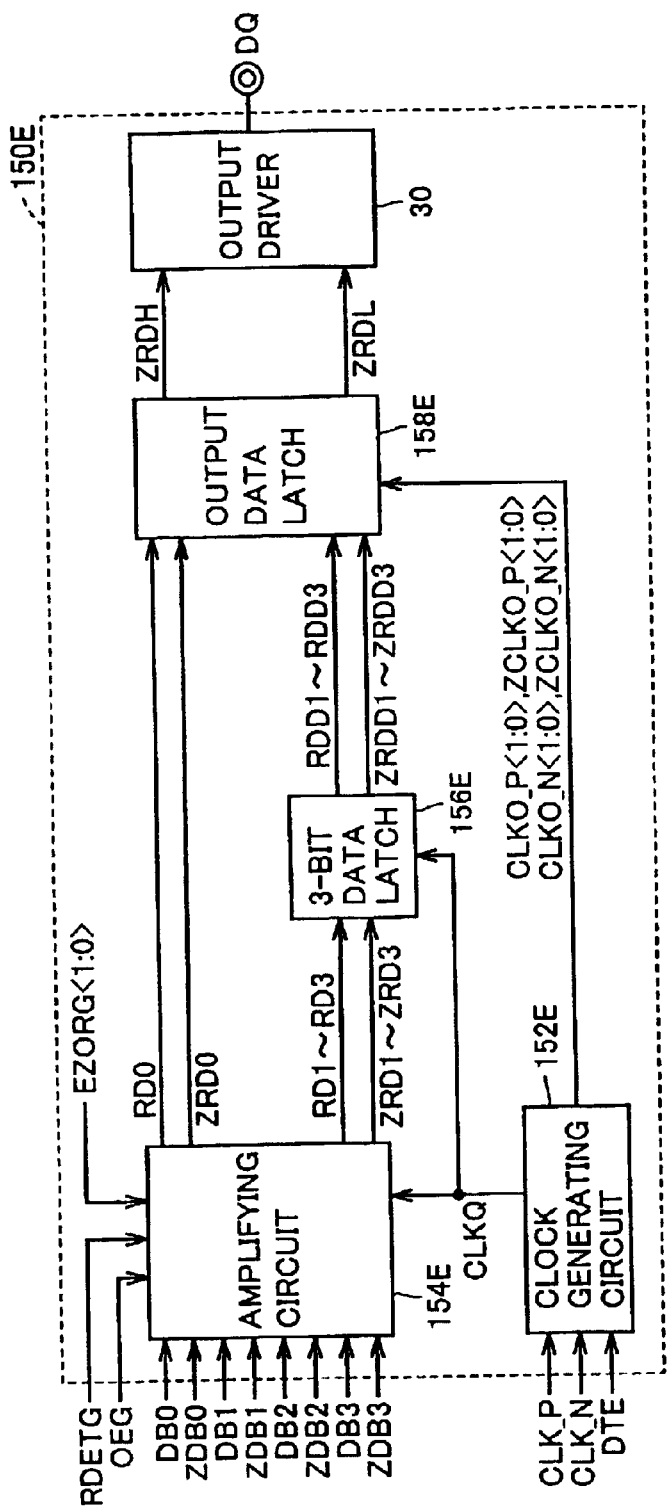
FIG. 25 is a block diagram showing the configuration of a data output circuit 150E in FIG. 24.

FIG. 25 is a block diagram showing the configuration of data output circuit 150E in FIG. 24.

Referring to FIG. 25, data output circuit 150E includes a clock generating circuit 152E, an amplifying circuit 154E, a 3-bit data latch 156E, an output data latch 158E, and output driver 30.

Clock generating circuit 152E outputs clock signals CLKQ, CLKO_P<1:0>, ZCLKO_P<1:0>, CLKO_N<1:0>, and ZCLKO_N<1:0> in accordance with clock signals CLK_P and CLK_N and control signal DTE.

Control signal DTE is a signal for notifying data output circuit 150E of the former half and the latter half of a two-clock cycle period in which prefetched 4-bits data is output.

According to control signals EZORG<1:0> in addition to control signals RDETG and OEG, amplifying circuit 154E amplifies data transmitted via data buses DB0 to DB3 and ZDB0 to ZDB3 and outputs the amplified data to read data buses RD0 to RD3 and ZRD0 to ZRD3. In the 4-bits prefetch configuration, address information of two bits is necessary. Address bits CA1 and CA0 of a column address supplied to the chip together with command READ are used as a start address, the address is sequentially incremented, and corresponding data is output. In control signal EZORG<1:0> supplied to amplifying circuit 154E, information of address bits CA1 and CA0 of the start address supplied from the outside is reflected.

The relation between address bits CA1 and CA0 of the start address and control signals EZORG<1:0> is as follows.

When CA1=0, EZORG<1> is set to "H". When CA1=1, EZORG<1> is set to "L".

When CA0=0, EZORG<0> is set to "H". When CA0=1, EZORG<0> is set to "L".

The corresponding relation between the four pairs of data buses and read data buses is determined by control signals EZORG<1:0> in amplifying circuit 154E. That is, by the time data having a small amplitude on a data bus is read by the amplifying unit in amplifying circuit 154E, the parallel/serial conversion is completed.

It is now assumed that, as will be described later also in FIG. 32, data read from the memory array to data bus DB and a column address in the memory array have the following relation.

Data D00 corresponding to the case where CA1=0 and CA0=0 is read to data buses DB0 and ZDB0.

Data D01 corresponding to the case where CA1=0 and CA0=1 is read to data buses DB1 and ZDB1.

Data D10 corresponding to the case where CA1=1 and CA0=0 is read to data buses DB2 and ZDB2.

Data D11 corresponding to the case where CA1=1 and CA0=1 is read to data buses DB3 and ZDB3.

Amplifying circuit 154E includes four amplifying circuits to be described hereinafter which correspond to data which is read first to data which is read fourth to the outside.

When amplifying circuit 154E is activated, data which is output first out of the 4-bits data is output to read data buses RD0 and ZRD0 and transmitted to output data latch 158E. On the other hand, the remaining 3-bits data is transmitted to 3-bit data latch 156E via read data buses RD1 to RD3 and ZRD1 to ZRD3, and latched by 3-bit data latch 156E.

When the conventional configuration described by referring to FIG. 38 is expanded to a 4-bits prefetch configuration, after data is amplified by the amplifying circuit, the amplified data is ordered in a parallel/serial converting circuit. Therefore, any data output from amplifying circuit 154E can be data to be output second or later. Consequently, an output of amplifying circuit 154E has to be held by a latch, and data which is output first has to pass all the stages from the amplifying circuit to the output final stage.

In addition, it is easily imagined that the gate scale for ordering the latched data becomes larger than parallel/serial converting circuit 1556 shown in FIG. 41. For example, pass gates which can be connected to the first to fourth read data buses are necessary for outputs of the latches for latching 4-bits data. Alternately, if data is output to a common read data bus, a configuration of generating a trigger clock corresponding to a data order becomes necessary.

In contrast, in the sixth embodiment, the data to be output first is directly transmitted from amplifying circuit 154E to output data latch 158E via read data buses RD0 and ZRD0, so that the number of gate stages through which data passes in data output circuit 150E can be reduced. Therefore, Tcac, which is an actual value indicative of a period from a read command is received until data is output, can be further shortened. An increase in the circuit scale can be small.

Output data latch 158E includes pass gates constructed by clocked inverters in correspondence with the first to fourth 4-bits data. The configuration will be described hereinafter by referring to FIG. 34. A clock signal, which is an output trigger corresponding to each bit, is input to output data latch 158E. The corresponding relation between data and the clock signal is as follows.

The first data is transmitted to output data latch 158E via read data buses RD0 and ZRD0 and corresponds to clock signals CLK_P<0> and ZCLK_P<0>.

The second data is transmitted to output data latch 158E via read data buses RDD1 and ZRDD1 and corresponds to clock signals CLK_N<0> and ZCLK<0>.

The third data is transmitted to output data latch 158E via read data buses RDD2 and ZRDD2 and corresponds to clock signals CLK_P<1> and ZCLK_P<1>.

The fourth data is transmitted to output data latch 158E via read data buses RDD3 and ZRDD3 and corresponds to clock signals CLK_N<1> and ZCLK_N<1>.

An example of the configuration of each of circuits constructing data output circuit 150E described in FIG. 25 will now be described.

Figure 26:
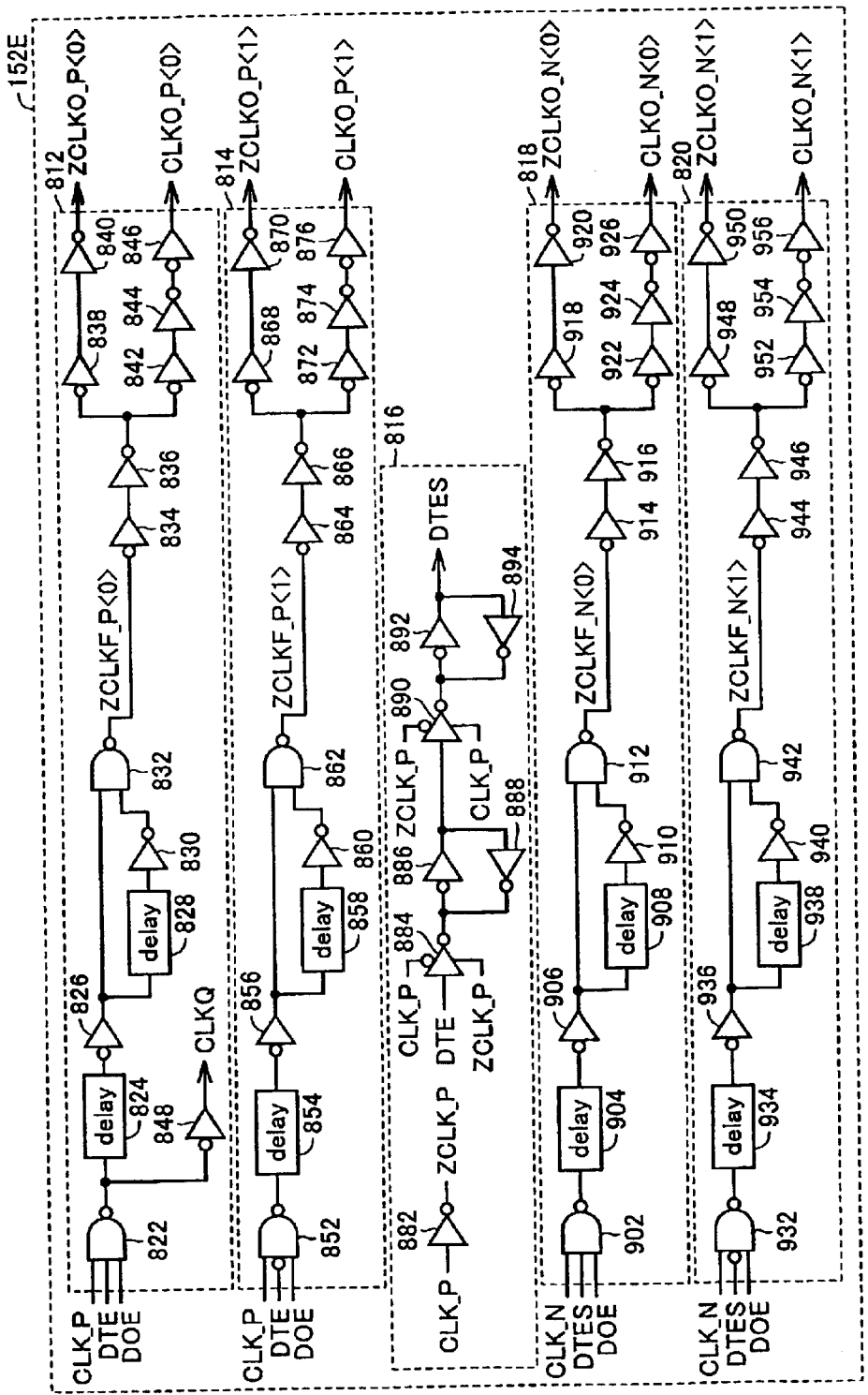
FIG. 26 is a circuit diagram showing the configuration of a clock generating circuit 152E in FIG. 25.

FIG. 26 is a circuit diagram showing the configuration of clock generating circuit 152E in FIG. 25.

By referring to FIG. 26, clock generating circuit 152E includes signal generating units 812, 814, 816, 818, and 820.

Signal generating unit 812 includes: an NAND circuit 822 of three inputs for receiving clock signal CLK_P and control signals DTE and DOE; a delay circuit 824 for delaying an output of NAND circuit 822; an inverter 826 for receiving and inverting an output of delay circuit 824; a delay circuit 828 for receiving and delaying an output of inverter 826; an inverter 830 for receiving and inverting an output of delaying circuit 828; and an NAND circuit 832 for receiving outputs of inverter 826 and 830 and outputting a signal ZCLKF_P<0>.

Signal generating unit 812 further includes: an inverter 834 for receiving and inverting signal ZCLKF_P<0>; an inverter 836 for receiving and inverting an output of inverter 834; inverters 838 and 840 of two stages connected in series for receiving an output of inverter 836 and outputting clock signal ZCLKO_P<0>; and inverters 842, 844, and 846 of three stages connected in series for receiving an output of inverter 836 and outputting clock signal CLKO_P<0>.

Signal generating unit 812 further includes an inverter 848 for receiving and inverting an output of NAND circuit 822 and outputting clock signal CLKQ.

Signal generating unit 814 includes: a gate circuit 852 of three inputs for receiving clock signal CLK_P and control signals DTE and DOE; a delay circuit 854 for delaying an output of gate circuit 852; an inverter 856 for receiving and inverting an output of delay circuit 854; a delay circuit 858 for receiving and delaying an output of inverter 856; an inverter 860 for receiving and inverting an output of delaying circuit 858; and an NAND circuit 862 for receiving outputs of inverters 856 and 860 and outputting a signal ZCLKF_P<1>.

Signal generating unit 814 further includes: an inverter 864 for receiving and inverting signal ZCLKF_P<1>; an inverter 866 for receiving and inverting an output of inverter 864; inverters 868 and 870 of two stages connected in series for receiving an output of inverter 866 and outputting clock signal ZCLKO_P<1>; and inverters 872, 874, and 876 of three stages connected in series for receiving an output of inverter 866 and outputting clock signal CLKO_P<1>.

An output of gate circuit 852 is at L level in the case where clock signal CLK_P and control signal DOE are at H level and control signal DTE is at L level, and is at H level in the other cases.

Signal generating unit 816 includes: an inverter 882 for receiving and inverting clock signal CLK_P and outputting clock signal ZCLK_P; a clocked inverter 884 which is activated when clock signal ZCLK_P is at H level to receive and invert control signal DPE; an inverter 886 for receiving and inverting an output of clocked inverter 884; and an inverter 888 for receiving and inverting an output of inverter 886 and supplying the resultant to an input of inverter 886.

Signal generating unit 816 further includes: a clocked inverter 890 which is activated when clock signal CLK_P is at H level to receive and invert an output of inverter 886;

an inverter 892 for receiving and inverting an output of clocked inverter 890 and outputting signal DTES; and an inverter 894 for receiving and inverting an output of inverter 892 and supplying the resultant to an input of inverter 892.

Signal generating unit 818 includes: an NAND circuit 902 of three inputs for receiving clock signal CLK_N and control signals DTES and DOE; a delay circuit 904 for delaying an output of NAND circuit 902; an inverter 906 for receiving and inverting an output of delay circuit 904; a delay circuit 908 for receiving and delaying an output of inverter 906; an inverter 910 for receiving and inverting an output of delaying circuit 908; and an NAND circuit 912 for receiving outputs of inverters 906 and 910 and outputting a signal ZCLKF_N<0>.

Signal generating unit 818 further includes: an inverter 914 for receiving and inverting signal ZCLKF_N<0>; an inverter 916 for receiving and inverting an output of inverter 914; inverters 918 and 920 of two stages connected in series for receiving an output of inverter 916 and outputting clock signal ZCLKO_N<0>; and inverters 922, 924, and 926 of three stages connected in series for receiving an output of inverter 916 and outputting clock signal CLKO_N<0>.

Signal generating unit 820 further includes: a gate circuit 932 of three inputs for receiving clock signal CLK_N and control signals DTES and DOE; a delay circuit 934 for delaying an output of gate circuit 932; an inverter 936 for receiving and inverting an output of delay circuit 934; a delay circuit 938 for receiving and delaying an output of inverter 936; an inverter 940 for receiving and inverting an output of delaying circuit 938; and an NAND circuit 942 for receiving outputs of inverters 936 and 940 and outputting a signal ZCLKF_N<1>.

Signal generating unit 820 further includes: an inverter 944 for receiving and inverting signal ZCLKF_N<1>; an inverter 946 for receiving and inverting an output of inverter 944; inverters 948 and 950 of two stages connected in series for receiving an output of inverter 946 and outputting clock signal ZCLKO_N<1>; and inverters 952, 954, and 956 of three stages connected in series for receiving an output of inverter 946 and outputting clock signal CLKO_N<1>.

An output of gate circuit 932 is at L level in the case where clock signal CLK_N and control signal DOE are at H level and control signal DTES is at L level, and is at H level in the other cases.

Figure 27:
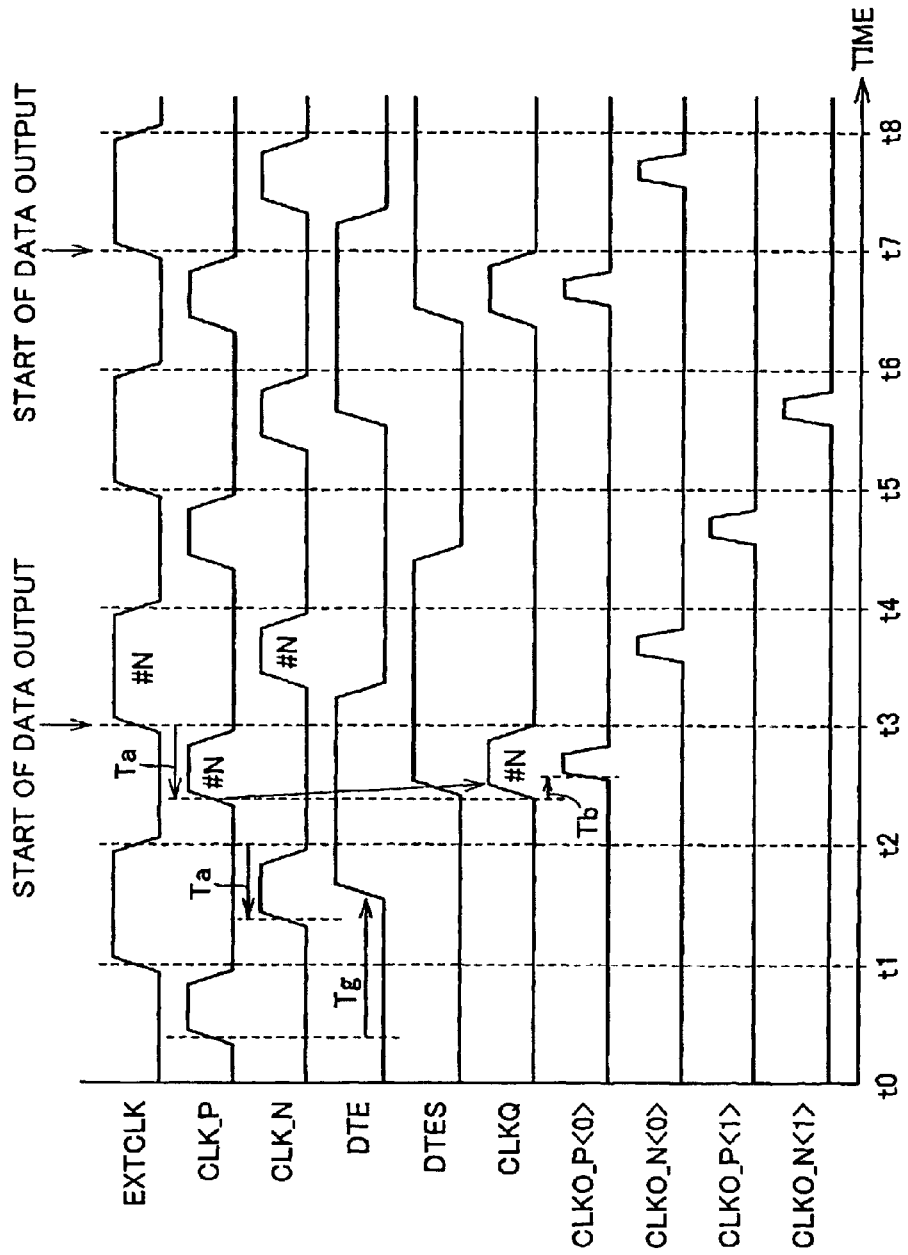
FIG. 27 is an operation waveform chart for explaining the operation of clock generating circuit 152E in FIG. 26.

FIG. 27 is an operation waveform chart for explaining the operation of clock generating circuit 152E shown in FIG. 26.

Referring to FIGS. 26 and 27, signal DTE is a signal for designating the former half and the latter half of a two-clock cycle period in which 4-bits data is output. For example, signal DTE is generated by control circuit 42 in FIG. 1. Signal DTE is generated, delayed by a proper delay time Tg from a time point one clock cycle before the activation timing of amplifying circuit 154E, and is kept at H level for a period of one clock cycle. By shifting signal DTE in accordance with clock signal CLK_P by signal generating unit 816, signal DTES is generated.

During two cycles in which data is output, each of clock signals CLK_P and CLK_N has to become a trigger twice. When NAND circuit 822 detects that signal DTE is at H level and clock signal CLK_P becomes H level, clock signal CLKO_P<0> is activated during the period from time t2 to t3.

Subsequently, in the period from time t3 to t4, when NAND circuit 902 detects that signal DTES is at H level and clock signal CLK_N is at H level, clock signal CLKO_N<0> is activated.

In the following period from time t4 to t5, when gate circuit 852 detects that signal DTE is at L level and clock signal CLK_P becomes H level, clock signal CLKO_P<1> is activated.

In the following period from time t5 to t6, when gate circuit 932 detects that signal DTES is at L level and clock signal CLK_N becomes H level, clock signal CLKO_N<1> is activated.

In such a manner, clock signals CLKO_P<1:0> and CLKO_N<1:0> as output triggers are generated from clock signals CLK_P and CLK_N.

Figure 28:
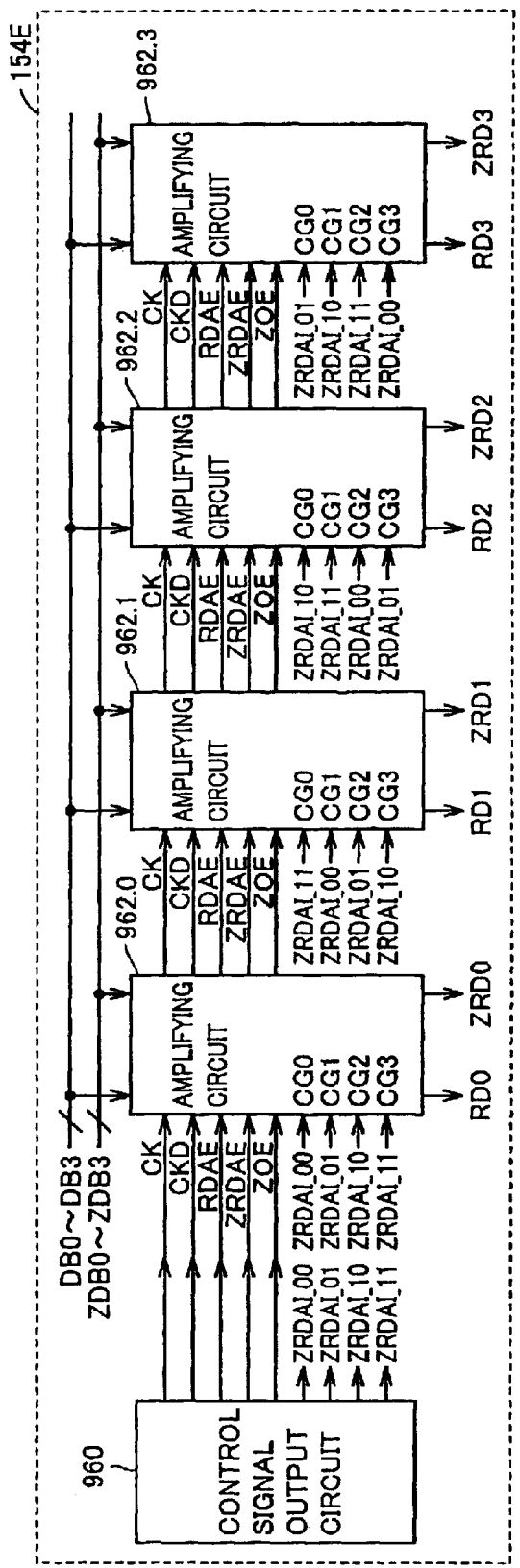
FIG. 28 is a block diagram showing the configuration of an amplifying circuit 154E in FIG. 25.

FIG. 28 is a block diagram showing the configuration of amplifying circuit 154E in FIG. 25.

Referring to FIG. 28, amplifying circuit 154E includes: a control signal output circuit 960 for outputting clock signals CK and CKD and control signals RDAE, ZRDAE, ZOE, ZRDAI_00, ZRDAI_01, ZRDAI_10, and ZRDAI_11; an amplifying circuit 962.0 for capturing and amplifying one of the data transmitted via data buses DB0 to DB3 and ZDB0 to ZDB3 in accordance with an output of control signal output circuit 960 and outputting the amplified data to read data buses RD0 and ZRD0; an amplifying circuit 962.1 for capturing and amplifying one of data transmitted via data buses DB0 to DB3 and ZDB0 to ZDB3 in accordance with an output of control signal output circuit 960 and outputting the amplified data to read data buses RD1 and ZRD1; an amplifying circuit 962.2 for capturing and amplifying one of data transmitted via data buses DB0 to DB3 and ZDB0 to ZDB3 in accordance with an output of control signal output circuit 960 and outputting the amplified data to read data buses RD2 and ZRD2; and an amplifying circuit 962.3 for capturing and amplifying one of data transmitted via data buses DB0 to DB3 and ZDB0 to ZDB3 in accordance with an output of control signal output circuit 960 and outputting the amplified data to read data buses RD3 and ZRD3.

Figure 29:
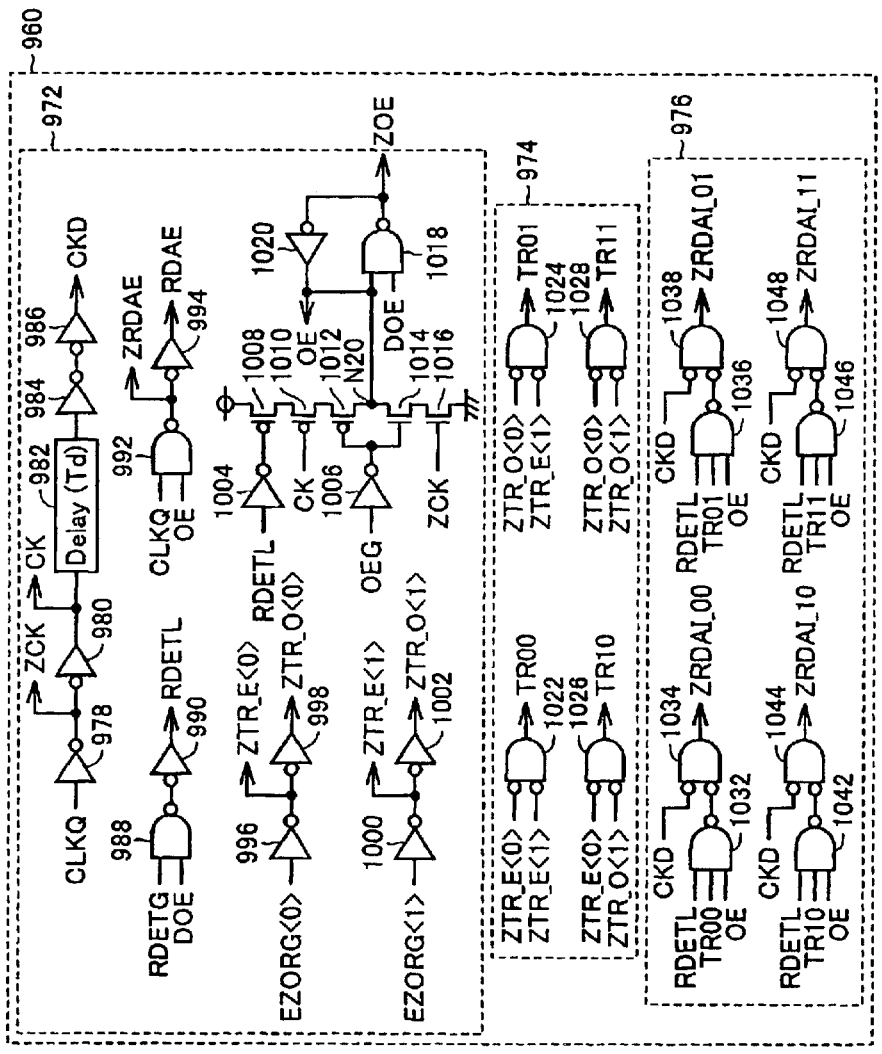
FIG. 29 is a circuit diagram showing the configuration of a control signal output circuit 960 in FIG. 28.

FIG. 29 is a circuit diagram showing the configuration of control signal output circuit 960 in FIG. 28.

Referring to FIG. 29, control signal output circuit 960 includes signal generating units 972, 974, and 976. Signal generating unit 972 includes: an inverter 978 for receiving and inverting clock signal CLKQ and outputting clock signal ZCK; an inverter 980 for receiving and inverting clock signal ZCK and outputting clock signal CK; a delay circuit 982 for delaying clock signal CK by delay time Td; and inverters 984 and 986 of two stages connected in series for receiving an output of delay circuit 982 and outputting clock signal CKD.

Signal generating unit 972 further includes: an NAND circuit 988 for receiving control signals RDETG and DOE; an inverter 990 for receiving and inverting an output of NAND circuit 988 and outputting signal RDETL; an NAND circuit 992 for receiving clock signal CLKQ and signal OE and outputting signal ZRDAE; and an inverter 994 for receiving and inverting signal ZRDAE and outputting signal RDAE.

Signal generating unit 972 further includes: an inverter 996 for receiving and inverting control signal EZORG<0> and outputting signal ZTR_E<0>; an inverter 998 for receiving and inverting signal ZTR_E<0> and outputting signal ZTR_O<0>; an inverter 1000 for receiving and inverting control signal EZORG<1> and outputting signal ZTR_E<1>; and an inverter 1002 for receiving and inverting signal ZTR_E<1> and outputting signal ZTR_O<1>.

Signal generating unit 972 further includes: inverters 1004 and 1006 for inverting control signals RDETL and OEG, respectively; P-channel MOS transistors 1008, 1010, and 1012 connected in series between a power supply node and a node N20, for receiving an output of inverter 1004, clock signal CK, and an output of inverter 1004 by their gates, respectively; and N-channel MOS transistors 1014 and 1016 connected in series between node N20 and the ground node, for receiving an output of inverter 1006 and clock signal ZCK by their gates, respectively.

Signal generating unit 972 further includes: an NAND circuit 1018 having an input connected to node N20 and the other input for receiving signal DOE, which outputs signal ZOE; and an inverter 1020 for receiving and inverting signal ZOE and supplying the resultant to node N20. Signal OE is output from node N20.

Signal generating unit 974 includes: an NOR circuit 1022 for receiving signals ZTR_E<0> and ZTR_E<1> and outputting signal TR00; an NOR circuit 1024 for receiving signals ZTR_O<0> and ZTR_E<1> and outputting signal TR01; an NOR circuit 1026 for receiving signals ZTR_E<0> and ZTR_O<1> and outputting signal TR10; and an NOR circuit 1028 for receiving signals ZTR_O<0> and ZTR_O<1> and outputting signal TR11.

Signals TR00 to TR11 are signals have relations with the column address supplied from the outside and the order of data output. Signals TR00 to TR11 will be described hereinafter by referring to FIG. 31.

Signal generating unit 976 includes: an NAND circuit 1032 of three inputs for receiving signals RDETL, TR00, and OE; an NOR circuit 1034 for receiving an output of NAND circuit 1032 and clock signal CKD and outputting signal ZRDAI_00; an NAND circuit 1036 of three inputs for receiving signals RDETL, TR01, and OE; and an NOR circuit 1038 for receiving an output of NAND circuit 1036 and clock signal CKD and outputting signal ZRDAI_01.

Signal generating unit 976 further includes: an NAND circuit 1042 of three inputs for receiving signals RDETL, TR10, and OE; an NOR circuit 1044 for receiving an output of NAND circuit 1042 and clock signal CKD and outputting signal ZRDAI_10; an NAND circuit 1046 of three inputs for receiving signals RDETL, TR11, and OE; and an NOR circuit 1048 for receiving an output of NAND circuit 1046 and clock signal CKD and outputting signal ZRDAI_11.

Figure 30:
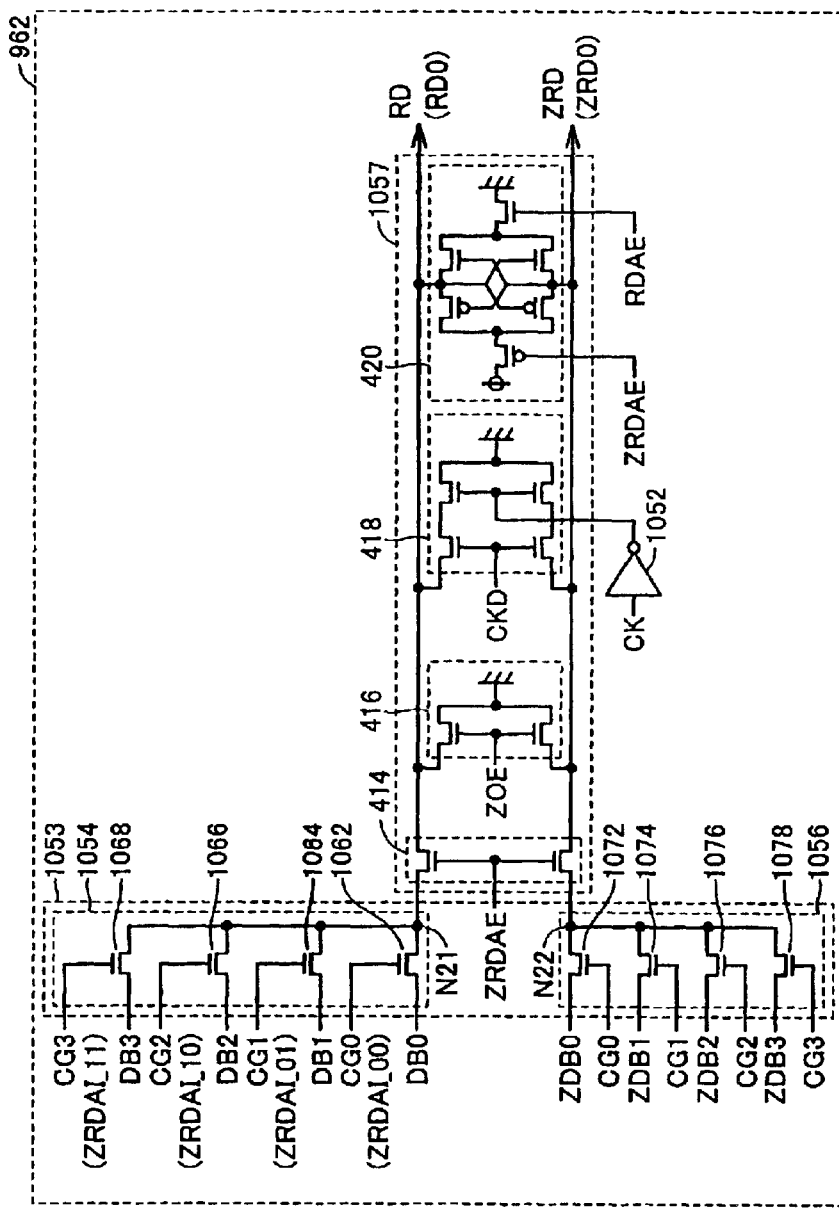
FIG. 30 is a circuit diagram of an amplifying circuit 962 showing the configuration common to amplifying circuits 962.0 to 962.3 in FIG. 28.

FIG. 30 is a circuit diagram of amplifying circuit 962, showing a configuration common to amplifying circuits 962.0 to 962.3 in FIG. 28.

Referring to FIG. 30, amplifying circuit 962 includes a selection unit 1053. Selection unit 1053 includes: a selection circuit 1054 for connecting any of data buses DB0 to DB3 to a node N21 in accordance with a signal supplied to input nodes CG0 to CG3; and a connection circuit 1056 for connecting any of data buses DB0 to DB3 to a node N22 in accordance with a signal supplied to input nodes CG0 to CG3.

Amplifying circuit 962 further includes an amplifying unit 1057. Amplifying unit 1057 includes: connection circuit 414 for connecting node N21 and N22 to read data buses RD and ZRD in accordance with signal ZRDAE; enable circuit 416 for coupling read data buses RD and ZRD to the ground node when signal ZOE becomes H level; an inverter 1052 for receiving and inverting clock signal CK; initializing circuit 418 for initializing read data buses RD and ZRD to the ground potential in accordance with an output of inverter 1052 and clock signal CKD; and sense amplifier 420 for amplifying a potential difference which occurs between read data buses RD and ZRD in accordance with signals ZRDAE and RDAE.

Since the configuration of connection circuit 414, enable circuit 416, initializing circuit 418, and sense amplifier 420 has been described by referring to FIG. 8, the description will not be repeated.

Connection circuit 1054 includes: an N-channel MOS transistor 1062 connected between data bus DB0 and node N21 and whose gate is connected to input node CG0; an N-channel MOS transistor 1064 connected between data bus DB1 and node N21 and whose gate is connected to input node CG1; an N-channel MOS transistor 1066 connected between data bus DB2 and node N21 and whose gate is connected to input node CG2; and an N-channel MOS transistor 1068 connected between data bus DB3 and node N21 and whose gate is connected to input node CG3.

Connection circuit 1056 includes: an N-channel MOS transistor 1072 connected between data bus ZDB0 and node N22 and whose gate is connected to input node CG0; an N-channel MOS transistor 1074 connected between data bus ZDB1 and node N22 and whose gate is connected to input node CG1; an N-channel MOS transistor 1076 connected between data bus ZDB2 and node N22 and whose gate is connected to input node CG2; and an N-channel MOS transistor 1078 connected between data bus ZDB3 and node N22 and whose gate is connected to input node CG3.

In amplifying circuit 962.0 in FIG. 28, signals ZRDAI_00, ZRDAI_01, ZRDAI_10, and ZRDAI_11 are supplied to input nodes CG0, CG1, CG2, and CG3, respectively, and read data buses RD0 and ZRD0 are connected in correspondence with read data buses RD and ZRD.

In amplifying circuit 962.1, signals ZRDAI_11, ZRDAI_00, ZRDAI_01, and ZRDAI_10 are supplied to input nodes CG0, CG1, CG2, and CG3, respectively, and read data buses RD1 and ZRD1 are connected in correspondence with read data buses RD and ZRD.

In amplifying circuit 962.2, signals ZRDAI_10, ZRDAI_11, ZRDAI_00, and ZRDAI_01 are supplied to input nodes CG0, CG1, CG2, and CG3, respectively, and read data buses RD2 and ZRD2 are connected in correspondence with read data buses RD and ZRD.

In amplifying circuit 962.3, signals ZRDAI_01, ZRDAI_10, ZRDAI_11, and ZRDAI_00 are supplied to input nodes CG0, CG1, CG2, and CG3, respectively, and read data buses RD3 and ZRD3 are connected in correspondence with read data buses RD and ZRD.

FIGS. 28 to 30 show the configuration in which the parallel/serial conversion based on condition that operation is performed in a so-called sequential mode is carried out. In the sequential mode, the order of data to be output is determined in accordance with a start address supplied from the outside as a combination of address bits CA1 and CA0.

FIG. 31 is a diagram showing the relation between the order of data to be output and address bits CA1 and CA0.

Referring to FIG. 31, when address bits (CA1, CA0) of the start address=(0, 0), the order of data to be output is D00→D01→D10→D11.

When address bits (CA1, CA0)=(0, 1), the order of data to be output is D01→D10→D11→D00.

When address bits (CA1, CA0)=(1, 0), the order of data to be output is D10→D11→D00→D01.

When address bits (CA1, CA0)=(1, 1), the order of data to be output is D11→D00→D01→D10.

To realize the data order as described above, signals TR00, TR01, TR10, and TR11 according to four ways of combinations of control signal EZORG<1:0> with respect to address bits CA1 and CA0 are generated by signal generating unit 974 in FIG. 29.

For example, when address bit CA1=1 and CA0=0, signal TR01 changes to "H" and further, at a proper timing, signal ZRDAI_01 changes to H level. In the read period, the other three signals ZRDAI_00, ZRDAI_10, and ZRDAI_11 are always at L level.

Figure 32:
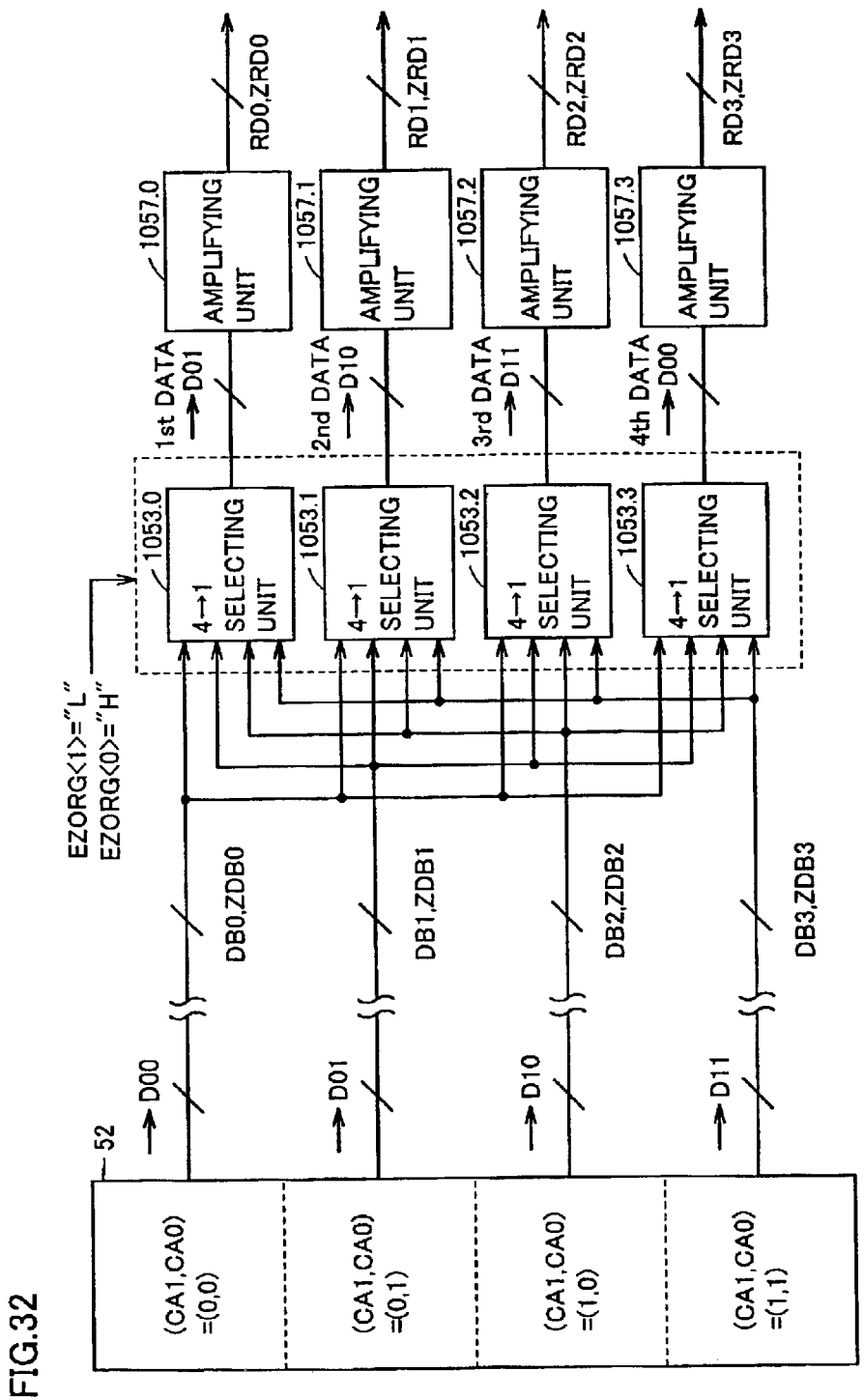
FIG. 32 is a conceptual diagram for explaining the flow of data in a period from data is read from a memory array until data which has been ordered is output to amplifying circuit 154E.

FIG. 32 is a conceptual diagram for explaining the flow of data from data is read from the memory array until ordered data is output to amplifying circuit 154E.

Referring to FIG. 32, 4-bits data D00, D01, D10, and D11 is read in a group from memory cell array 52.

Data D00 is read from a region corresponding to address bits (CA1, CA0) of the memory array=(0, 0) and output to data buses DB0 and ZDB0. Data D01 is read from a region corresponding to address bits (CA1, CA0) of the memory array=(0, 1) and output to data buses DB1 and ZDB1.

Data D10 is read from a region corresponding to address bits (CA1, CA0) of the memory array=(1, 0) and output to data buses DB2 and ZDB2. Data D11 is read from a region corresponding to address bits (CA1, CA0) of the memory array=(1, 1) and output to data buses DB3 and ZDB3.

It is now assumed that the start address supplied from the outside is (CA1, CA0)=(0, 1). According to the start address, control signal EZORG<1> is set to L level, and control signal EZORG<0> is set to H level.

According to control signal EZORG<1:0>, selection units 1053.0 to 1053.3 select corresponding one of four data so as to match the data output order shown in FIG. 31. In the case where the start address is (CA1, CA0)=(0, 1), selection unit 1053.0 selects data D01 transmitted via data buses DB1 and ZDB1. Selection unit 1053.1 selects data D10 transmitted via data buses DB2 and ZDB2. Selection unit 1053.2 selects data D11 transmitted via data buses DB3 and ZDB3. Selection unit 1053.3 selects data D00 transmitted via data buses DB0 and ZDB0.

The data selected by selection units 1053.0 to 1053.3 is data to be output first to data to be output fourth.

Amplifying unit 1057.0 amplifies data D01 and outputs the amplified data to read data buses RD0 and ZRD0. Amplifying unit 1057.1 amplifies data D10 and outputs the amplified data to read data buses RD1 and ZRD1. Amplifying unit 1057.2 amplifies data D11 and outputs the amplified data to read data buses RD2 and ZRD2. Amplifying unit 1057.3 amplifies data D00 and outputs the amplified data to read data buses RD3 and ZRD3.

In such a manner, when (CA1, CA0)=(0, 1) is given as a start address, data passes as it is through output data latch 158E and output driver 30 and is output from a terminal in accordance with the order of D01→D10→D11→D00.

Figure 33:
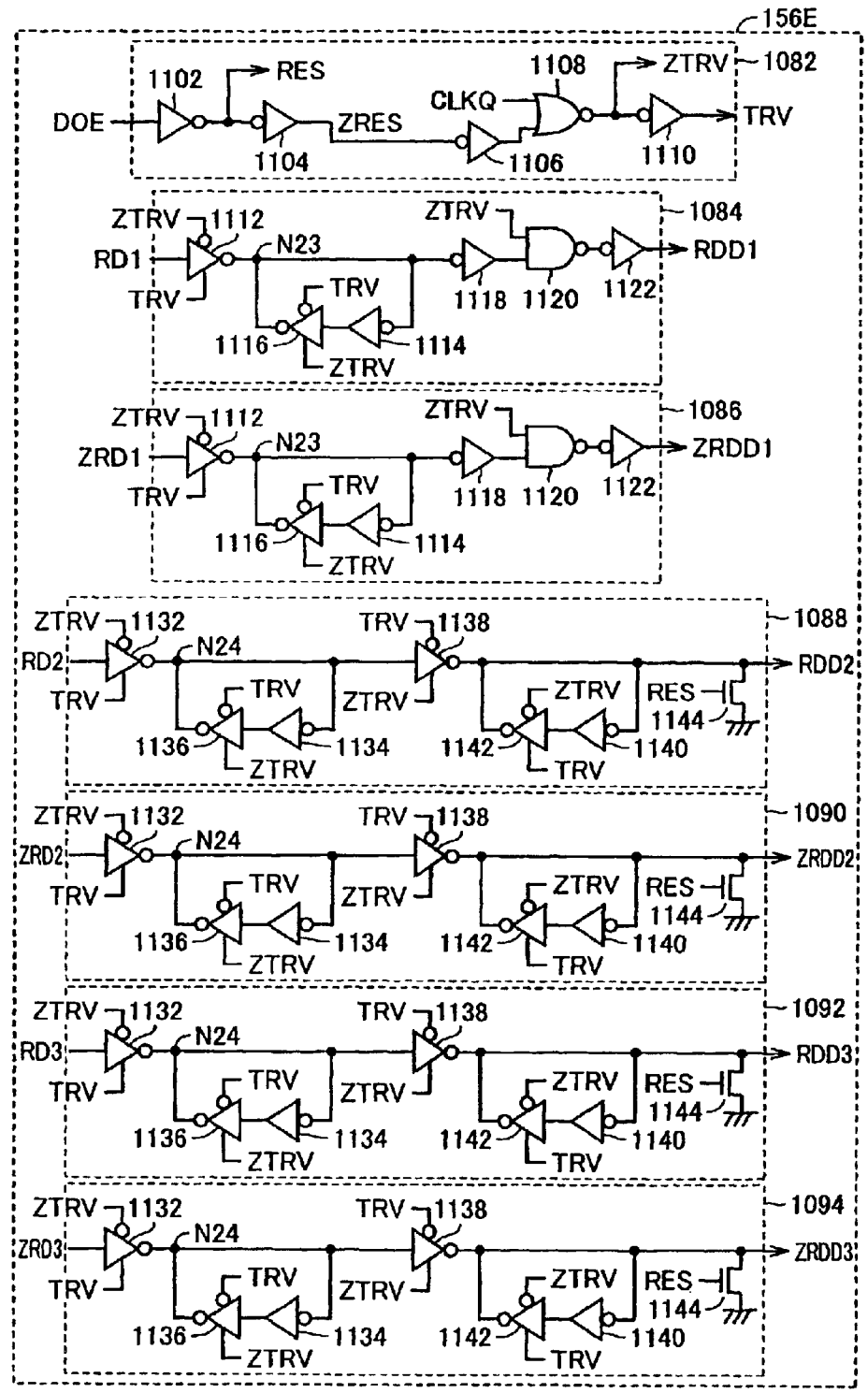
FIG. 33 is a circuit diagram showing the configuration of a 3-bit data latch 156E in FIG. 25.

FIG. 33 is a circuit diagram showing the configuration of 3-bit data latch 156E in FIG. 25.

Referring to FIG. 33, 3-bit data latch 156E includes a signal output unit 1082 for outputting a control signal which determines a timing of latching data in accordance with control signal DOE and clock signal CLKQ, and data holding circuits 1084 to 1094 for latching data from amplifying circuit 154E.

Signal output unit 1082 includes: an inverter 1102 for receiving and inverting control signal DOE and outputting signal RES; an inverter 1104 for receiving and inverting signal RES and outputting signal ZRES; an inverter 1106 for receiving and inverting signal ZRES; an NOR circuit 1108 for receiving an output of inverter 1106 and clock signal CLKQ and outputting signal ZTRV; and an inverter 1110 for receiving and inverting signal ZTRV and outputting signal TRV.

Data holding circuit 1084 includes: a clocked inverter 1112 which is activated when signal TRV is at H level to invert a signal transmitted via read data bus RD1 and output the inverted signal to a node N23; inverters 1114 and 1118 whose inputs are connected to node N23; a clocked inverter 1116 which is activated when signal ZTRV is at H level to invert an output of inverter 1114 and output the inverted signal to node N23; an NAND circuit 1120 for receiving an output of inverter 1118 and signal ZTRV; and an inverter 1122 for receiving and inverting an output of NAND circuit 1120 and outputting the inverted output to read data bus RDD1.

Data holding circuit 1086 is different from data holding circuit 1084 with respect to the point that data holding circuit 1086 is connected to read data buses ZRD1 and ZRDD1 in place of read data buses RD1 and RDD1 but is similar to data holding circuit 1084 with respect to the internal circuit configuration. Consequently, the description will not be repeated.

Data holding circuit 1088 includes: a clocked inverter 1132 which is activated when signal TRV is at H level to receive and invert a signal transmitted via read data bus RD2 and output the inverted signal to node N24; an inverter 1134 whose input is connected to node N24; and a clocked inverter 1136 which is activated when signal ZTRV is at H level to invert an output of inverter 1134 and output the inverted signal to node N24.

Data holding circuit 1088 further includes: a clocked inverter 1138 which is activated when signal ZTRV is at H level to receive and invert a signal transmitted to node N24 and output the inverted signal to read data bus RDD2; an inverter 1140 whose input is connected to read data bus RDD2; a clocked inverter 1142 which is activated when signal TRV is at H level to receive and invert an output of inverter 1140 and output the inverted signal to read data bus RDD2; and an N-channel MOS transistor 1144 connected between read data bus RDD2 and the ground node, for receiving signal RES by its gate.

Data holding circuit 1090 is different from data holding circuit 1088 with respect to the point that data holding circuit 1090 is connected to read data buses ZRD2 and ZRDD2 in place of read data buses RD2 and RDD2, but its internal configuration is similar to that of data holding circuit 1088. Consequently, the description will not be repeated.

Data holding circuit 1092 is different from data holding circuit 1088 with respect to the point that data holding circuit 1092 is connected to read data buses RD3 and RDD3 in place of read data buses RD2 and RDD2, but its internal configuration is similar to that of data holding circuit 1088. Consequently, the description will not be repeated.

Data holding circuit 1094 is different from data holding circuit 1088 with respect to the point that data holding circuit 1094 is connected to read data buses ZRD3 and ZRDD3 in place of read data buses RD2 and RDD2, but its internal configuration is similar to that of data holding circuit 1088. Consequently, the description will not be repeated.

Data holding circuits 1084 and 1086 provided in correspondence with data to be output second during one cycle of the former half include a latch for latching an output of amplifying circuit 154E when clock signal CLKQ is at H level and holding the latched signal for a period in which clock signal CLKQ is at L level.

Each of data holding circuits 1088 to 1094 provided in correspondence with the third and fourth data output during one cycle of the latter half includes: a first latch for latching an output of amplifying circuit 154E when clock signal CLKQ is at H level and holding the latched signal for a period in which clock signal CLKQ is at L level; and a second latch for latching the data of the first latch for a period in which clock signal CLKQ is at L level and holding the data for a period in which clock signal CLKQ is at H level.

Figure 34:
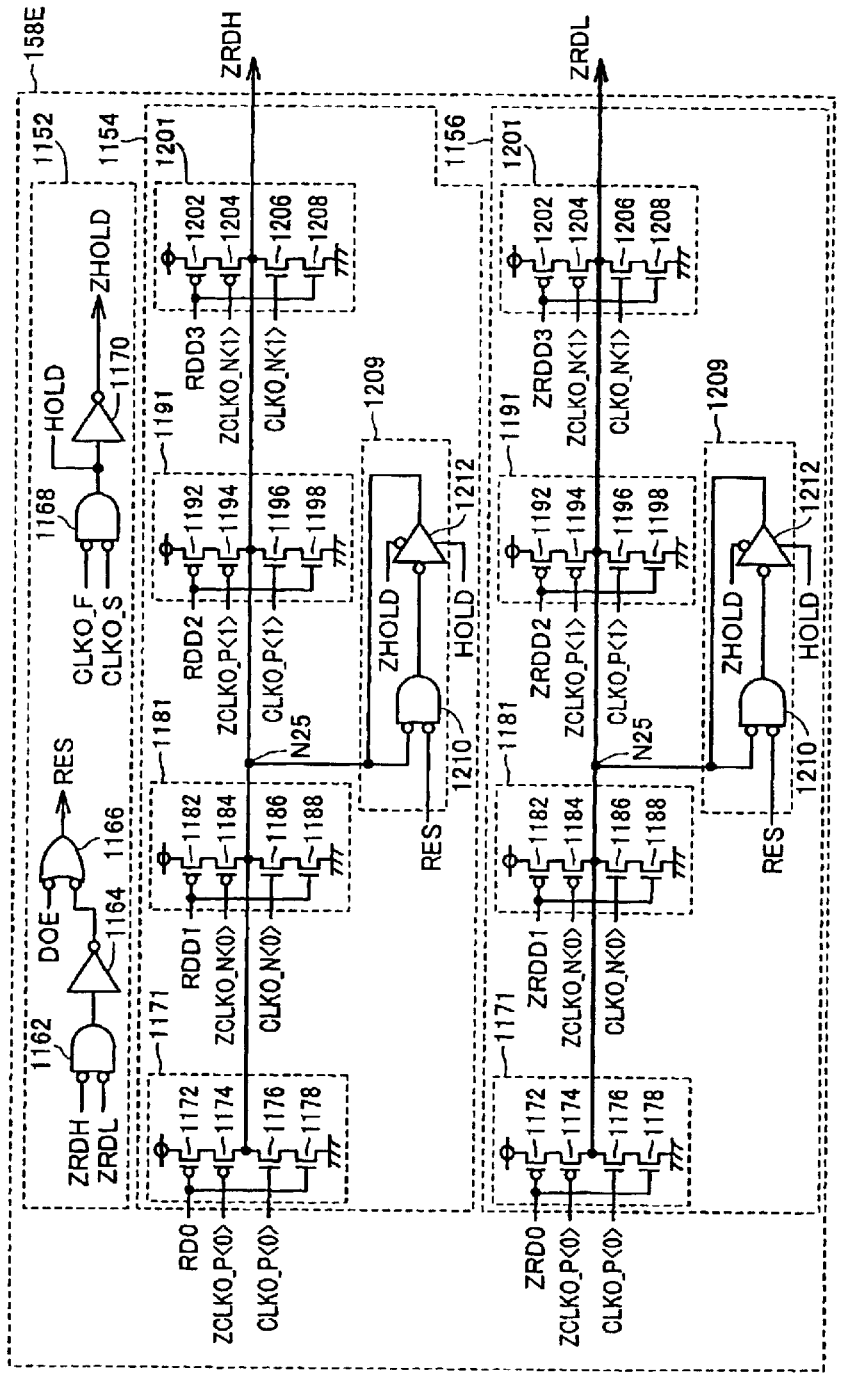
FIG. 34 is a circuit diagram showing the configuration of an output data latch 158E in FIG. 25.

FIG. 34 is a circuit diagram showing the configuration of output data latch 158E in FIG. 25.

Referring to FIG. 34, output data latch 158E includes: a signal generating unit 1152 for generating a timing signal for latching input data; and latch circuits 1154 and 1156 for latching data in accordance with an output of signal generating unit 1152.

Signal generating unit 1152 includes: an NOR circuit 1162 for receiving signals ZRDH and ZRDL; an inverter 1164 for receiving and inverting an output of NOR circuit 1162; an NAND circuit 1166 for receiving an output of inverter 1164 and control signal DOE and outputting signal RES; an NOR circuit 1168 for receiving clock signals CLKO_F and CLKO_S and outputting signal HOLD; and an inverter 1170 for receiving and inverting signal HOLD and outputting signal ZHOLD.

Latch circuit 1154 includes clocked inverters 1171, 1181, 1191, and 1201 corresponding to 4-bits data, and a holding unit 1209 for holding a signal transmitted to node N25.

Clocked inverter 1171 includes: a P-channel MOS transistor 1172 whose source is connected to a power supply node and whose gate is connected to read data bus RD0; a P-channel MOS transistor 1174 connected between the drain of P-channel MOS transistor 1172 and node N25, whose gate receives clock signal ZCLKO_P<0>; an N-channel MOS transistor 1178 whose source is connected to the ground node and whose gate is connected to read data bus RD0; and an N-channel MOS transistor 1176 connected between node N25 and the drain of N-channel MOS transistor 1178 and whose gate receives clock signal CLKO_P<0>.

Clocked inverter 1181 includes: a P-channel MOS transistor 1182 whose source is connected to the power supply node and whose gate is connected to read data bus RDD1; a P-channel MOS transistor 1184 connected between the drain of P-channel MOS transistor 1182 and node N25 and whose gate receives clock signal ZCLKO_N<0>; an N-channel MOS transistor 1188 whose source is connected to the ground node and whose gate is connected to read data bus RDD1; and an N-channel MOS transistor 1186 connected between node N25 and the drain of N-channel MOS transistor 1188 and whose gate receives clock signal CLKO_N<0>.

Clocked inverter 1191 includes: a P-channel MOS transistor 1192 whose source is connected to the power supply node and whose gate is connected to read data bus RDD2; a P-channel MOS transistor 1194 connected between the drain of P-channel MOS transistor 1192 and node N25, whose gate receives clock signal ZCLKO_P<0>; an N-channel MOS transistor 1198 whose source is connected to the ground node and whose gate is connected to read data bus RDD2; and an N-channel MOS transistor 1196 connected between node N25 and the drain of N-channel MOS transistor 1198 and whose gate receives clock signal CLKO_P<1>.

Clocked inverter 1201 includes: a P-channel MOS transistor 1202 whose source is connected to the power supply node and whose gate is connected to read data bus RDD3; a P-channel MOS transistor 1204 connected between the drain of P-channel MOS transistor 1202 and node N25 and whose gate receives clock signal ZCLKO_N<1>; an N-channel MOS transistor 1208 whose source is connected to the ground node and whose gate is connected to read data bus RDD3; and an N-channel MOS transistor 1206 connected between node N25 and the drain of N-channel MOS transistor 1208 and whose gate receives clock signal CLKO_N<1>.

Holding unit 1209 includes: an NOR circuit 1210 having an input connected to node N25 and the other input for receiving signal RES; and a clocked inverter 1212 which is activated when signal HOLD is at H level to receive and invert and output of NOR circuit 1210 and output the inverted output to node N25.

Latch circuit 1156 is different from latch circuit 1154 with respect to the point that read data buses ZRD0, ZRDD1, ZRDD2, and ZRDD3 are connected in place of read data buses RD0, RDD1, RDD2, and RDD3. However, the internal configuration of latch circuit 1156 is similar to that of latch circuit 1154, so that its description will not be repeated.

In FIG. 34, signals supplied to the gates of the two N-channel MOS transistors connected in series in each of clocked inverters 1171, 1181, 1191, and 1201 are the inverse of those in the first embodiment. In the sixth embodiment, the operation frequency of the four clocked inverters of output data latch 158E is as low as the quarter of a frequency of an external clock signal or lower, so that reliability regarding hot carriers can be assured not necessarily with the NOEMI configuration. Consequently, the connection can be inversely made, thereby enabling the dependency on the data pattern of delay time to be eliminated.

Figure 35:
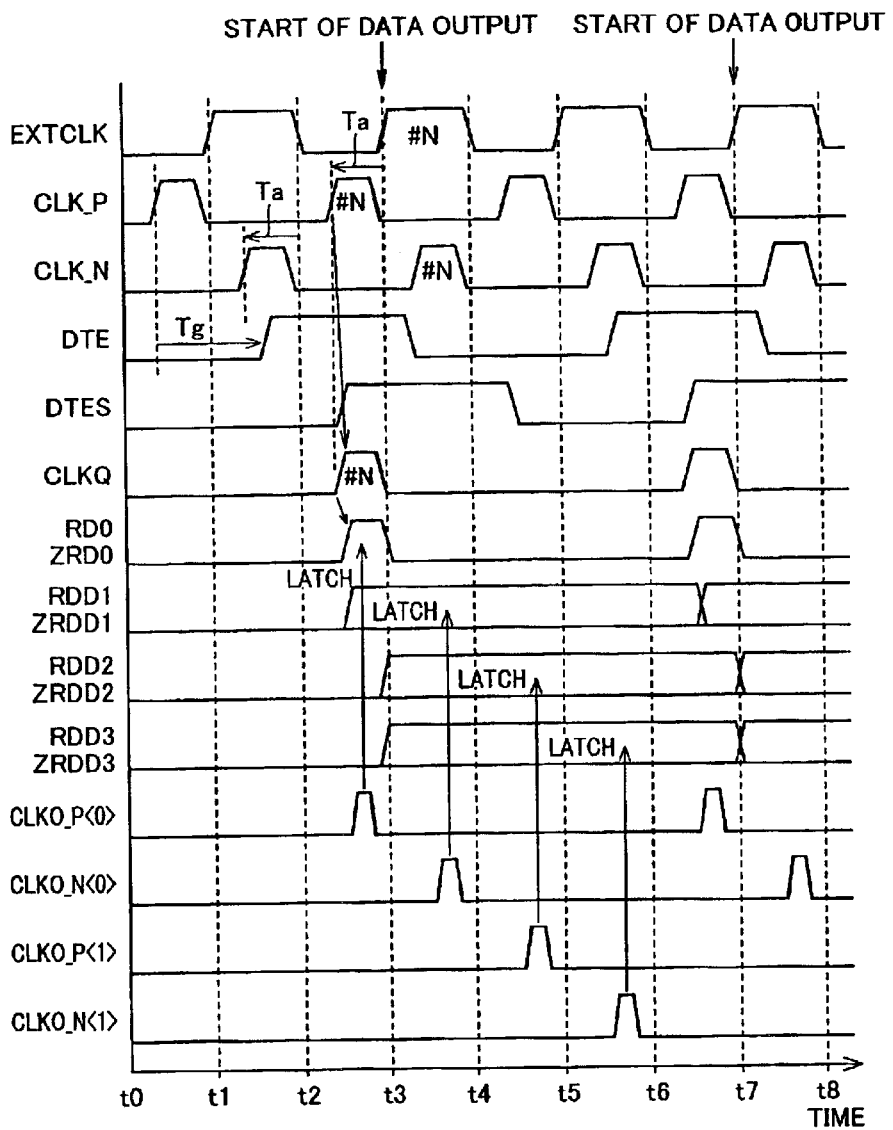
FIG. 35 is an operation waveform chart for explaining the operation of data output circuit 150E shown in FIG. 25.

FIG. 35 is an operation waveform chart for explaining the operation of data output circuit 150E shown in FIG. 25.

Referring to FIG. 35, the prefetched 4-bits data is captured and amplified by the amplifying unit in amplifying circuit 154E in a state where the order of the first to fourth data for parallel/serial conversion is determined.

The first data is transmitted to read data buses RD0 and ZRD0, transmitted to output data latch 158E in the period from time t2 to t3, and output to the outside by using clock signal CLKO_P<0> as a trigger.

The second and subsequent data is sent to 3-bit data latch 156E and held and sent to the output data latch circuits by time t3.

The second data is output to the outside by using clock signal CLKO_N<0> as a trigger during the period from time t3 to t4. The third data is output to the outside by using clock signal CLK_P<1> as a trigger in the period from time t4 to t5. The fourth data is output to the outside by using clock signal CLKO_N<1> as a trigger during the period from time t5 to t6.

As described above, in the configuration of prefetching data which is larger than two bits by the data output circuit, by dynamically determining the connection relation between the data buses and the amplifying units on the basis of address information, delay of the first data in the data output circuit can be lessened, and reduction in Tcac can be realized easily. As the circuit scale of the 2-bits prefetch configuration can be reduced in the first embodiment as compared with the conventional technique, it is expected that the effect at further reducing the circuit scale is increased in prefetching of the larger number of bits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
 a memory array from which a plurality of data signals are read in a group in accordance with a clock signal;
 a first data bus for transmitting said plurality of data signals; and
 a data output circuit for receiving said plurality of data signals from said data bus and amplifying said signals, said data output circuit including:
  a plurality of selecting units for selecting corresponding one of said plurality of data signals in accordance with an address signal,
  a plurality of amplifying units provided in correspondence with said plurality of selecting units, respectively, each for amplifying an output of a corresponding selecting unit, and an output driving circuit for sequentially receiving said plurality of data signals amplified from said plurality of amplifying units, wherein said data output circuit further includes:

a plurality of read data buses for receiving outputs of said plurality of amplifying units, respectively, an output latch circuit for sequentially latching data transmitted via said plurality of read data buses and outputting the data to said output driving circuit, and a sub latch circuit for receiving data other than said data to be output first via a corresponding part of said plurality of amplifying units and a corresponding part of said plurality of read data buses, temporarily holding the data, and outputting the held data to said output latch circuit.

2. The semiconductor memory device according to claim 1, wherein said first data bus includes a plurality of second data buses corresponding to said plurality of data signals, and each of said plurality of selecting units selects one of said plurality of second data buses in accordance with address information supplied from the outside and connects the selected second data bus to said amplifying unit corresponding to the selecting unit itself.

3. The semiconductor memory device according to claim 2, wherein each of said plurality of selecting units includes a plurality of switch circuits for connecting said plurality of second data buses to said plurality of amplifying units, respectively, and any one of said plurality of switch circuits is made conductive in accordance with said address information.

4. The semiconductor memory device according to claim 1, wherein said output latch circuit has a plurality of gate circuits provided in correspondence with said plurality of read data buses respectively, for capturing in accordance with a predetermined order data transmitted via said plurality of read data buses, and a holding circuit for holding outputs of said plurality of gate circuits.

5. The semiconductor memory device according to claim 1, wherein one of said plurality of amplifying units for amplifying data to be output first is directly connected to said output latch circuit by corresponding one of said plurality of read data buses.

6. The semiconductor memory device according to claim 5, wherein said sub latch circuit outputs said held data to said output latch circuit after said output latch circuit latches said data to be output first.

7. The semiconductor memory device according to claim 1, wherein a first read data bus in said plurality of read data buses includes first and second data transmission lines which are complementary to each other, and said output latch circuit includes a first gate circuit for latching data on said first data transmission line and driving a first output node, a second gate circuit for latching data on said second data transmission line and driving a second output node, a first capacitor connected between said first output node and said second data transmission line, and a second capacitor connected between said second output node and said first data transmission line.

8. The semiconductor memory device according to claim 7, wherein a second read data bus in said plurality of read data buses includes third and fourth data transmission lines which are complementary to each other, and said output latch circuit further includes a third gate circuit for latching data on said third data transmission line and driving said first output node, and a fourth gate circuit for latching data on said fourth data transmission line and driving said second output node.

9. The semiconductor memory device according to claim 1, wherein said plurality of data signals read in a group from said memory array in accordance with said clock signal correspond to 2-bits data.

10. The semiconductor memory device according to claim 1, wherein said plurality of data signals read in a group from said memory array in accordance with said clock signal correspond to data which is larger than two bits.

11. The semiconductor memory device according to claim 1, wherein said data output circuit corresponds to a first bit of data output from said semiconductor memory device, and the semiconductor memory device further comprising:

a plurality of other data output circuits corresponding to data of the second bit to the least significant bit output from said semiconductor memory device;

a first control signal circuit for generating a first control signal indicative of the order of outputting data signals read in a group in accordance with said address signal; and a first signal transmission line of a tree structure for transmitting said first control signal from said first control signal circuit toward said data output circuit and said plurality of other data output circuits.

12. The semiconductor memory device according to claim 11, further comprising:

a second control signal circuit for generating a second control signal indicative of an active period of said plurality of selecting units; and a second signal transmission line having a tree structure, in which delay time is adjusted so as to correspond to delay time of said first signal transmission line, for transmitting said second control signal from said second control signal circuit toward said data output circuit and said plurality of other data output circuits.

* * * * *